(12) United States Patent
Tachibana et al.

(10) Patent No.: US 8,039,198 B2
(45) Date of Patent: Oct. 18, 2011

(54) SULFONIUM SALT-CONTAINING POLYMER, RESIST COMPOSITION, AND PATTERNING PROCESS

(75) Inventors: Seiichiro Tachibana, Joetsu (JP); Jun Hatakeyama, Joetsu (JP); Youichi Ohsawa, Joetsu (JP); Masaki Ohashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 229 days.

(21) Appl. No.: 12/404,245

(22) Filed: Mar. 13, 2009

(65) Prior Publication Data

US 2009/0233223 A1  Sep. 17, 2009

(30) Foreign Application Priority Data

Mar. 14, 2008  (JP) ................................ 2008-065488

(51) Int. Cl.
G03F 7/004 (2006.01)
G03F 7/30 (2006.01)

(52) U.S. Cl. ..................... 430/270.1; 430/326; 430/330; 430/910

(58) Field of Classification Search ............... 430/270.1, 430/326, 330, 910
See application file for complete search history.

(56) References Cited

U.S. PATENT DOCUMENTS

| | | | |
|---|---|---|---|
| 5,130,392 A * | 7/1992 | Schwalm et al. | 526/288 |
| 6,048,672 A | 4/2000 | Cameron et al. | |
| 6,312,867 B1 | 11/2001 | Kinsho et al. | |
| 6,830,866 B2 | 12/2004 | Kobayashi et al. | |
| 6,849,374 B2 | 2/2005 | Cameron et al. | |
| 7,288,359 B2 | 10/2007 | Iwasawa et al. | |
| 7,449,573 B2 | 11/2008 | Kodama et al. | |
| 7,459,261 B2 * | 12/2008 | Hatakeyama et al. | 430/270.1 |
| 7,511,169 B2 * | 3/2009 | Ohsawa et al. | 562/30 |
| 7,569,326 B2 * | 8/2009 | Ohsawa et al. | 430/270.1 |
| 2002/0197558 A1 | 12/2002 | Ferreira et al. | |
| 2003/0113659 A1 | 6/2003 | Hatakeyama et al. | |
| 2004/0260031 A1 | 12/2004 | Takeda et al. | |
| 2006/0147836 A1 * | 7/2006 | Hatakeyama et al. | 430/270.1 |
| 2007/0003871 A1 | 1/2007 | Kodama et al. | |
| 2007/0231738 A1 | 10/2007 | Kaneko et al. | |
| 2008/0318160 A1 | 12/2008 | Ohsawa et al. | |
| 2009/0234155 A1 * | 9/2009 | Oh et al. | 562/100 |
| 2009/0291390 A1 * | 11/2009 | Jung et al. | 430/270.1 |

FOREIGN PATENT DOCUMENTS

| | | |
|---|---|---|
| EP | 0473547 A1 | 3/1992 |
| EP | 1710230 A1 | 10/2006 |
| EP | 1783148 A1 | 5/2007 |
| JP | 4-230645 A | 8/1992 |
| JP | 11-282168 A | 10/1999 |
| JP | 2000-122296 A | 4/2000 |
| JP | 2000-336121 A | 12/2000 |
| JP | 2002-214774 A | 7/2002 |
| JP | 2003-66612 A | 3/2003 |
| JP | 2003-140332 A | 5/2003 |
| JP | 2004-2252 A | 1/2004 |
| JP | 2004-115630 A | 4/2004 |
| JP | 2004-143153 A | 5/2004 |
| JP | 2004-531749 A | 10/2004 |
| JP | 2005-8766 A | 1/2005 |
| JP | 2005-84365 A | 3/2005 |
| JP | 2005-266766 A | 9/2005 |
| JP | 2007-145797 A | 6/2007 |
| JP | 2007-297590 A | 11/2007 |

OTHER PUBLICATIONS

Dammel et al., "193 nm Immersion Lithography—Taking the Plunge", Journal of Photopolymer Science and Technology, vol. 17, No. 4, 2004, pp. 587-602.

Arimitsu et al., "Sensitivity Enhancement of Chemical-Amplification-Type Photoimaging Materials by Acetoacetic and Derivatives". Journal of Photopolymer Science and Technology, vol. 8, No. 1, 1995, pp. 43-44.

Kudo et al.,. "Enhancement of the Sensitivity of Chemical-Amplification-Type Photoimaging Materials by β-Tosyloxyketone Acetals", Journal of Photopolymer Science and Technology, vol. 8, No. 1, 1995, pp. 45-46.

(Continued)

Primary Examiner — John Chu
(74) Attorney, Agent, or Firm — Birch, Stewart, Kolasch & Birch, LLP

(57) ABSTRACT

A polymer comprising recurring units of a sulfonium salt represented by formula (1) is provided as well as a chemically amplified resist composition comprising the same. $R^1$ is H, F, methyl or trifluoromethyl, $R^2$ to $R^4$ are $C_1$-$C_{10}$ alkyl or alkoxy, $R^5$ is $C_1$-$C_{30}$ alkyl or $C_6$-$C_{14}$ aryl, k, m and n are 0 to 3. The recurring units generate a sulfonic acid upon exposure to high-energy radiation so as to facilitate effective scission of acid labile groups in the resist composition. The resist composition exhibits excellent resolution and a pattern finish with minimal LER.

(1)

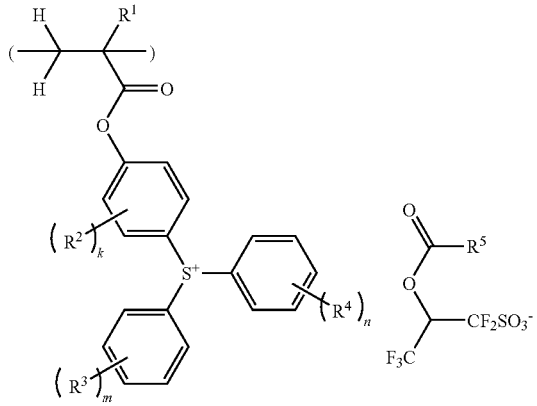

13 Claims, No Drawings

OTHER PUBLICATIONS

Arimitsu et al., "Effect of Phenolic Hydroxyl Residues on the Improvement of Acid-Proliferation-Type Photoimaging Materials", Journal of Photopolymer Science and Technology,. vol. 9, No. 1, 1996, pp. 29-30.

Maenhoudt et al., "Double Patterning scheme for sub-0.25 kl single damascene structures as NA=0.75,λ=193nm", Proceedings of SPIE vol. 5754, 2005, p. 1508.

Shibuya et al., "Performance of Resolution Enhancement Technique Using Both Multiple Exposure and Nonlinear Resist", Japan Journal of Applied Physics, vol. 33, 1994, pp. 6874-6877.

Extended European Search Report dated Jul. 23, 2009 for corresponding European Application No. 09003397.8.

\* cited by examiner

SULFONIUM SALT-CONTAINING POLYMER, RESIST COMPOSITION, AND PATTERNING PROCESS

CROSS-REFERENCE TO RELATED APPLICATION

This non-provisional application claims priority under 35 U.S.C. §119(a) on Patent Application No. 2008-065488 filed in Japan on Mar. 14, 2008, the entire contents of which are hereby incorporated by reference.

TECHNICAL FIELD

This invention relates to (1) a polymer capable of generating a sulfonic acid in response to high-energy radiation or heat, (2) a resist composition comprising the polymer, and (3) a patterning process using the resist composition.

BACKGROUND ART

While a number of recent efforts are being made to achieve a finer pattern rule in the drive for higher integration and operating speeds in LSI devices, DUV and VUV lithography is thought to hold particular promise as the next generation in microfabrication technology. In particular, photolithography using an ArF excimer laser as the light source is thought requisite to the micropatterning technique capable of achieving a feature size of 0.13 µm or less.

The ArF lithography started partial use from the fabrication of 130-nm node devices and became the main lithography since 90-nm node devices. Although lithography using $F_2$ laser (157 nm) was initially thought promising as the next lithography for 45-nm node devices, its development was retarded by several problems. A highlight was suddenly placed on the ArF immersion lithography that introduces a liquid having a higher refractive index than air (e.g., water, ethylene glycol, glycerol) between the projection lens and the wafer, allowing the projection lens to be designed to a numerical aperture (NA) of 1.0 or higher and achieving a higher resolution. See Journal of Photopolymer Science and Technology, Vol. 17, No. 4, p 587 (2004).

In the photolithography using an ArF excimer laser (wavelength 193 nm) as the light source, a high sensitivity resist material capable of achieving a high resolution at a small dose of exposure is needed to prevent the degradation of precise and expensive optical system materials. Among several measures for providing high sensitivity resist material, the most common is to select each component which is highly transparent at the wavelength of 193 nm. For example, polymers of acrylic acid and derivatives thereof, norbornene-maleic anhydride alternating copolymers, polynorbornene, ring-opening metathesis polymers, and hydrogenated ring-opening metathesis polymers have been proposed as the base resin. This choice is effective to some extent in that the transparency of a resin alone is increased.

Studies have also been made on photoacid generators. In prior art chemically amplified resist compositions for lithography using KrF excimer laser, photoacid generators capable of generating alkane- or arene-sulfonic acids are used. However, the use of these photoacid generators in chemically amplified resist compositions for ArF lithography results in an insufficient acid strength to scissor acid labile groups on the resin, a failure of resolution, or a low sensitivity. Thus these photoacid generators are not suited for the fabrication of microelectronic devices.

For the above reason, photoacid generators capable of generating perfluoroalkanesulfonic acids having a high acid strength are generally used in ArF chemically amplified resist compositions. These photoacid generators capable of generating perfluoroalkanesulfonic acids have already been developed for use in the KrF resist compositions. For instance, JP-A 2000-122296 and U.S. Pat. No. 6,048,672 (or JP-A 11-282168) describe photoacid generators capable of generating perfluorohexanesulfonic acid, perfluorooctanesulfonic acid, perfluoro-4-ethylcyclohexane-sulfonic acid, and perfluorobutanesulfonic acid. JP-A 2002-214774, US Patent Application Publication 2003-0113659 A1 (JP-A 2003-140332), and US Patent Application Publication 2002-0197558 A1 describe novel acid generators capable of generating perfluoroalkyl ether sulfonic acids.

Among these, perfluorooctanesulfonic acid and homologues thereof (collectively referred to as PFOS) are considered problematic with respect to their non-degradability and biological concentration in the environment. Manufacturers made efforts to develop partially fluorinated alkane sulfonic acids having a reduced degree of fluorine substitution as the replacement to PFOS. For instance, JP-A 2004-531749 describes the synthesis of $\alpha,\alpha$-difluoroalkanesulfonic acid salts from $\alpha,\alpha$-difluoroalkene and a sulfur compound and discloses a resist composition comprising a photoacid generator which generates such sulfonic acid upon exposure, specifically di(4-tert-butylphenyl)iodonium 1,1-difluoro-2-(1-naphthyl)-ethanesulfonate. JP-A 2004-2252 describes the development of $\alpha,\alpha,\beta,\beta$-tetrafluoroalkanesulfonic acid salts from $\alpha,\alpha,\beta,\beta$-tetrafluoro-$\alpha$-iodoalkane and sulfur compound and discloses a photoacid generator capable of generating such a sulfonic acid and a resist composition comprising the same. JP-A 2002-214774 discloses such photoacid generators as difluorosulfoacetic acid alkyl esters and difluorosulfoacetic acid amides although their synthesis method is lacking. Furthermore, JP-A 2005-266766 discloses a photosensitive composition comprising a compound capable of generating a partially fluorinated alkane sulfonic acid having a sulfonylamide structure derived from perfluoroalkylene disulfonyl difluoride.

In an attempt to form a fine feature size pattern having a pitch of less than 200 nm, however, side-wall roughening (known as line edge roughness, LER) of the resist pattern becomes noticeable even on use of these acid generators. It is pointed out that with a progress of miniaturization, the edge roughness of a resist pattern after development is reflected by the edge roughness after etching, which is detrimental to device characteristics. In order to reduce the edge roughness of resist, many improvements have been proposed on the polymer side including optimization of polymer molecular weight, narrow dispersity polymers, living anion polymerization or living radical polymerization for the polymerization of such polymers, a dropwise polymerization technique for preventing variation of copolymer composition, and prevention of swelling during development by introducing recurring units having a hexafluoroalcohol group as the adhesive group. Another effective means for reducing the resist edge roughness is by increasing the amounts of an acid generator and a quencher (or basic compound) to enhance the contrast. The increased amount of acid generator, however, reduces transparency so that the resist profile is tapered or increases the acid diffusion distance to give rise to problems such as a loss of exposure margin and an increased mask error factor (MEEF).

Under the circumstances, it was proposed to form a polymer from an acryloyloxyphenyl diphenyl sulfonium salt as a monomer (as described in JP-A 4-230645) and to incorporate this monomer into a polyhydroxystyrene resin for improving the LER of the base resin (as described in JP-A 2005-84365). These polymers having acid generating units bonded to the main chain are effective in improving resolution and LER to some extent, but are not regarded as exerting satisfactory performance. To meet the demand for further miniaturization of the pattern rule, further improvements in resolution and LER are desired.

CITATION LIST

Patent Document 1: JP-A 2002-122296

Patent Document 2: U.S. Pat. No. 6,048,672 (or JP-A 11-282168)

Patent Document 3: JP-A 2002-214774

Patent Document 4: US 2003-0113659 A1 (JP-A 2003-140332)

Patent Document 5: US 2002-0197558 A1

Patent Document 6: JP-A 2004-531749

Patent Document 7: JP-A 2004-2252

Patent Document 8: JP-A 2005-266766

Patent Document 9: JP-A 4-230645

Patent Document 10: JP-A 2005-84365

Non-Patent Document 1: Journal of Photopolymer Science and Technology, Vol. 17, No. 4, p 587 (2004)

SUMMARY OF INVENTION

An object of the present invention is to provide (1) a polymer comprising recurring units of a sulfonium salt, (2) a resist composition comprising the polymer, which composition exhibits a high resolution and low LER when processed by the photolithography using high-energy radiation, typically ArF excimer laser radiation as the light source, and (3) a patterning process using the resist composition.

Making investigations on the assumption that a polymer in which a sulfonium salt capable of functioning as an acid generating unit is bonded at its cation side to the main chain can be improved in resolution and LER by optimizing the structure of the counter anion, the inventors have found that a polymer comprising recurring units of a sulfonium salt capable of generating sulfonic acid in response to high-energy radiation, heat or the like as represented by the general formula (1) can be used as a base resin to formulate a resist composition, which is improved in resolution and LER and best suited for precise micropatterning.

Thus the invention provides a polymer comprising recurring units of a sulfonium salt represented by the general formula (1), a resist composition comprising the polymer as a base resin, and a patterning process, as defined below.

In a first aspect, the invention provides a polymer comprising recurring units of a sulfonium salt having the general formula (1).

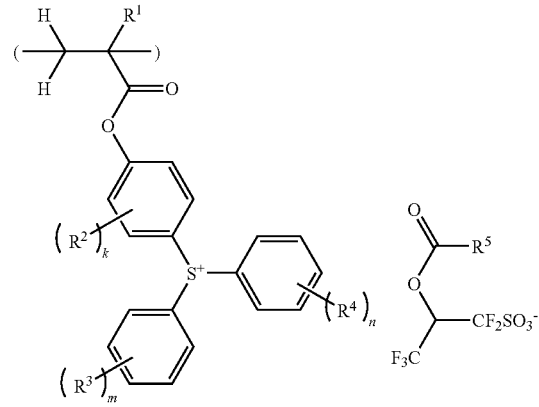

Herein $R^1$ is hydrogen, fluorine, methyl or trifluoromethyl, $R^2$ to $R^4$ are each independently straight, branched or cyclic $C_1$-$C_{10}$ alkyl or alkoxy, $R^5$ is substituted or unsubstituted, straight, branched or cyclic $C_1$-$C_{30}$ alkyl or substituted or unsubstituted $C_6$-$C_{14}$ aryl, k, m and n are each independently an integer of 0 to 3.

In an embodiment, the polymer may further comprise recurring units of at least one type selected from the general formulae (2) to (11).

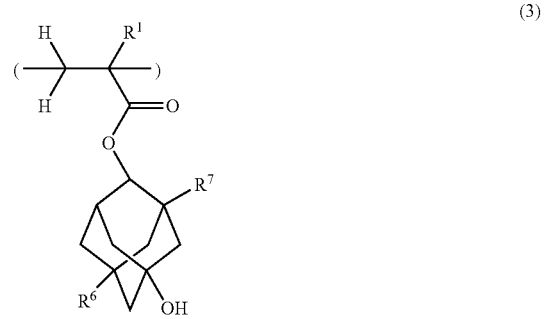

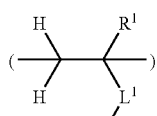
(6)

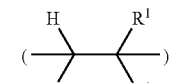
(7)

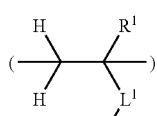
(8)

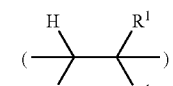
(9)

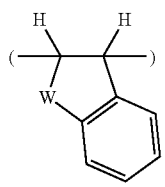
(10)

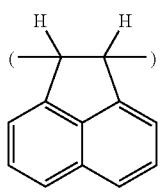
(11)

Herein $R^1$ is each independently hydrogen, fluorine, methyl or trifluoromethyl, $R^6$ and $R^7$ are each independently hydrogen or hydroxyl, X is a substituent group having an acid labile group, Y is a substituent group having lactone structure, Z is hydrogen, $C_1$-$C_{15}$ fluoroalkyl or $C_1$-$C_{15}$ fluoroalcohol-containing substituent group, G is oxygen or —C(=O)O—, $L^1$ is a single bond or —C(=O)O—, and W is —CH$_2$—, oxygen or sulfur atom.

In a preferred embodiment, the recurring units of formula (2) are recurring units of at least one type selected from the general formulae (12) to (17).

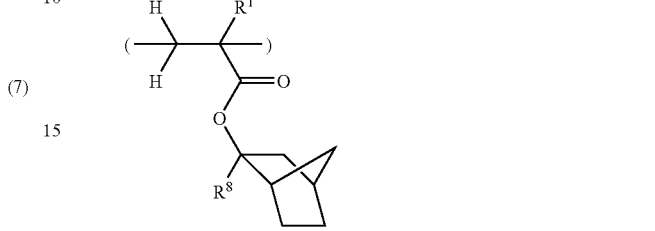
(12)

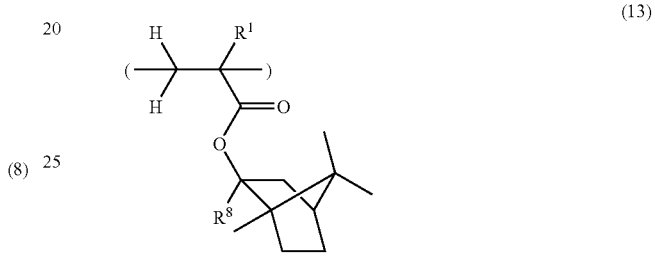
(13)

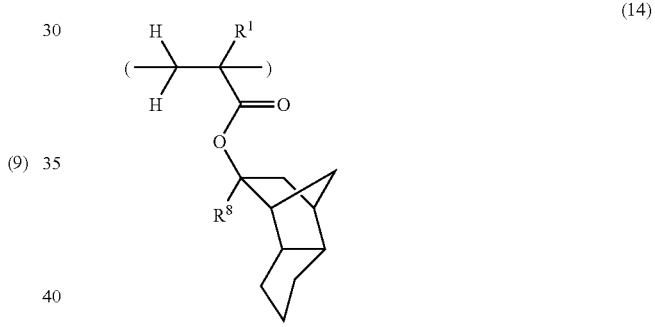
(14)

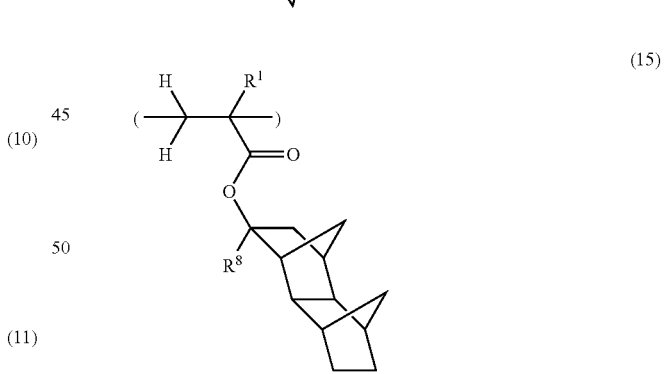
(15)

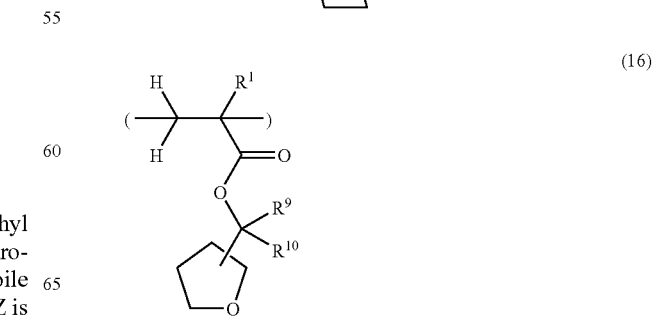
(16)

-continued

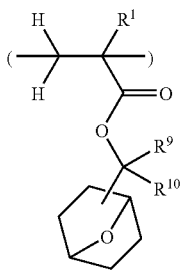

(17)

Herein $R^1$ is each independently hydrogen, fluorine, methyl or trifluoromethyl, $R^8$ is each independently straight, branched or cyclic $C_1$-$C_{10}$ alkyl, $R^9$ and $R^{10}$ are each independently straight, branched or cyclic $C_1$-$C_{10}$ alkyl, or $R^9$ and $R^{10}$ may bond together to form a $C_3$-$C_{20}$ non-aromatic ring with the carbon atom to which they are attached.

In a preferred embodiment, the recurring units of formula (4) are recurring units of at least one type selected from the general formulae (18) and (19).

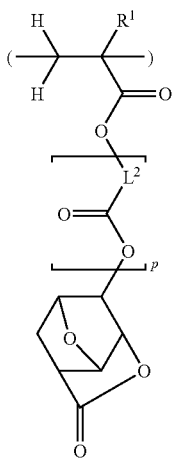

(18)

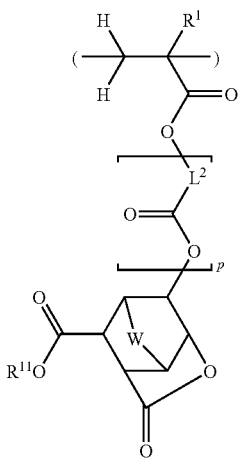

(19)

Herein $R^1$ is each independently hydrogen, fluorine, methyl or trifluoromethyl, $R^{11}$ is straight, branched or cyclic $C_1$-$C_{20}$ alkyl which may have a fluorine atom, W is —$CH_2$—, oxygen or sulfur atom, $L^2$ is straight or branched $C_1$-$C_5$ alkylene, and p is 0 or 1.

In some embodiments, the polymer is described as comprising recurring units of formula (1) and recurring units of at least one type selected from formulae (2), (6) and (7); or as comprising recurring units of formula (1), recurring units of at least one type selected from formulae (2), (6) and (7), and recurring units of at least one type selected from formulae (3) to (5) and (8) to (11).

In a second aspect, the invention provides a resist composition comprising the polymer defined above.

Typically, the resist composition comprises the polymer as defined above and an acid generator capable of generating an acid upon exposure to high-energy radiation of wavelength up to 300 nm or electron beam. In a preferred embodiment, the acid generator is a sulfonium salt having the general formula (20).

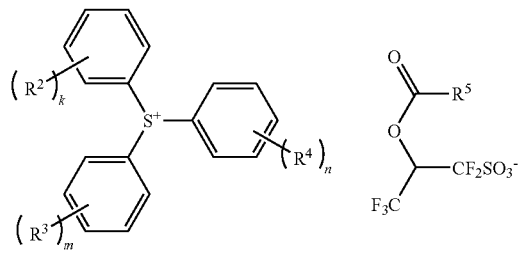

(20)

Herein $R^2$ to $R^4$ are each independently straight, branched or cyclic $C_1$-$C_{10}$ alkyl or alkoxy, $R^5$ is substituted or unsubstituted, straight, branched or cyclic $C_1$-$C_{30}$ alkyl or substituted or unsubstituted $C_6$-$C_{14}$ aryl, k, m and n are each independently an integer of 0 to 3.

The resist composition may further comprise a polymer other than the inventive polymer defined above and/or a surfactant which is insoluble in water and soluble in an alkaline developer.

In a third aspect, the invention provides a pattern forming process comprising the steps of applying the resist composition defined above onto a substrate to form a coating, heat treating the coating and exposing it to high-energy radiation through a photomask, heat treating the exposed coating and developing it with a developer;

a pattern forming process comprising the steps of applying the resist composition defined above onto a substrate to form a resist coating, heat treating the resist coating, applying onto the resist coating a protective coating which is insoluble in water and soluble in an alkaline developer, exposing the coated substrate to high-energy radiation from a projection lens through a photomask while holding water between the substrate and the projection lens, heat treating the exposed coating and developing it with a developer; and a pattern forming process comprising the steps of applying the resist composition defined above onto a substrate to form a coating, heat treating the coating, imagewise writing with an electron beam, heat treating the coating, and developing it with a developer.

It is noted that the resist composition of the invention can be applied to the immersion lithography. The immersion lithography involves prebaking a resist film and exposing the resist film to light through a projection lens with a liquid medium interposed between the resist film and the projection lens. The ArF immersion lithography generally uses deionized water as the immersion medium. This technology, combined with a projection lens having a NA of at least 1.0, is important for the ArF lithography to survive to the 65 nm node and forth, with a further development thereof being accelerated.

The resist composition of the invention allows the feature size of the pattern after development to be reduced by various shrinkage techniques. For example, the hole size can be shrunk by such known techniques as thermal flow, RELACS, SAFIRE, and WASOOM. More effective shrinkage of hole size by thermal flow is possible particularly when the inventive polymer is blended with a hydrogenated cycloolefin ring-opening metathesis polymer (ROMP) having a low Tg.

ADVANTAGEOUS EFFECTS OF INVENTION

The recurring units of sulfonium salt generate a sulfonic acid upon exposure to high-energy radiation. Since the sulfonic acid generated contains five fluorine atoms at α- and γ-positions in total, it has a very high acidity enough to facilitate efficient scission of acid labile groups in chemically amplified resist compositions. Then, a radiation-sensitive resist composition comprising a polymer comprising the recurring units of sulfonium salt as a base resin exhibits a high resolution and a pattern finish with low LER. The polymer is advantageously used as a resist material in precise micropatterning.

DESCRIPTION OF EMBODIMENTS

As used herein, the singular forms "a," "an" and "the" include plural referents unless the context clearly dictates otherwise. The notation (Cn-Cm) means a group containing from n to m carbon atoms per group. The term "high-energy radiation" is intended to encompass UV, deep UV, electron beam, EUV, x-ray, excimer laser, γ-ray and synchrotron radiation.

The polymer or high molecular weight compound of the invention comprises recurring units of sulfonium salt represented by the general formula (1).

(1)

Herein $R^1$ denotes a hydrogen atom, fluorine atom, methyl group or trifluoromethyl group. $R^2$ to $R^4$ denote each independently a straight, branched or cyclic $C_1$-$C_{10}$ alkyl or alkoxy group. Preferably $R^2$ to $R^4$ are $C_1$-$C_6$ alkyl or alkoxy groups. Specifically, suitable alkyl groups include, but are not limited to, methyl, ethyl, n-propyl, isopropyl, n-butyl, sec-butyl, iso-butyl, tert-butyl, tert-amyl, n-pentyl, n-hexyl, cyclopentyl, and cyclohexyl. Suitable alkoxy groups include, but are not limited to, methoxy, ethoxy, n-propyloxy, isopropyloxy, n-butyloxy, sec-butyloxy, iso-butyloxy, tert-butyloxy, tert-amyloxy, n-pentyloxy, n-hexyloxy, cyclopentyloxy, and cyclohexyloxy. $R^5$ denotes a substituted or unsubstituted, straight, branched or cyclic $C_1$-$C_{30}$ alkyl group or a substituted or unsubstituted $C_6$-$C_{14}$ aryl group. Examples of alkyl groups denoted by $R^5$ include methyl, ethyl, n-propyl, isopropyl, cyclopropyl, n-butyl, sec-butyl, iso-butyl, tert-butyl, n-pentyl, cyclopentyl, n-hexyl, cyclohexyl, n-octyl, n-decyl, n-dodecyl, 1-adamantyl, 2-adamantyl, and bicyclo[2.2.1]hepten-2-yl; and examples of aryl groups include phenyl, 4-methoxyphenyl, 4-tert-butylphenyl, 4-biphenyl, 1-naphthyl, 2-naphthyl, and 10-anthranyl. In the groups of $R^5$, one or more hydrogen atoms may be replaced by halogen atoms, alkyl, aryl, hydroxy, alkoxy, carboxy, alkoxycarbonyl, oxo, alkoxyalkyl, acyloxy, acyloxyalkyl, alkoxyalkoxy or other groups, and one or more —CH$_2$— may be replaced by —O—. The subscripts k, m and n are each independently an integer of 0 to 3.

Examples of the cation structure in the recurring units of sulfonium salt represented by formula (1) include, but are not limited to, the structures shown below.

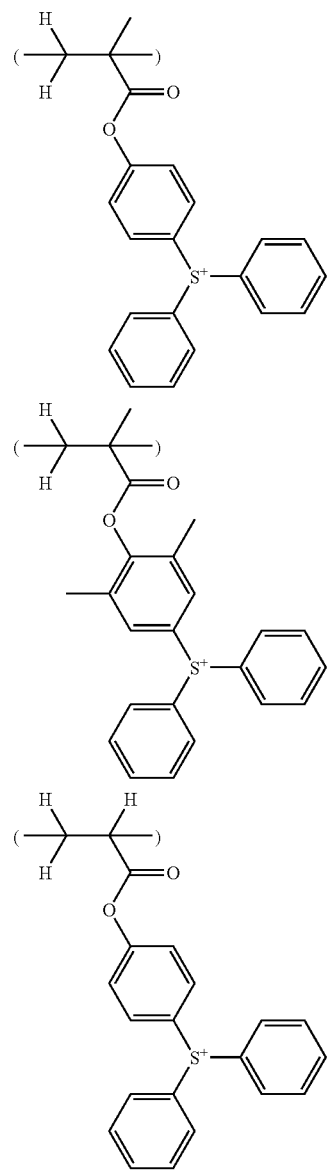

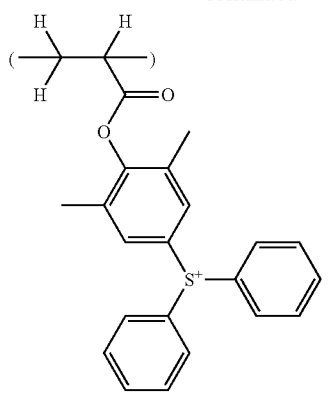
Examples of the anion structure in the recurring units of sulfonium salt represented by formula (1) include, but are not limited to, the structures shown below.
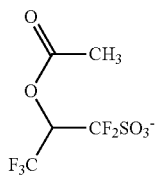 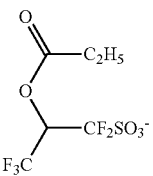 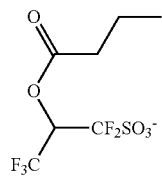
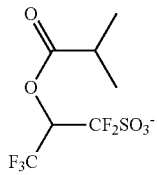 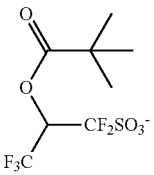 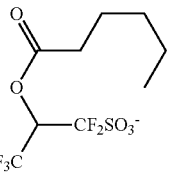
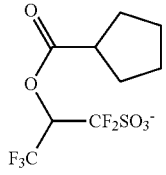 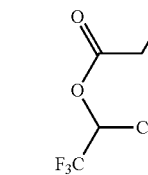 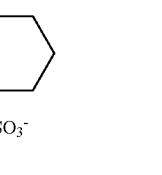
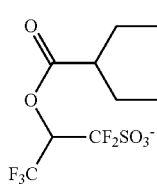 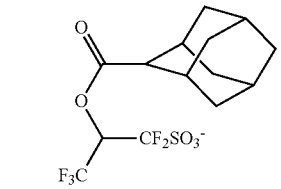
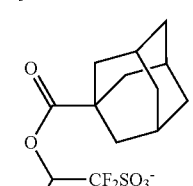 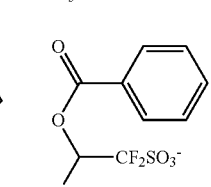
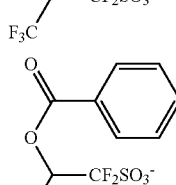 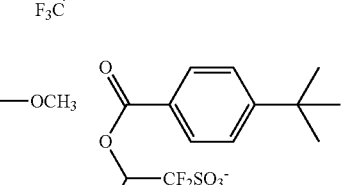
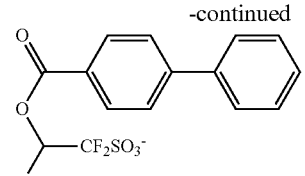
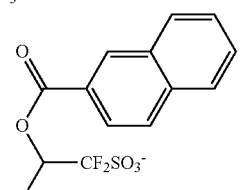
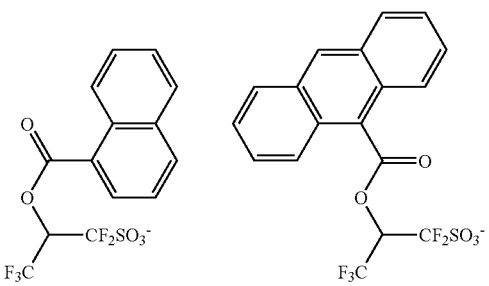
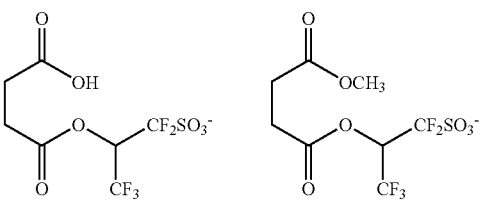
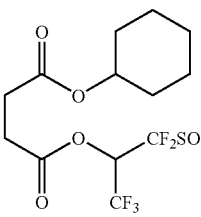
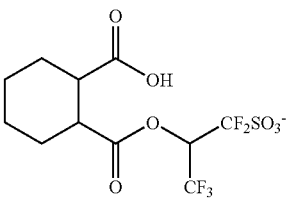
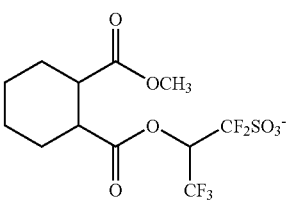
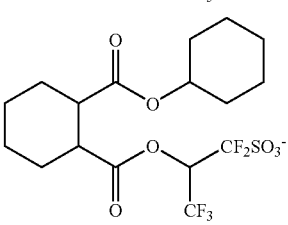

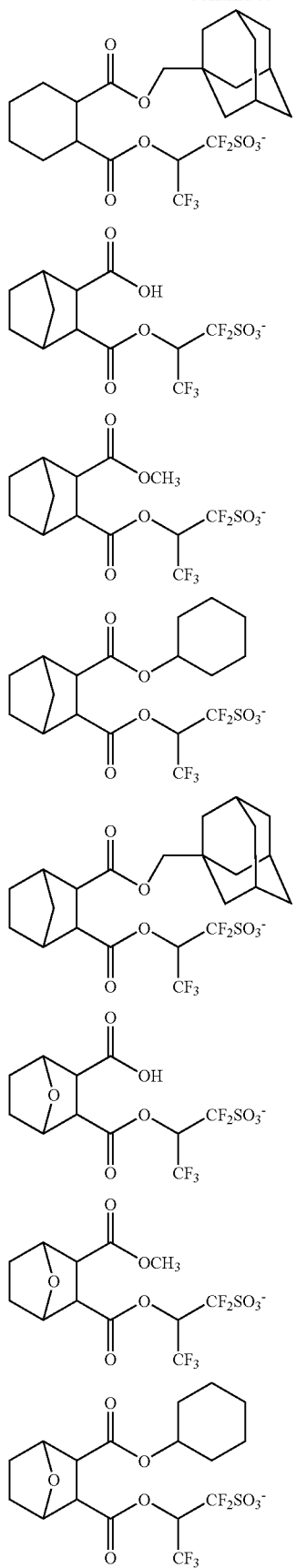
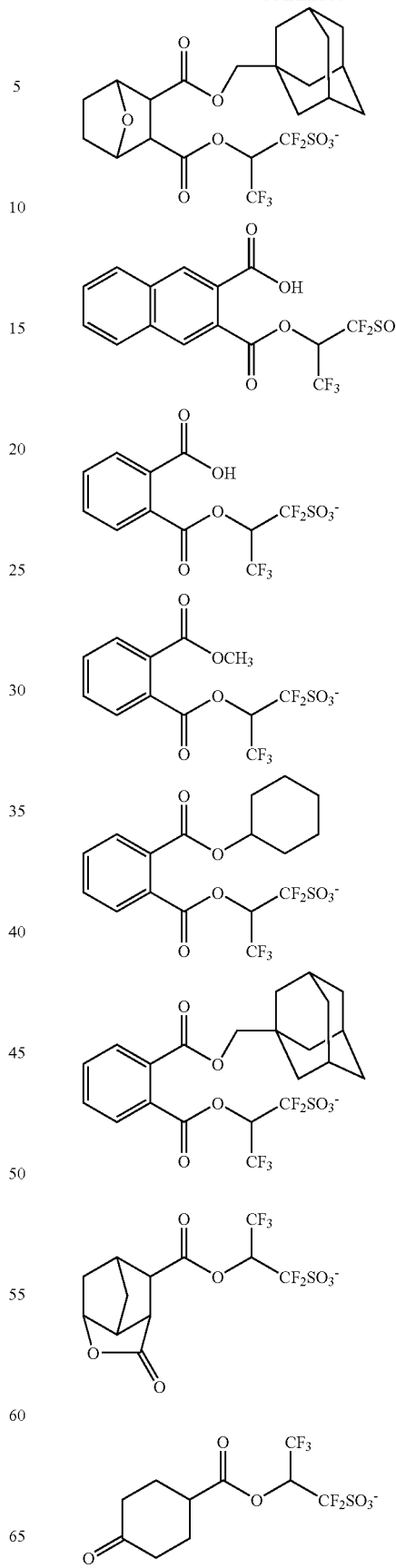

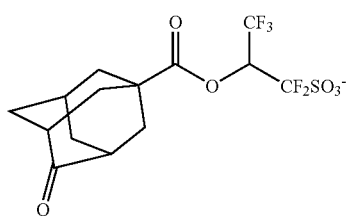
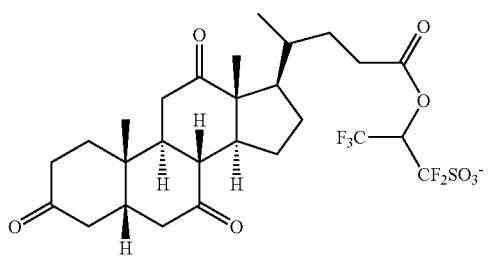
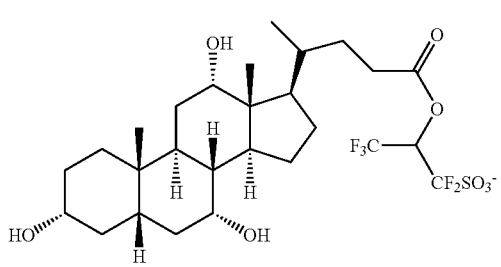
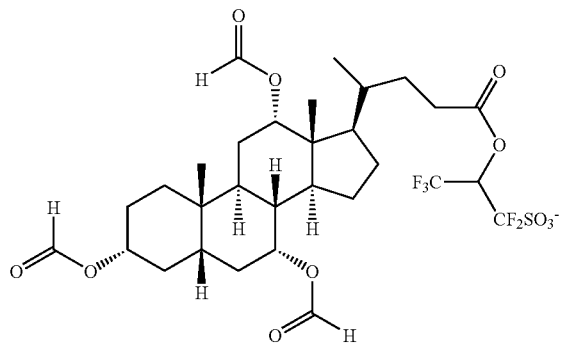
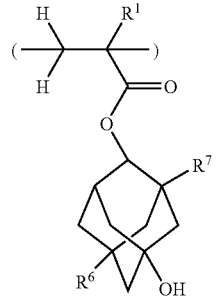 (3)
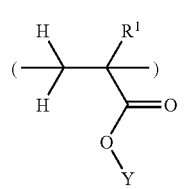 (4)
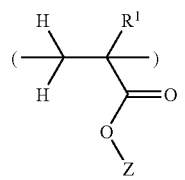 (5)
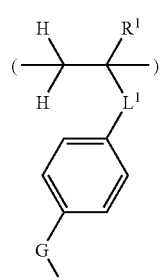 (6)
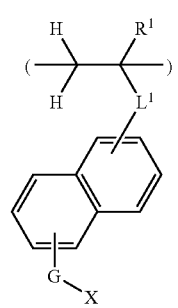 (7)
In addition to the recurring units of sulfonium salt represented by formula (1), the polymer of the invention may further comprise recurring units of at least one type selected from the general formulae (2) to (11).
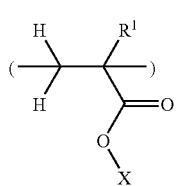 (2)
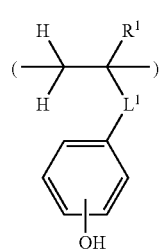 (8)

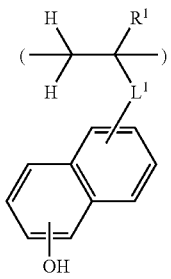

(9)

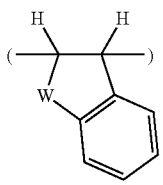

(10)

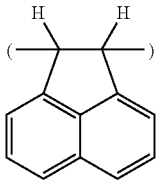

(11)

Herein $R^1$ denotes each independently hydrogen, fluorine, methyl or trifluoromethyl. $R^6$ and $R^7$ denote each independently hydrogen or hydroxyl. X denotes a substituent group having an acid labile group. Y denotes a substituent group having lactone structure. Z denotes hydrogen, a $C_1$-$C_{15}$ fluoroalkyl group or a $C_1$-$C_{15}$ fluoroalcohol-containing substituent group. G denotes an oxygen atom or —C(=O)O—. $L^1$ denotes a single bond or —C(=O)O—. W denotes —CH$_2$—, an oxygen atom or sulfur atom.

In formula (2), X denotes a substituent group having an acid labile group. The acid labile groups included in X may be selected from a variety of such groups, for example, groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

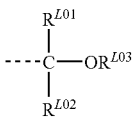
(L1)

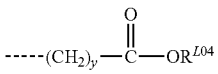
(L2)

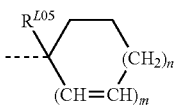
(L3)

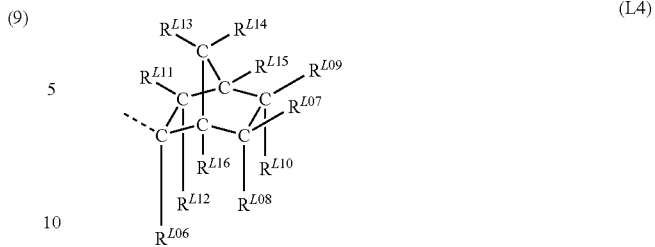
(L4)

The broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms, examples of which include methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 15 carbon atoms, which may contain a heteroatom such as oxygen, examples of which include straight, branched or cyclic alkyl groups and substituted forms of these groups in which some hydrogen atoms are replaced by hydroxyl, alkoxy, oxo, amino, alkylamino or the like. A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each participant of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1), (L3) or (L4). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. In formula (L2), y is an integer of 0 to 6.

In formula (L3), $R^{L05}$ is a substituted or unsubstituted, straight, branched or cyclic $C_1$-$C_{10}$ alkyl group or a substituted or unsubstituted $C_6$-$C_{20}$ aryl group. Examples of the optionally substituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, cyclohexyl, norbornyl and adamantyl; and substituted forms of the foregoing in which some hydrogen atoms are replaced by hydroxyl, alkoxy, carboxy, alkoxycarbonyl, oxo, amino, alkylamino, cyano, alkylthio, sulfo or other groups and/or some —CH$_2$— are replaced by oxygen atoms. Exemplary optionally substituted aryl groups are phenyl, methylphenyl, naphthyl, anthryl, phenanthryl, and pyrenyl. In formula (L3), m is 0 or 1, n is 0, 1, 2 or 3, and 2m+n is equal to 2 or 3.

In formula (L4), $R^{L06}$ is a substituted or unsubstituted, straight, branched or cyclic $C_1$-$C_8$ alkyl group or a substituted or unsubstituted $C_6$-$C_{20}$ aryl group. Examples of these groups are the same as exemplified for $R^{L05}$. $R^{L07}$ to $R^{L16}$ independently denote hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $L^{L11}$ and $R^{L12}$, $R^{L13}$ and $R^{L14}$, or a similar pair). Each participant of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

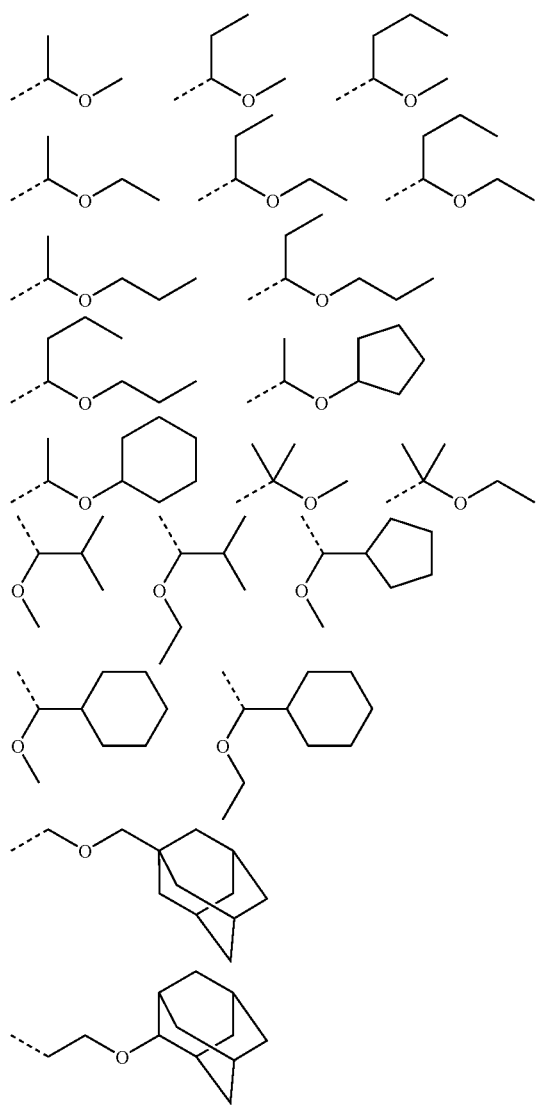

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(norbornan-2-yl)cyclopentyl, 1-(7-oxanorbornan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Examples of the tertiary $C_4$-$C_{20}$ alkyl, tri($C_1$-$C_6$-alkyl)silyl and $C_4$-$C_{20}$ oxoalkyl groups are as exemplified above for $R^{L04}$.

X in the recurring unit of formula (2) is preferably selected from groups of the following formulae (L4-1) to (L4-4).

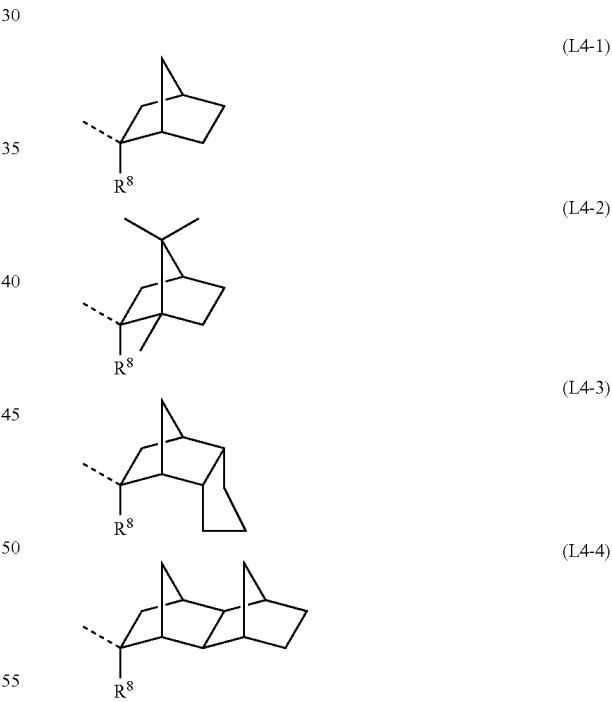

In formulae (L4-1) to (L4-4), the broken line denotes a bonding site and direction $R^8$ is each independently selected from monovalent hydrocarbon groups, typically straight, branched or cyclic $C_1$-$C_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

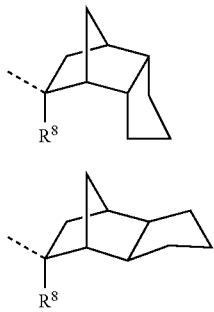

(L4-3-1)

(L4-3-2)

Similarly, the general formula (L4-4) represents one or a mixture of two or more selected from groups having the following general formulas (L4-4-1) to (L4-4-4).

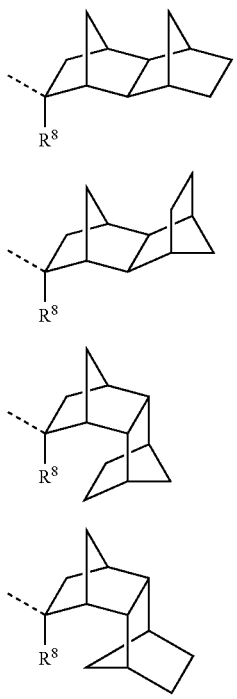

(L4-4-1)

(L4-4-2)

(L4-4-3)

(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

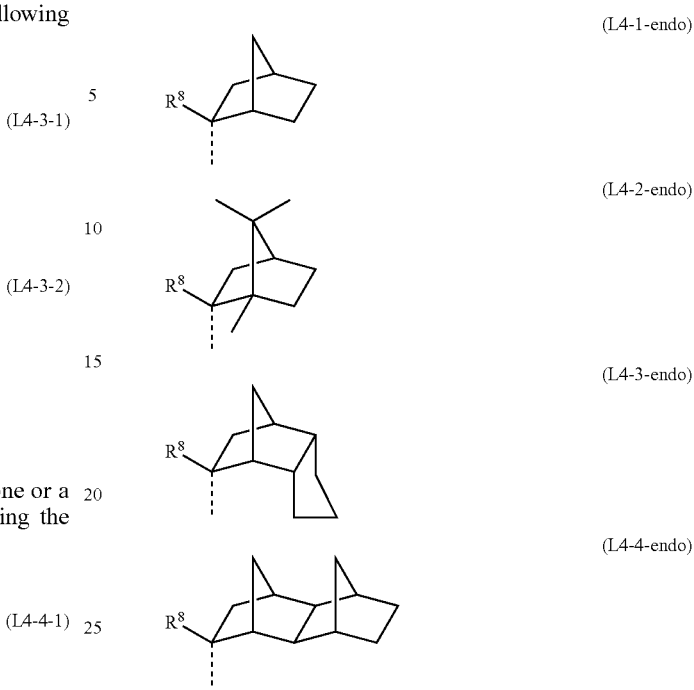

(L4-1-endo)

(L4-2-endo)

(L4-3-endo)

(L4-4-endo)

For the reason discussed above, those polymers having incorporated therein acid labile groups of formulae (L4-1) to (L4-4) exhibit an extremely high acid reactivity. As compared the non-polymeric photoacid generators commonly added, a polymer having a sulfonium salt bonded at its cation side to the main chain may have a remote likelihood for deprotection reaction to run, leading to a decline of resolution. This problem can be avoided by incorporating acid labile groups having high acid reactivity as represented by formulae (L4-1) to (L4-4). The acid labile groups represented by formulae (L4-1) to (L4-4) exhibit good etching resistance owing to their bridged ring structure. Then using a polymer comprising recurring units of formula (1) and recurring units having groups of formulae (L4-1) to (L4-4) as the acid labile group, there can be formulated a resist material which has excellent properties including sensitivity, resolution and etch resistance and is best suited in the formation of fine size patterns.

Illustrative examples of the acid labile group of formula (L4) are given below, but not limited thereto.

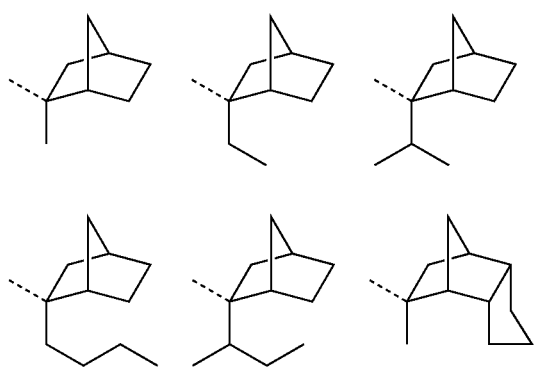

-continued

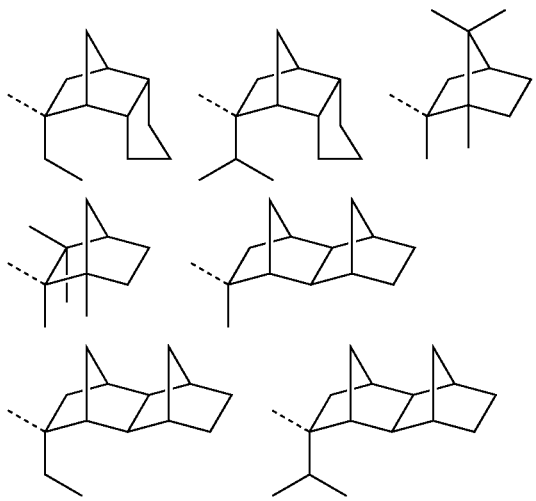

Of groups X in the recurring units of formula (2), those groups having the following general formulae (L5-1) and (L5-2) are also preferred.

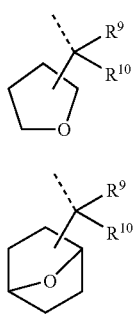

(L5-1)

(L5-2)

In the formulae, the broken line denotes a bonding position. $R^9$ and $R^{10}$ are each independently a straight, branched or cyclic $C_1$-$C_{10}$ alkyl group, or $R^9$ and $R^{10}$ may bond together to form a non-aromatic ring with the carbon atom to which they are attached. Typically the ring has 3 to 20 carbon atoms, especially 3 to 10 carbon atoms and includes cyclopentyl and cyclohexyl. Illustrative examples of the groups of formulae (L5-1) and (L5-2) are given below, but not limited thereto.

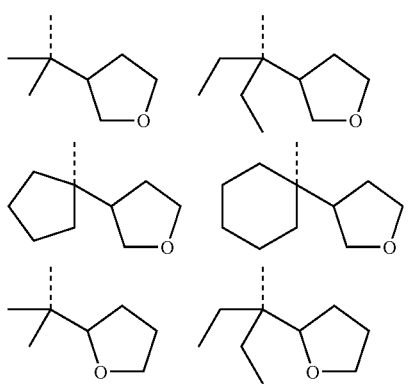

-continued

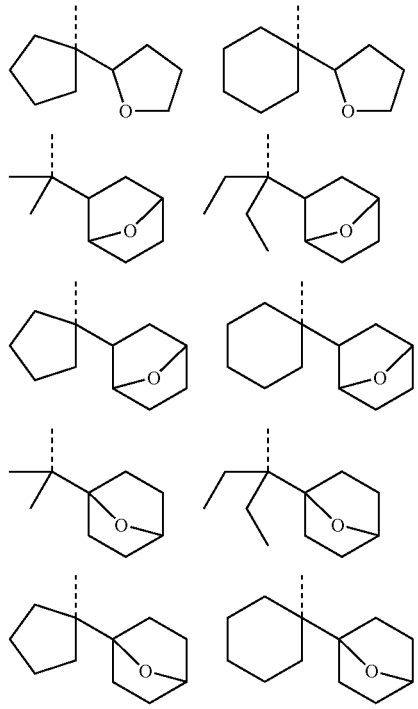

Since copolymers of acrylic acid and methacrylic acid derivatives are generally less etching resistant, units containing a rigid group having many carbon atoms such as an adamantane structure must be introduced in noticeable amounts in order to compensate for this drawback. The resultant polymer becomes more hydrophobic as a whole so that swelling may occur during alkaline development, resulting in pattern collapse and surface roughening. When a polymer having a sulfonium salt bonded at its cation side to the main chain is used as in the invention, the swelling of the polymer during alkaline development becomes more outstanding, resulting in a pattern undergoing surface roughening and increased LER. By incorporating oxygen-containing groups of formula (L5-1) or (L5-2), the polymer can be rendered more hydrophilic for thereby controlling swell during development, mitigating pattern collapse and surface roughening, and improving LER. In addition, a practically acceptable level of etching resistance is endowed since these groups have an alicyclic structure. Accordingly, a resist composition comprising this polymer has a minimal LER and a practically acceptable level of etching resistance and is very useful in forming fine size patterns.

Illustrative, non-limiting examples of the recurring units of formula (2) are given below.

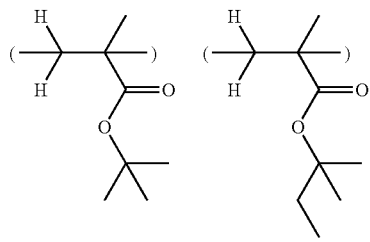

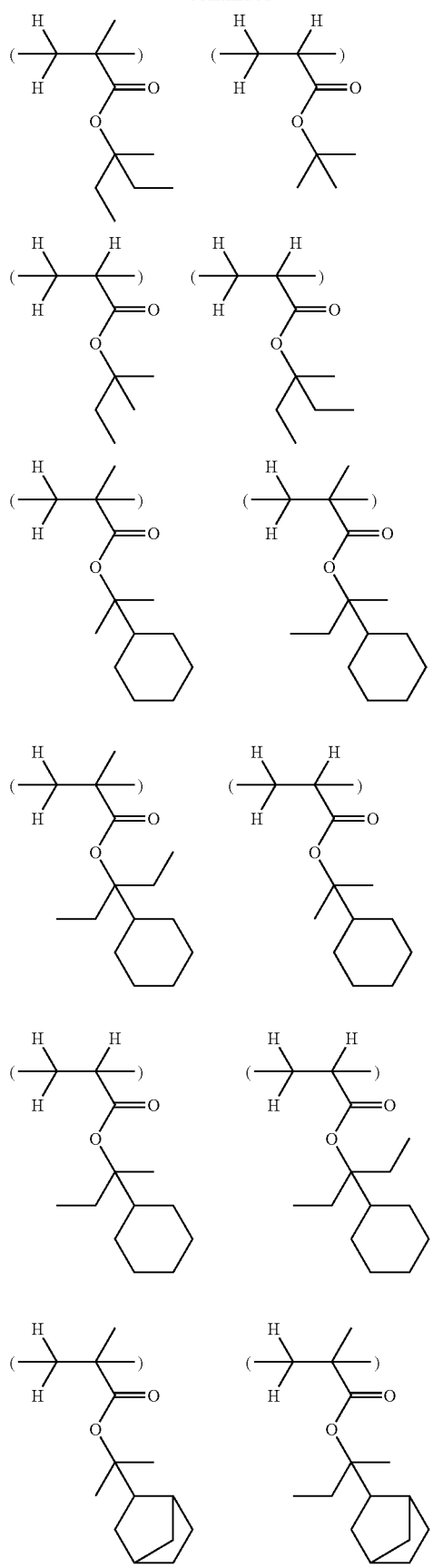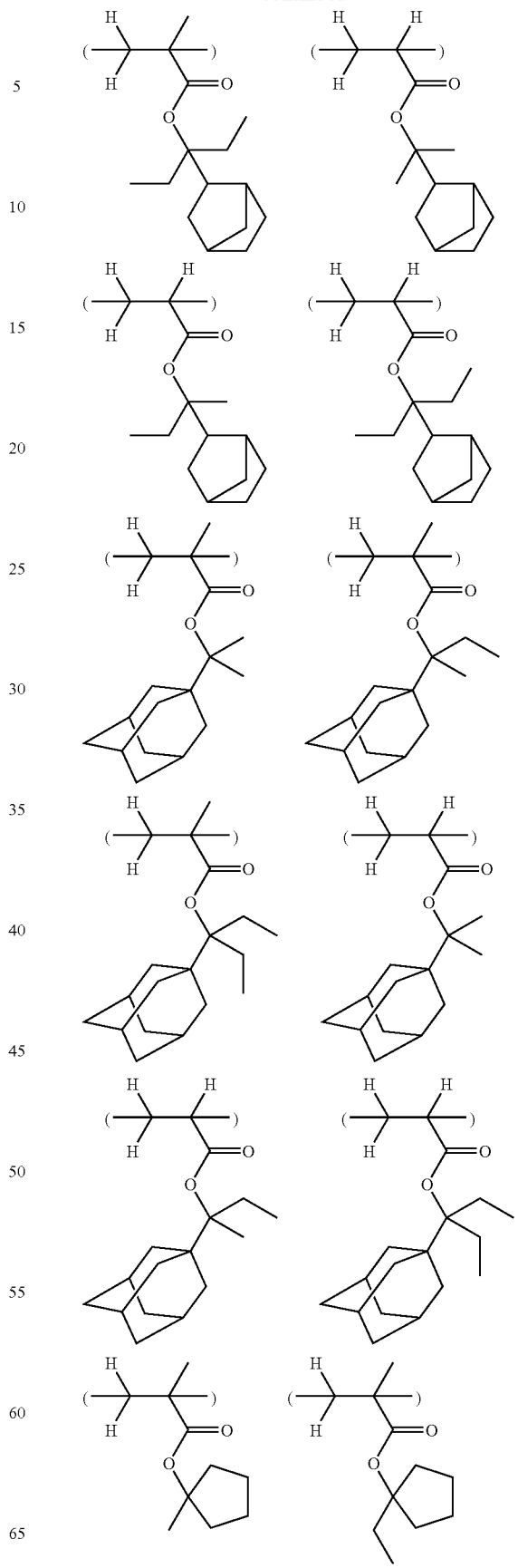

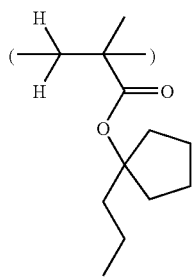 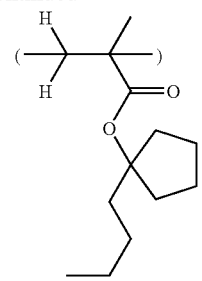 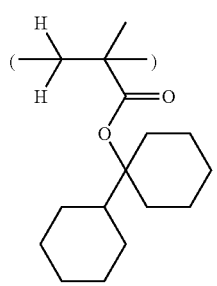 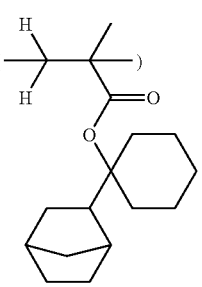
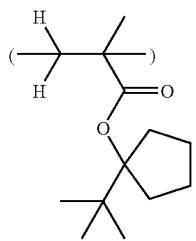 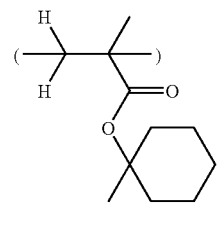 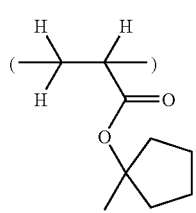 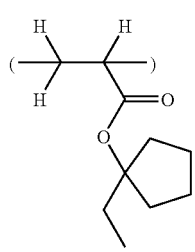
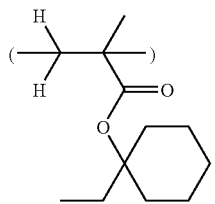 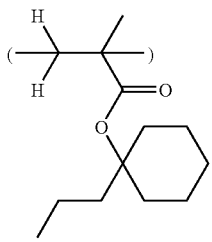 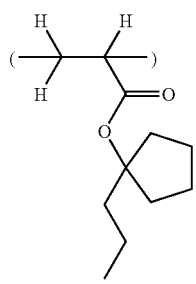 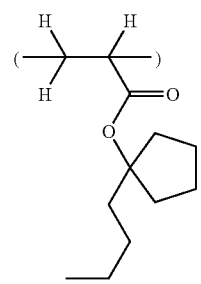
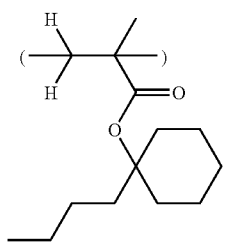 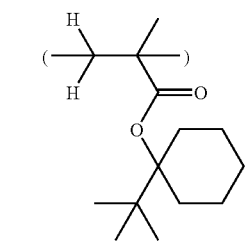 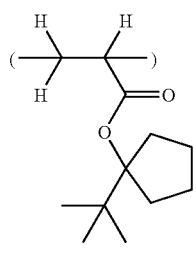 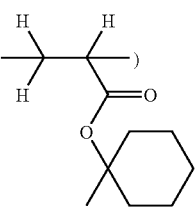
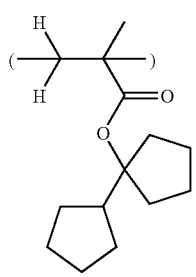 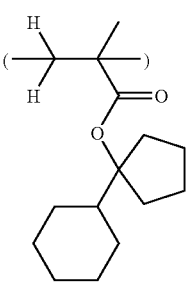 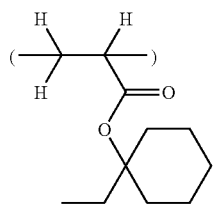 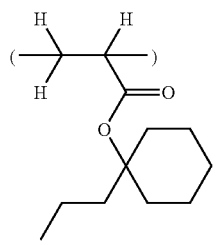
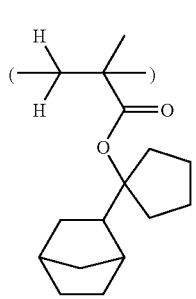 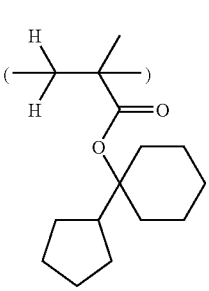 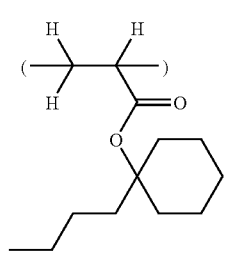 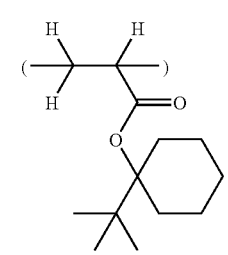

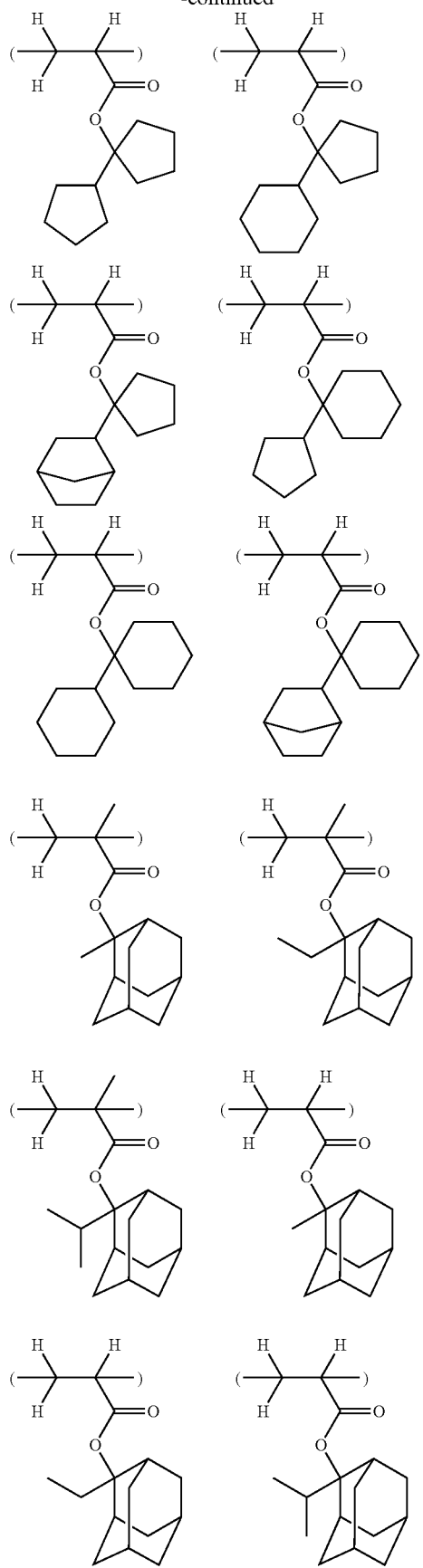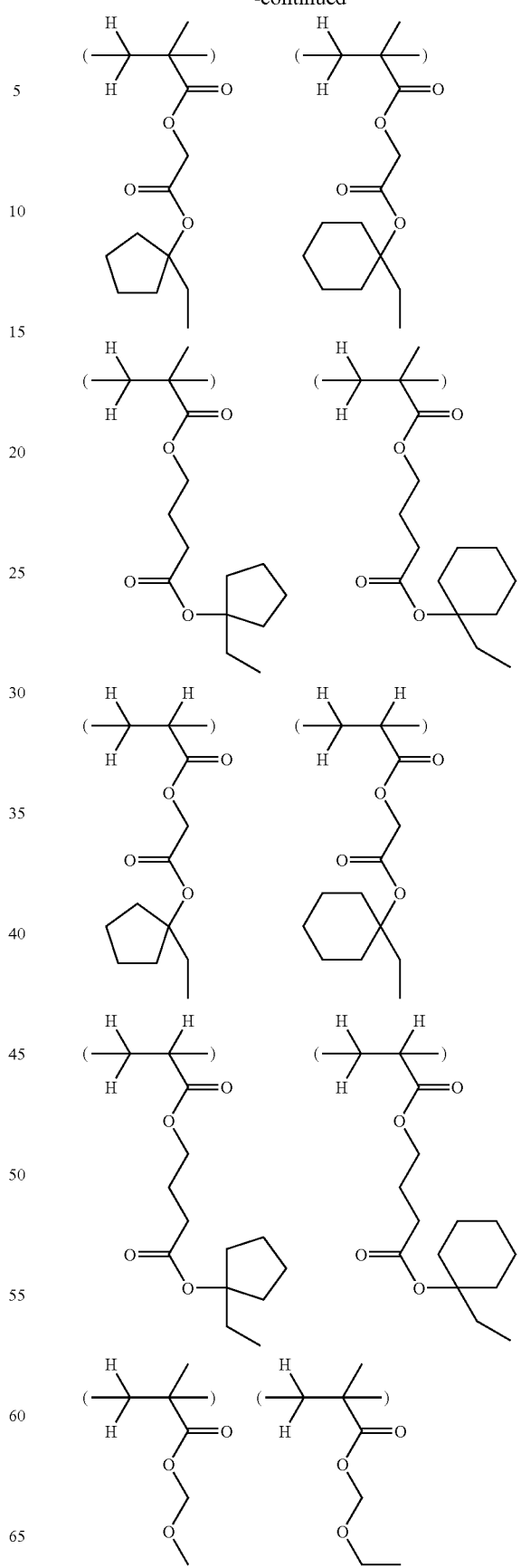

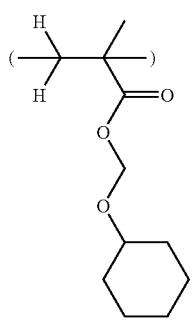 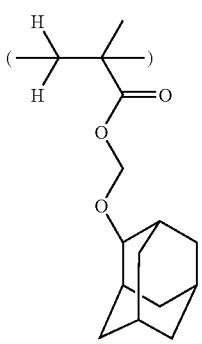 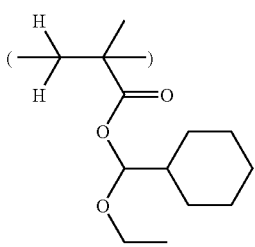 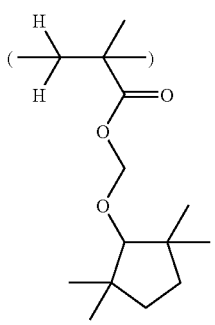
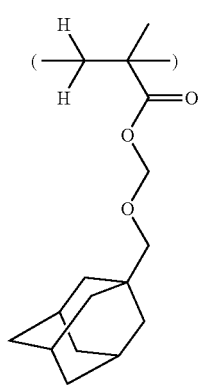 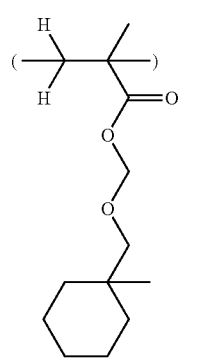 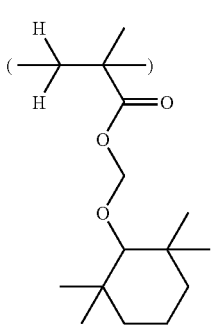 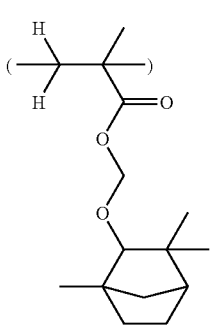
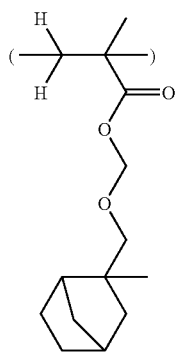 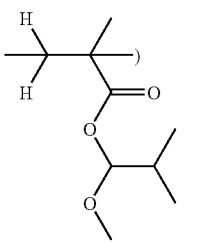 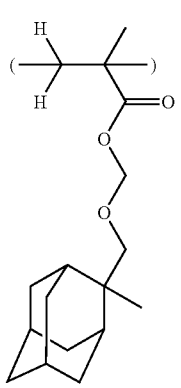 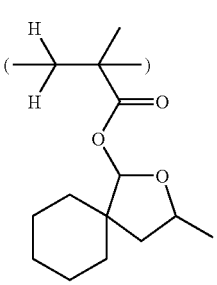
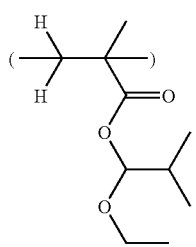 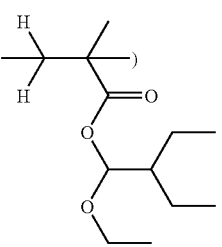 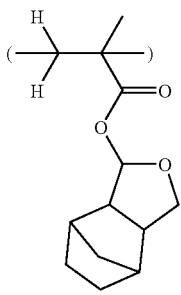 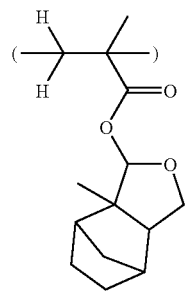
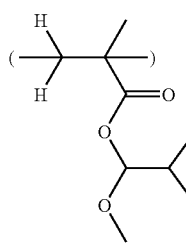 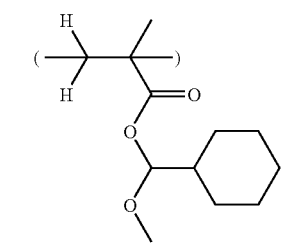 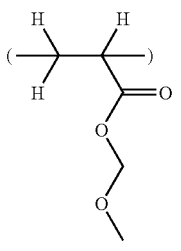 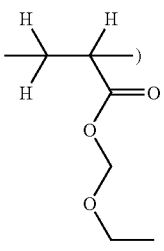

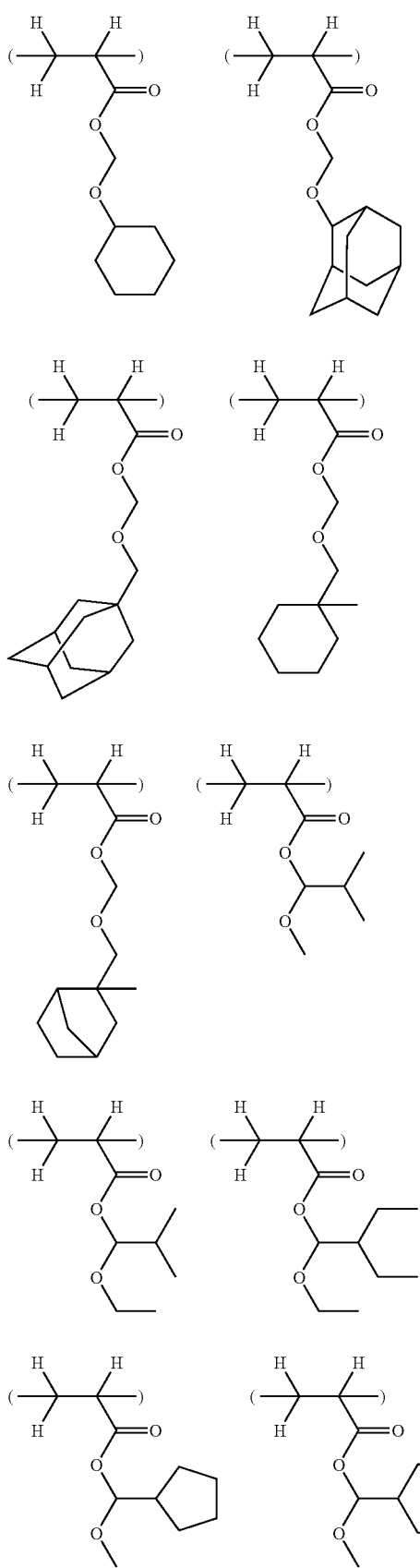
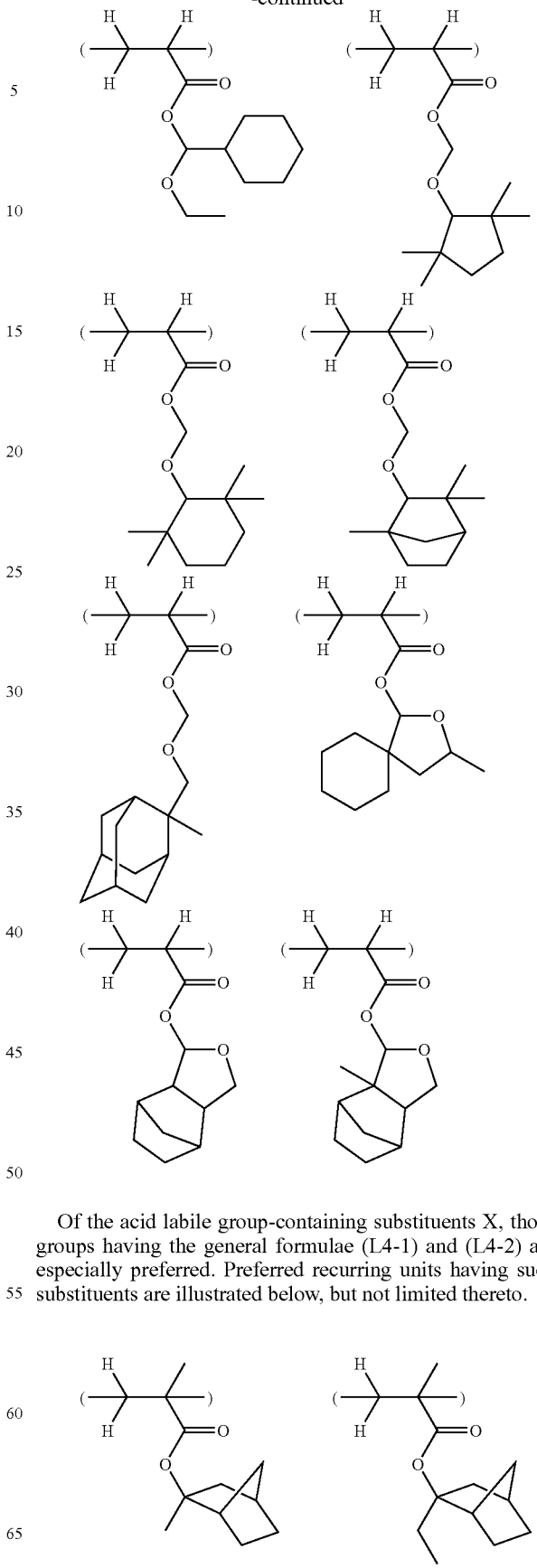
Of the acid labile group-containing substituents X, those groups having the general formulae (L4-1) and (L4-2) are especially preferred. Preferred recurring units having such substituents are illustrated below, but not limited thereto.

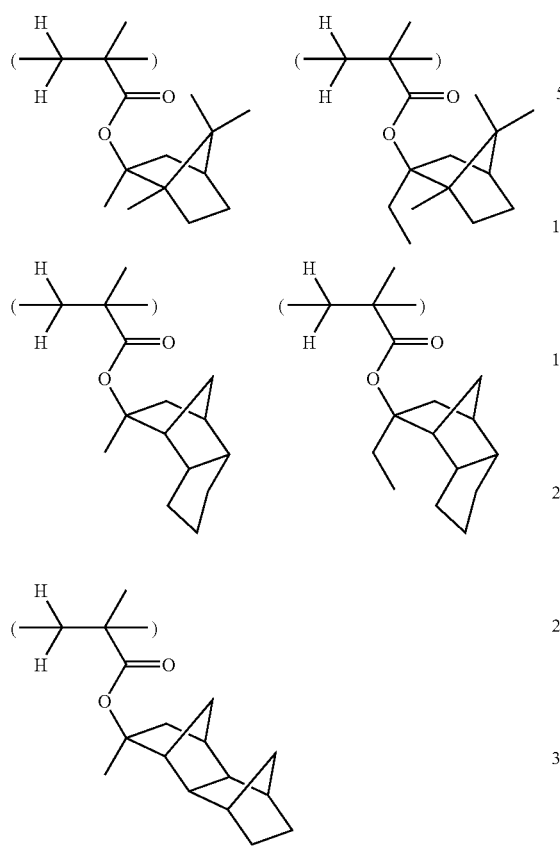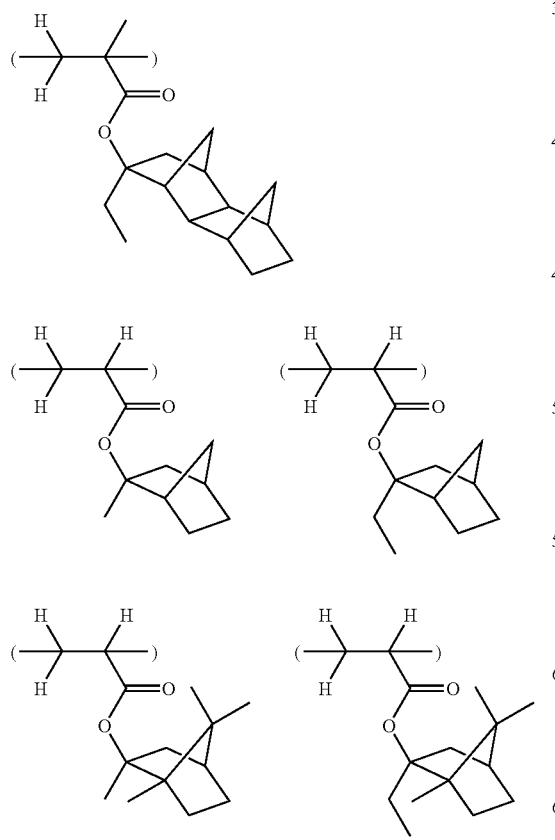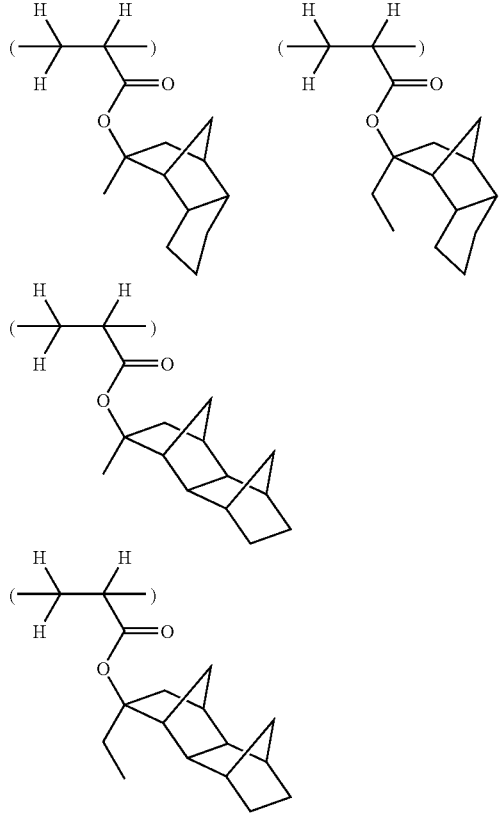
Of the acid labile group-containing substituents X, those groups having the general formulae (L5-1) and (L5-2) are also especially preferred. Preferred recurring units having such substituents are illustrated below, but not limited thereto.
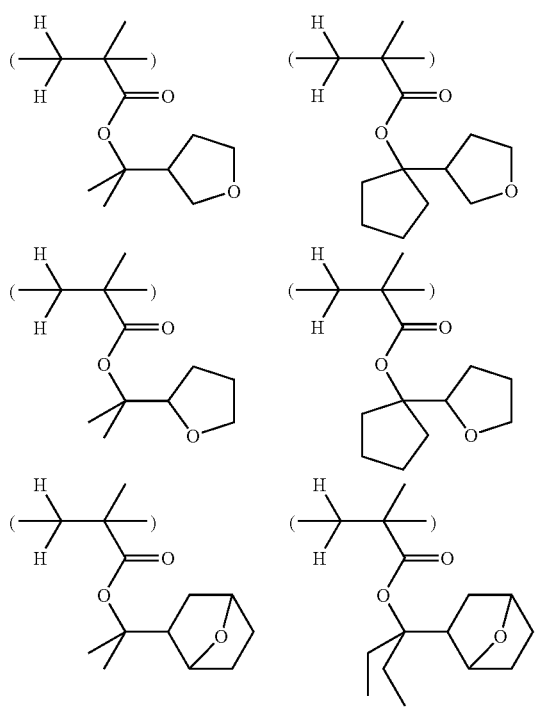

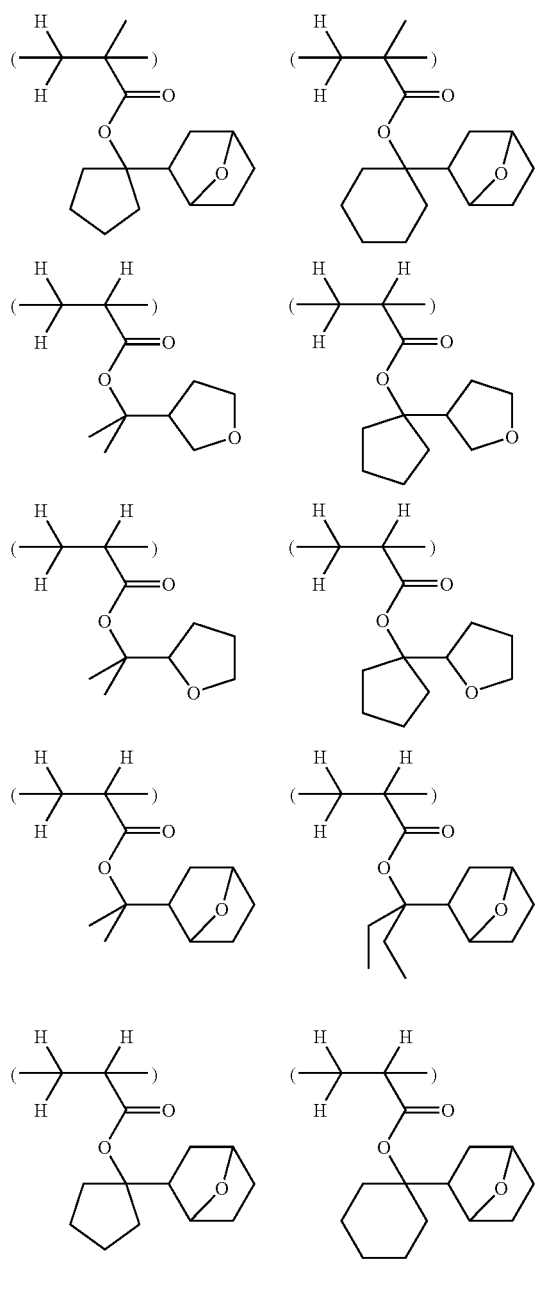
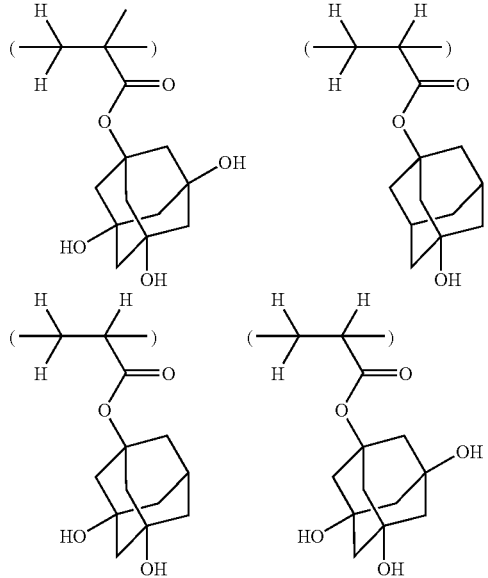

Illustrative, non-limiting examples of the recurring units of formula (3) are given below.

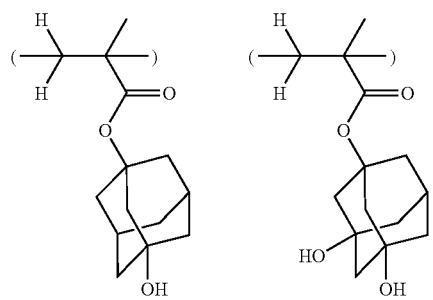

In formula (4), Y denotes a substituent group having lactone structure, which may be selected from a variety of such groups. Those recurring units of the general formulae (18) and (19) are especially preferred.

(18)

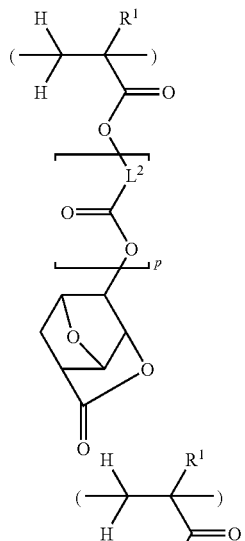

(19)

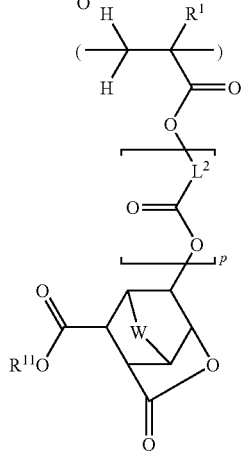

Herein $R^1$ is each independently hydrogen, fluorine, methyl or trifluoromethyl, $R^{11}$ is a straight, branched or cyclic $C_1$-$C_{20}$ alkyl group which may have one or more fluorine atoms, W is —CH$_2$—, an oxygen atom or sulfur atom, L$^2$ is a straight or branched C$_1$-C$_5$ alkylene group, and p is 0 or 1.

When a polymer having a sulfonium salt bonded at its cation side to the main chain is used as in the invention, the polymer will swell during alkaline development, resulting in a pattern undergoing surface roughening and increased LER. By incorporating recurring units having oxygen-functional group as well as lactone structure like recurring units of formula (18) or (19), the pattern can be finished with minimal LER. It is believed that incorporation of recurring units of formula (18) or (19) renders the polymer more hydrophilic, thus restraining the polymer from swelling upon alkaline development. Since the recurring units of formula (18) or (19) are characterized by the effective arrangement of an oxygen-functional group within the cyclic structure, a loss of etching resistance due to a lowering of carbon density is minimized. Accordingly, using a polymer comprising recurring units of formula (1) and recurring units of formula (18) or (19), a resist composition can be formulated which has a low value of LER and a practically acceptable level of etching resistance.

L$^2$ is a straight or branched C$_1$-C$_5$ alkylene group. Examples include methylene, ethylene, propylene, trimethylene, dimethylethylene, and tetramethylene.

R$^{11}$ is a straight, branched or cyclic C$_1$-C$_{20}$ alkyl group which may have one or more fluorine atoms. Examples include methyl, ethyl, propyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, and adamantyl as well as the groups shown below.

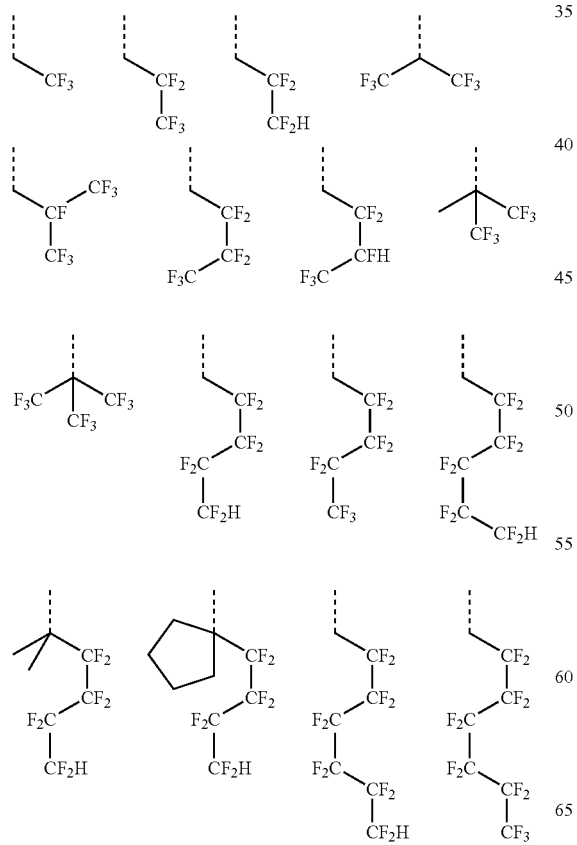

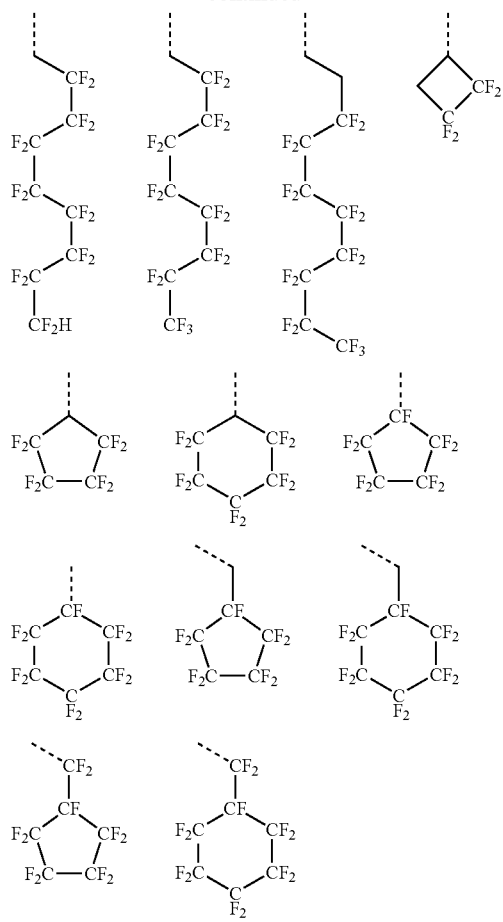

Note that the broken line denotes a valence bond.

Illustrative, non-limiting examples of the recurring units of formula (4) are given below.

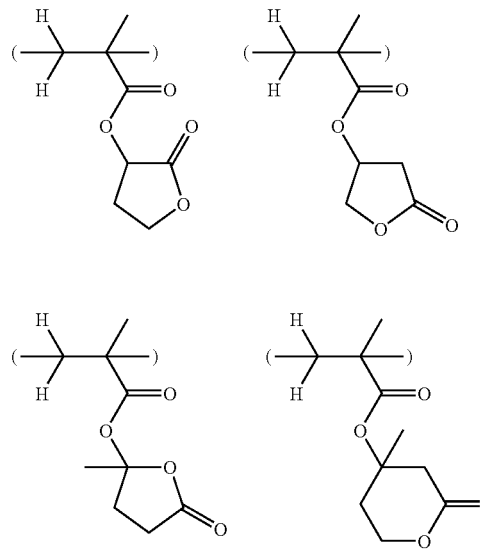

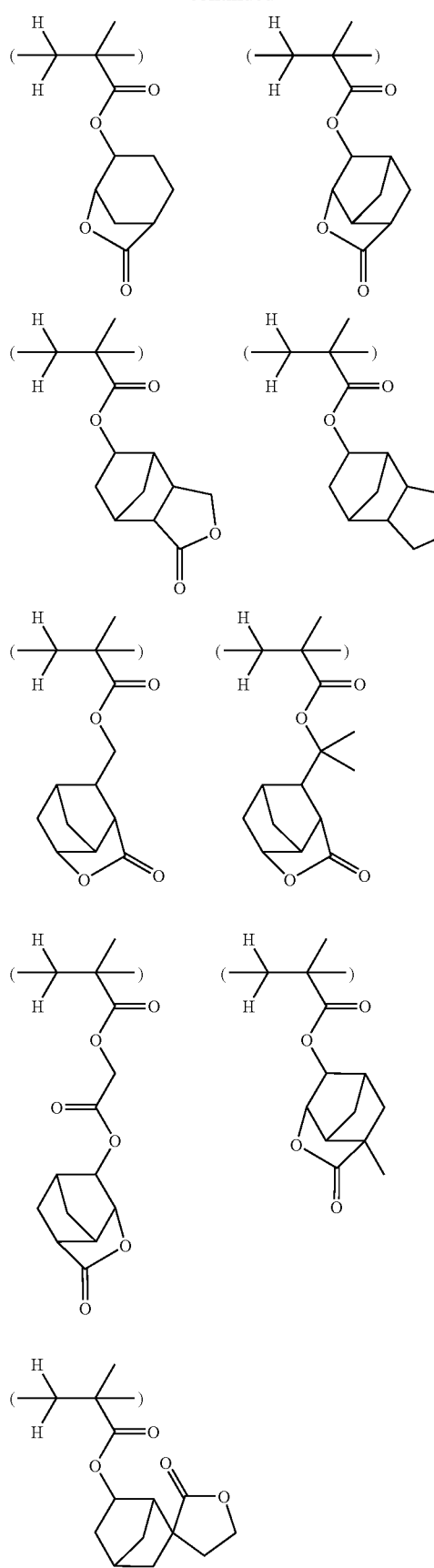
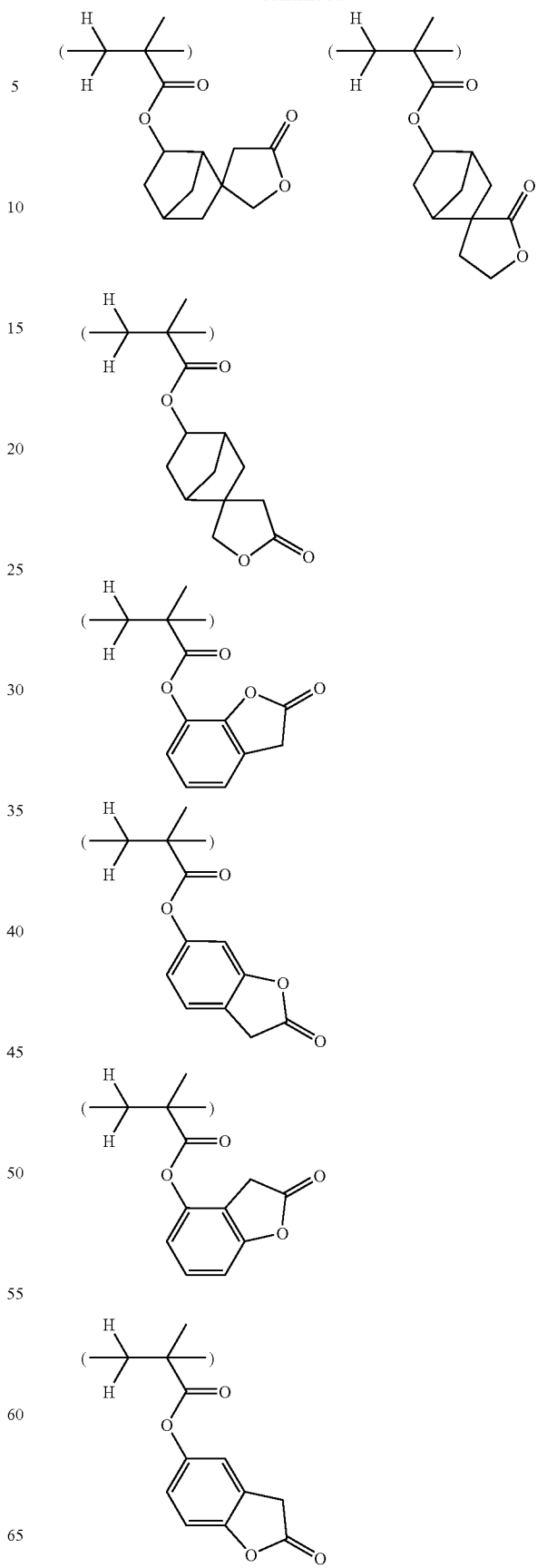

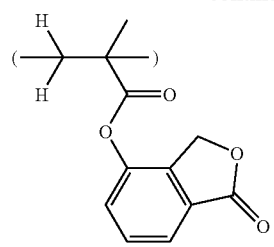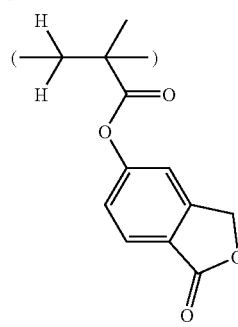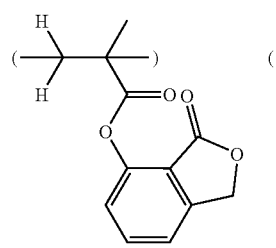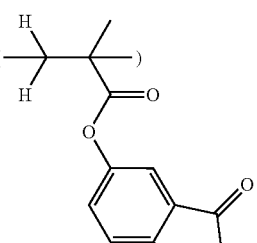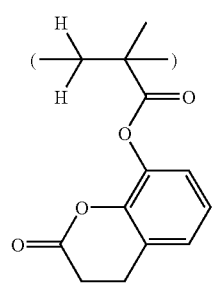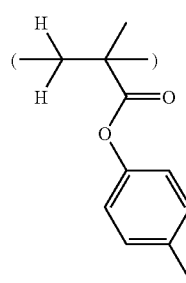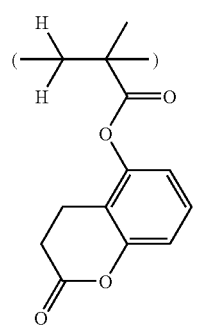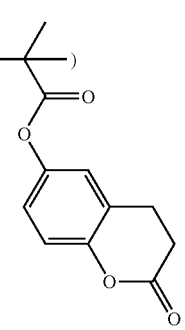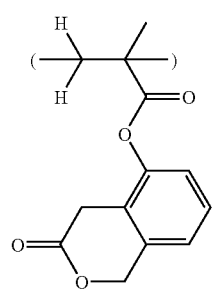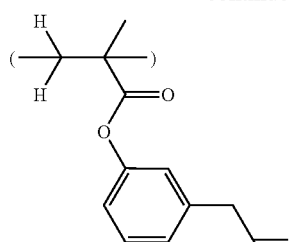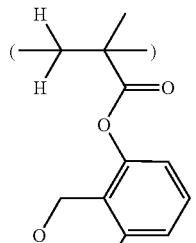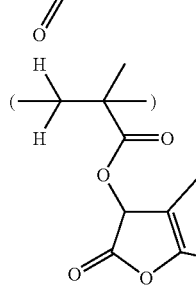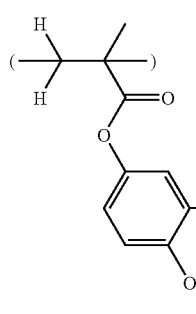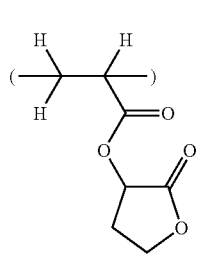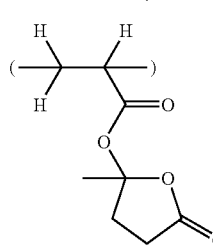

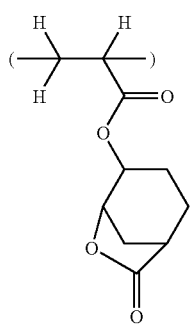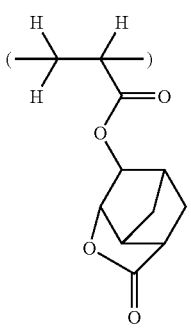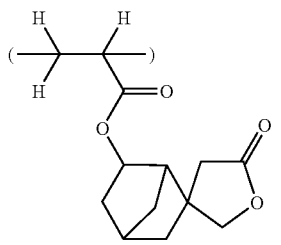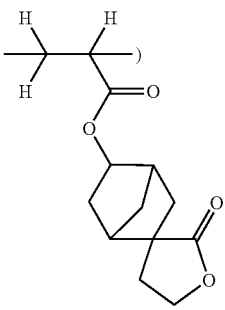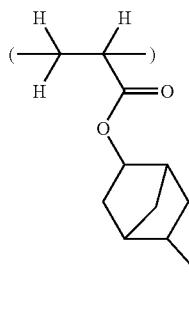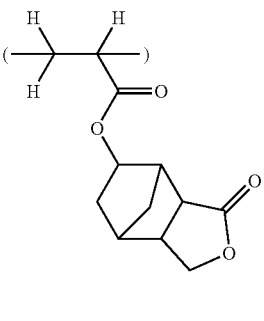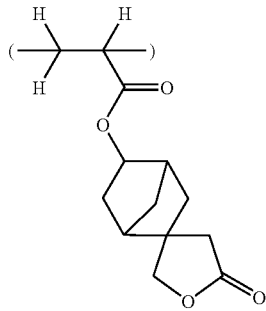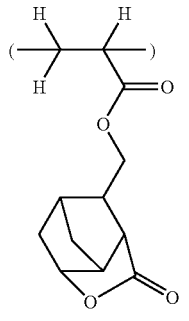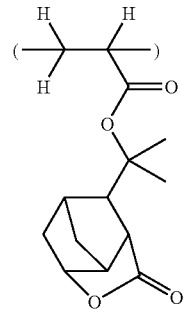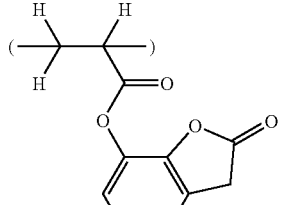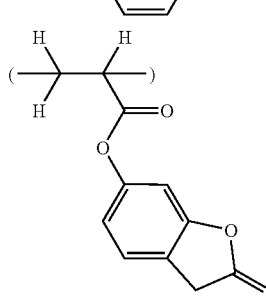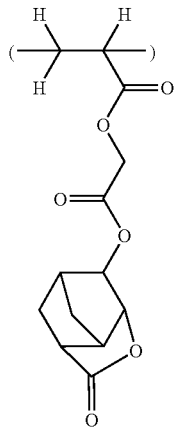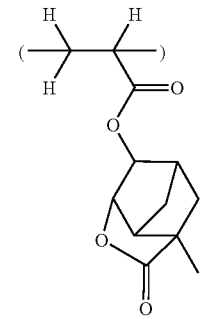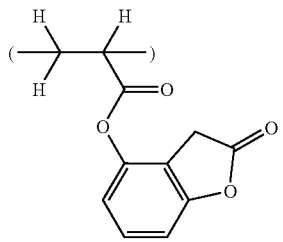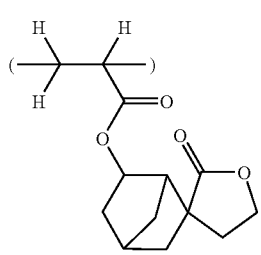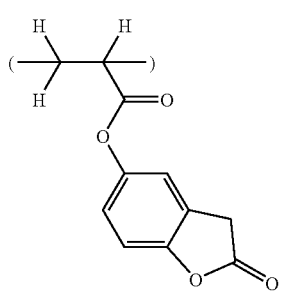

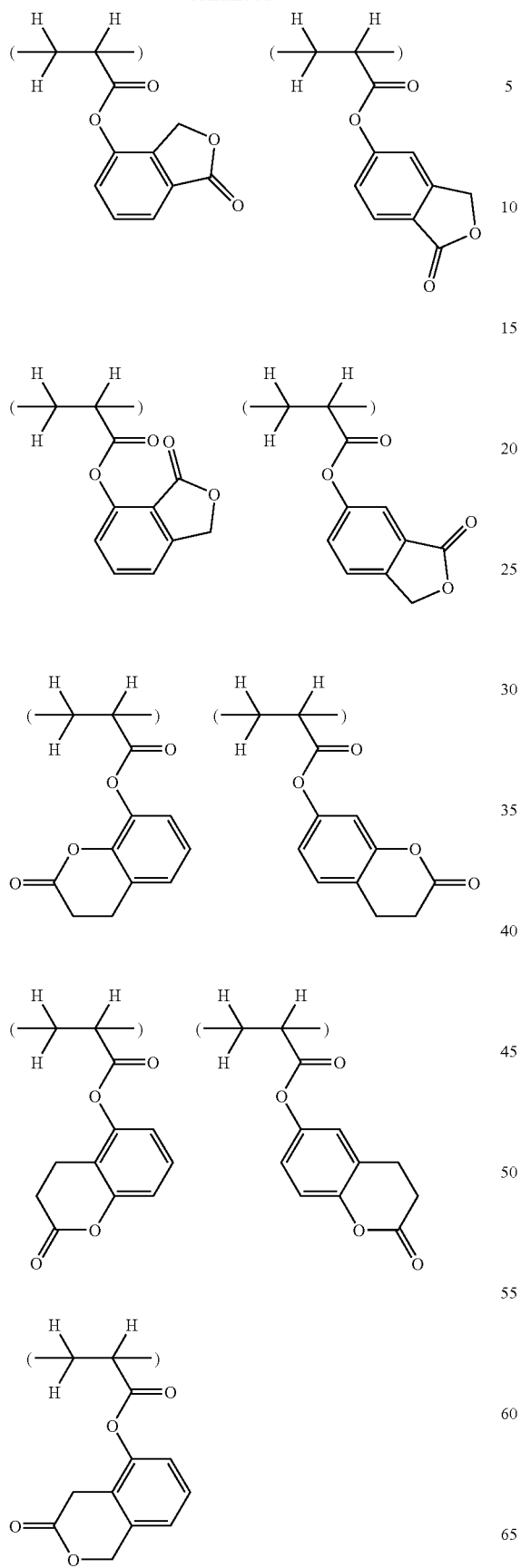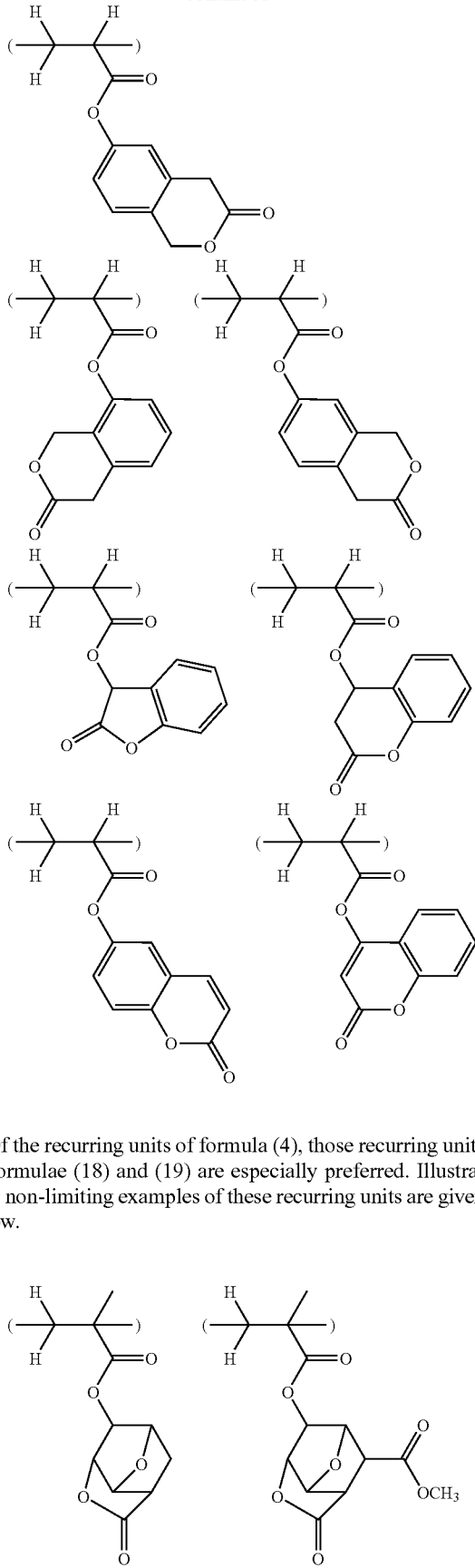
Of the recurring units of formula (4), those recurring units of formulae (18) and (19) are especially preferred. Illustrative, non-limiting examples of these recurring units are given below.

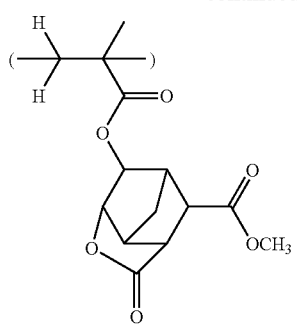
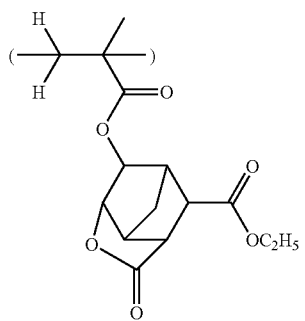
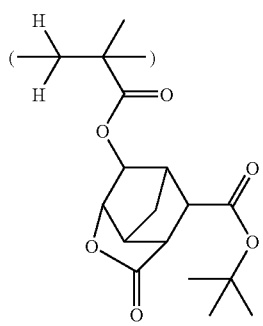
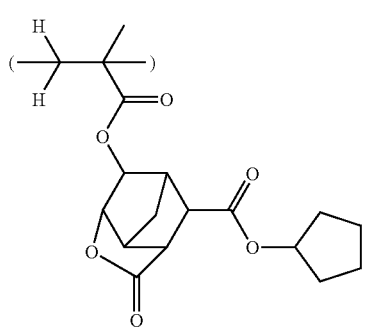
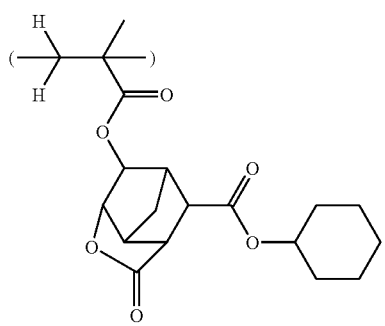
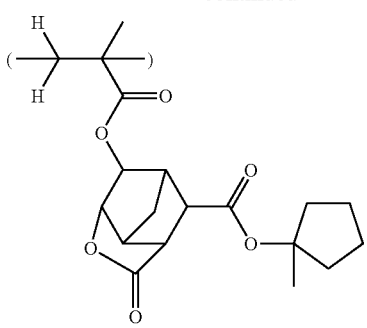
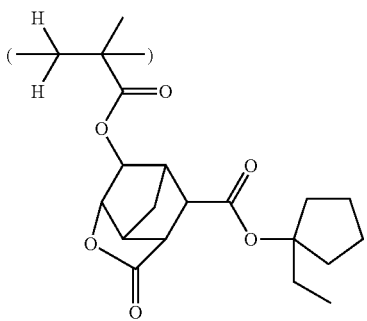
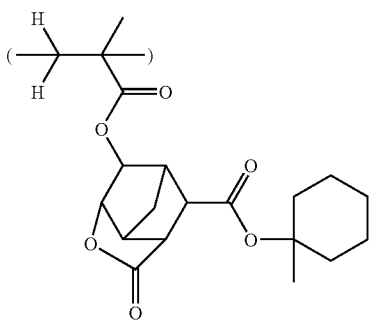
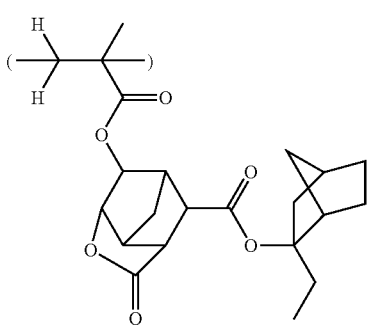
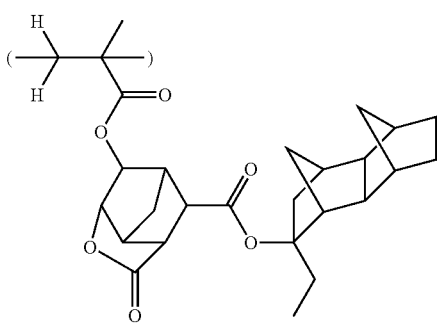

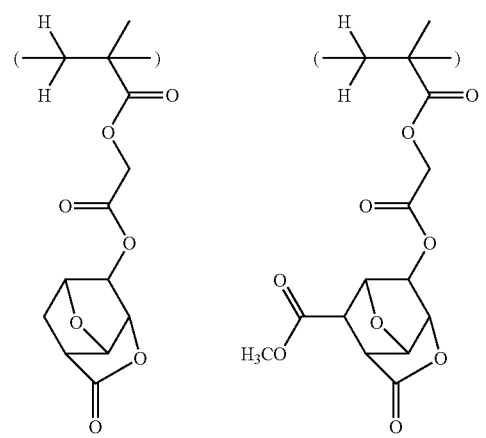
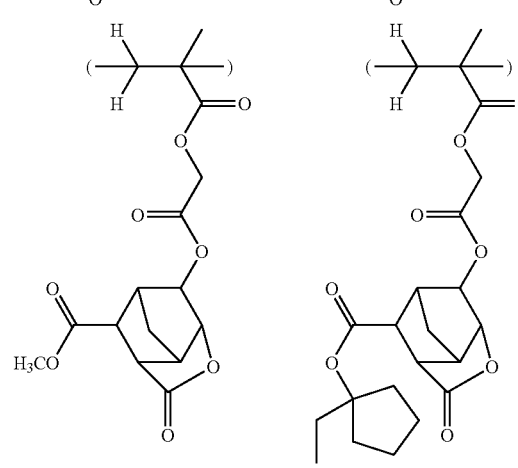
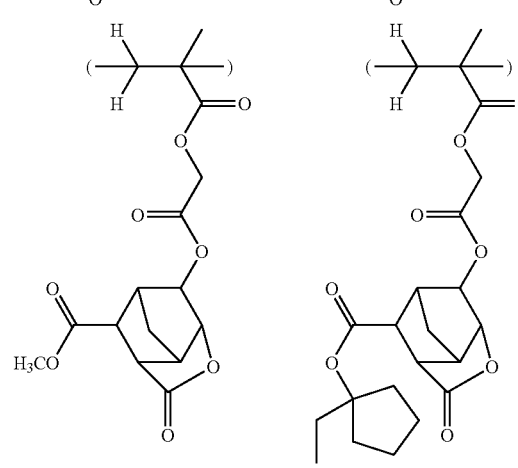
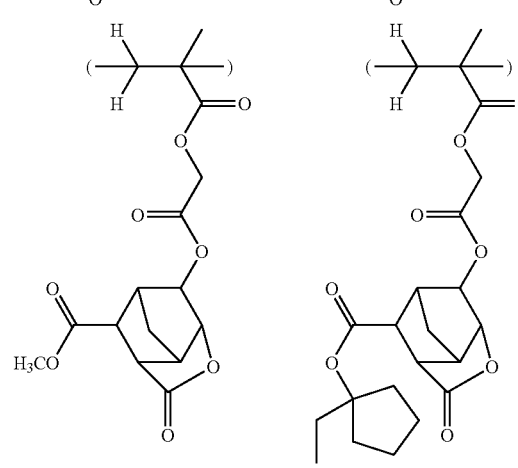
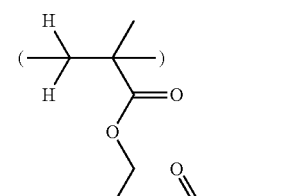

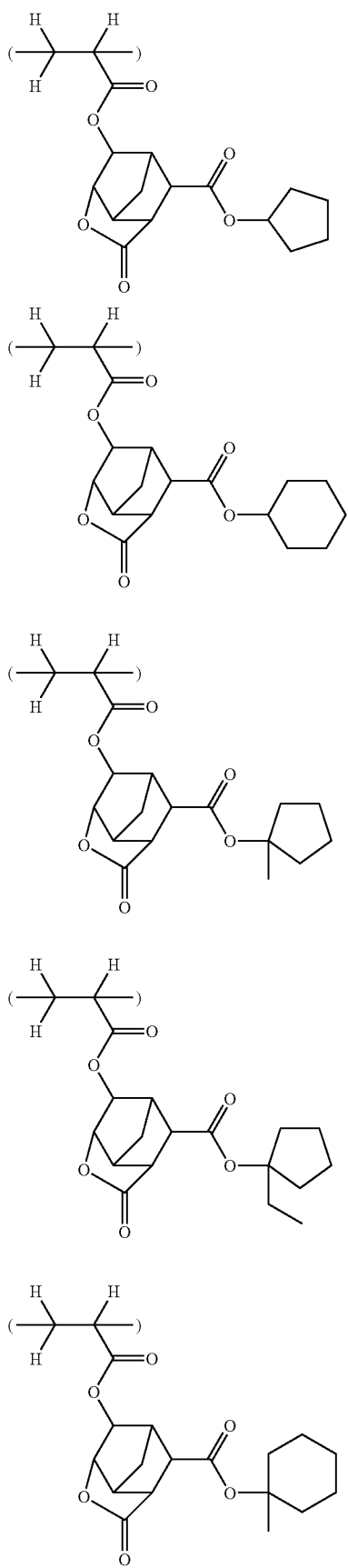
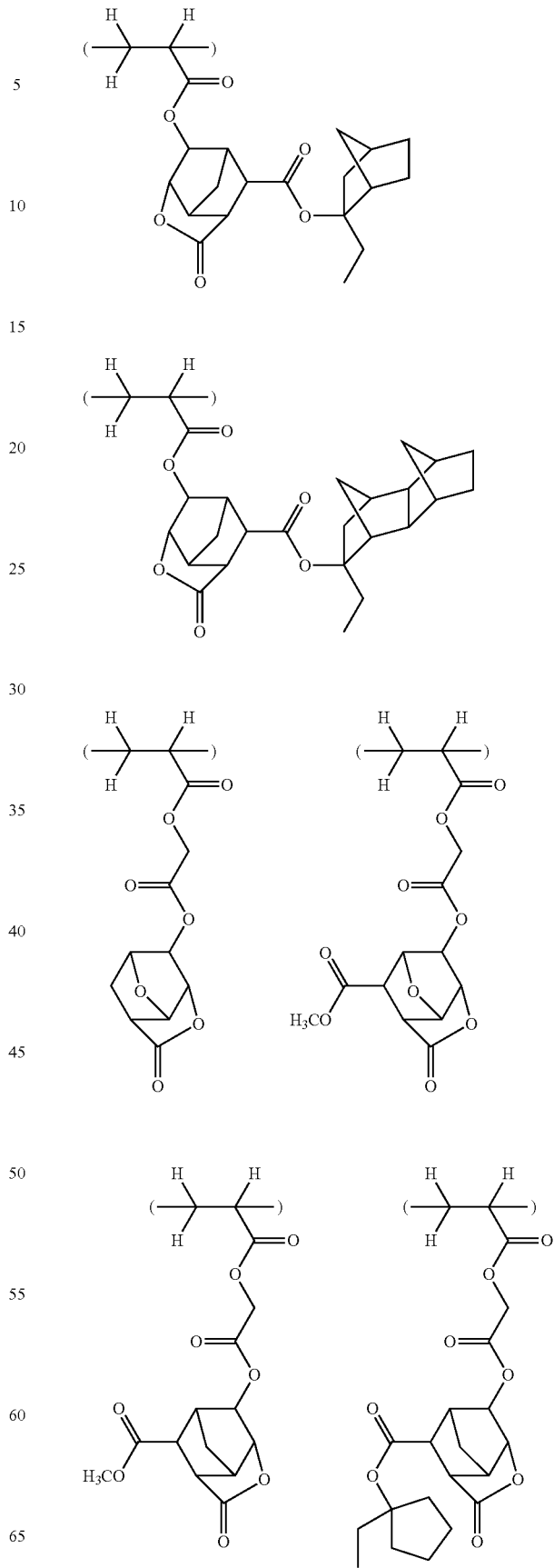

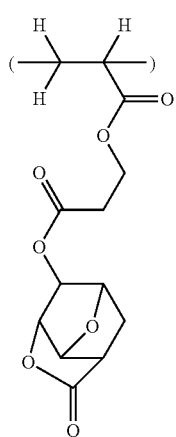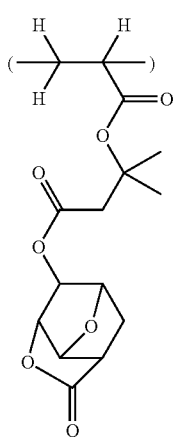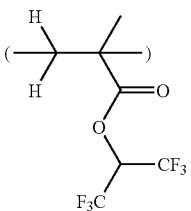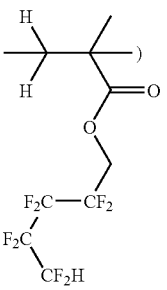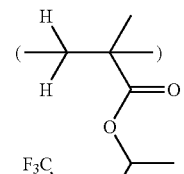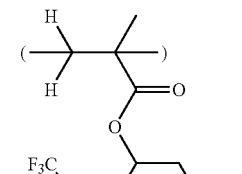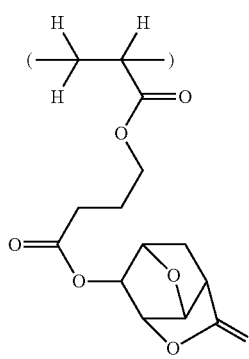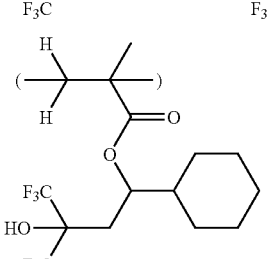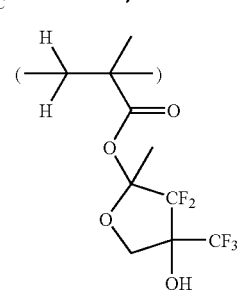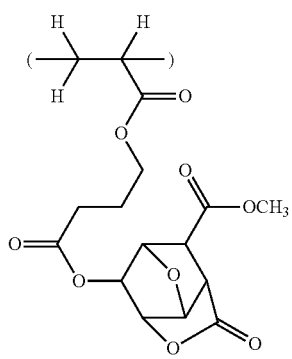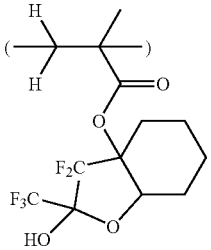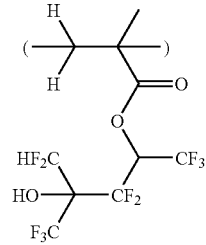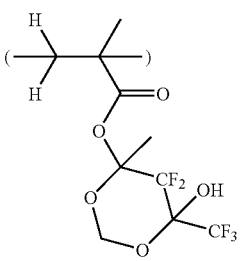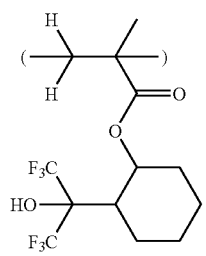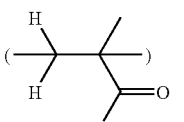
In formula (5), Z is hydrogen, a $C_1$-$C_{15}$ fluoroalkyl group or a $C_1$-$C_{15}$ fluoroalcohol-containing substituent group. Illustrative, non-limiting examples of the recurring units of formula (5) are given below.
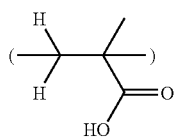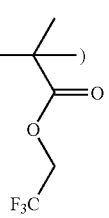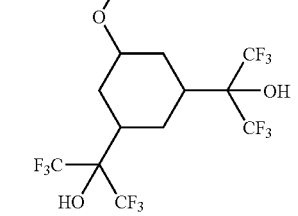

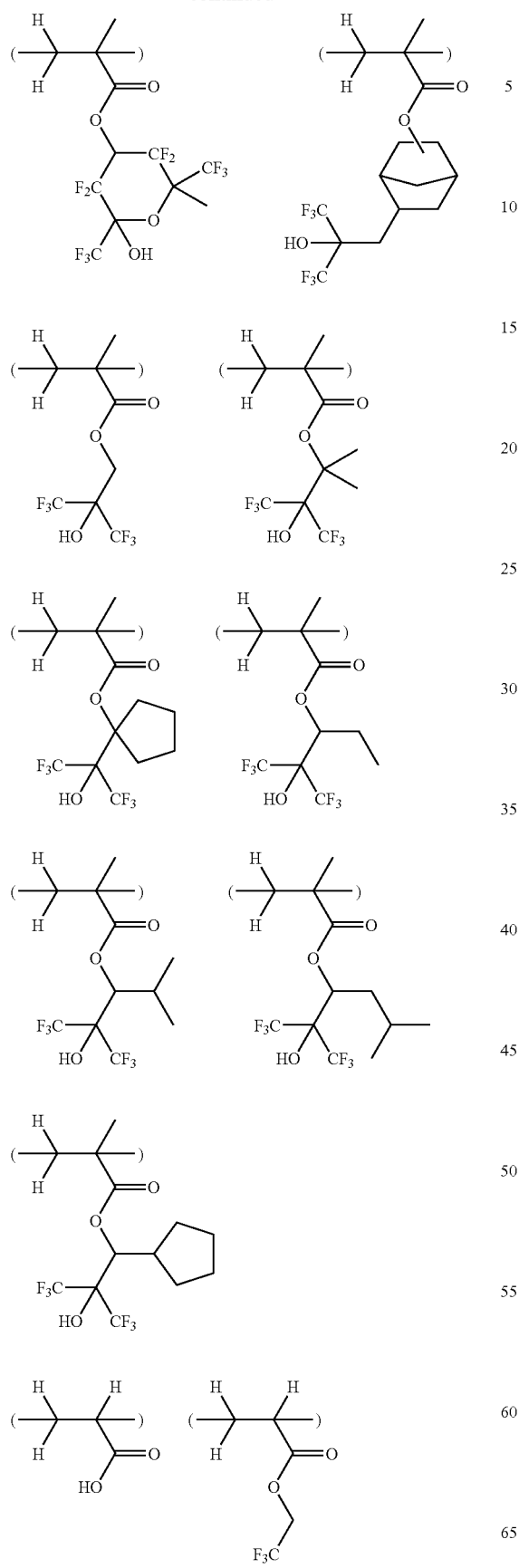
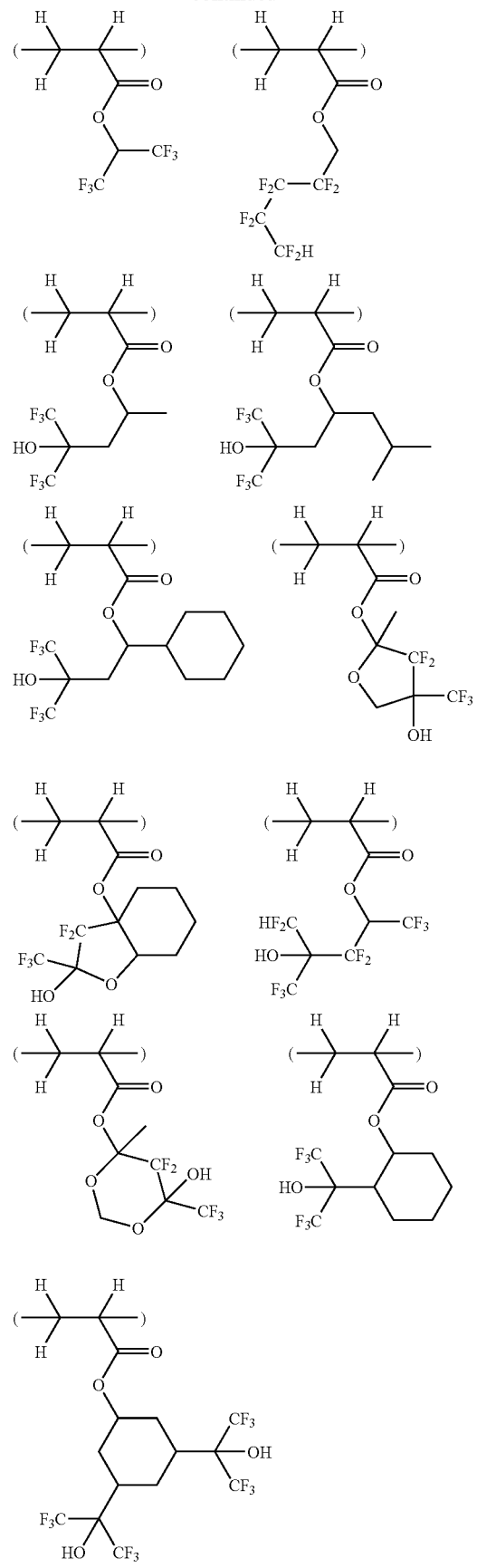

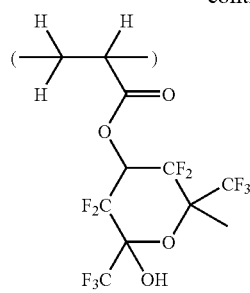
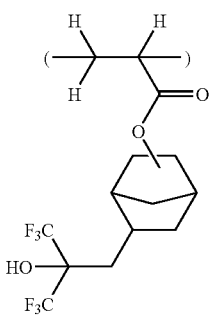
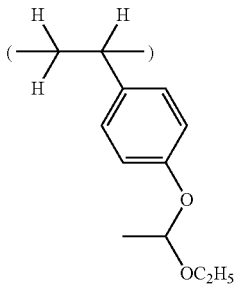
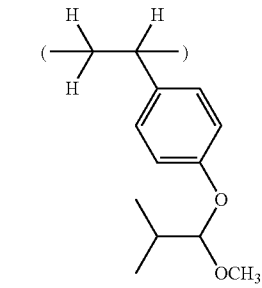
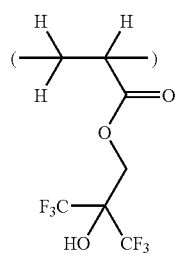
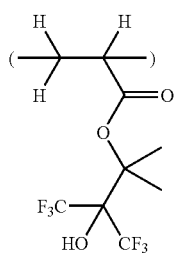
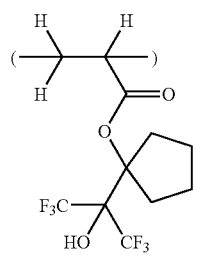
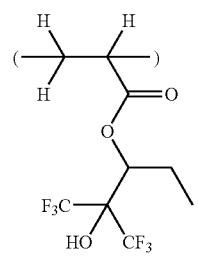
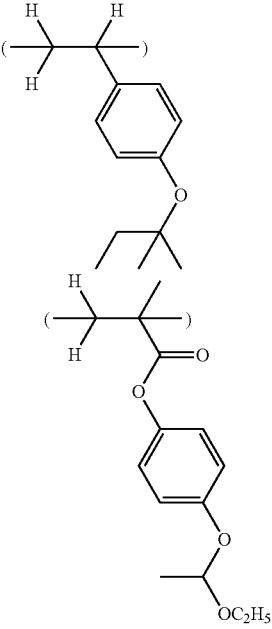
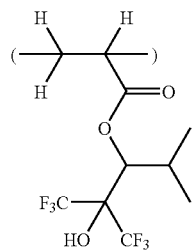
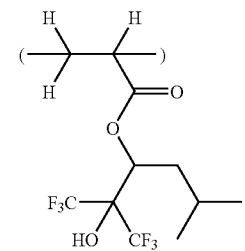
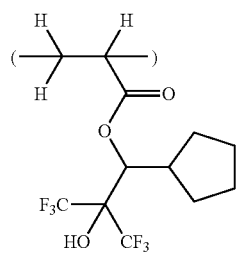
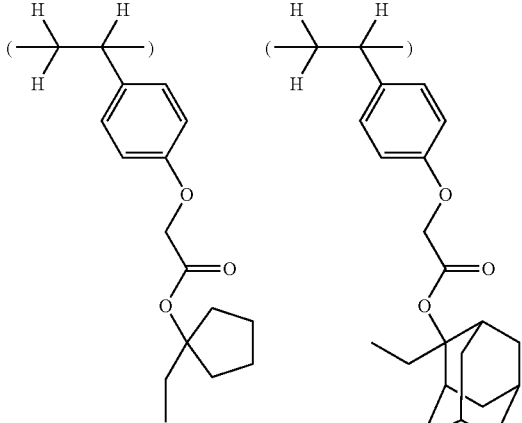
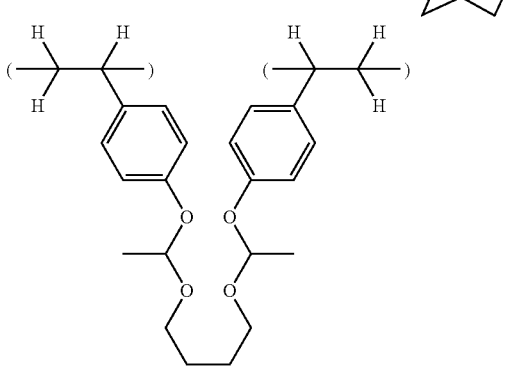
In the recurring units of formulae (6) to (9), $R^1$ is each independently hydrogen, fluorine, methyl or trifluoromethyl, X is an acid labile group-containing substituent group as described above, G is an oxygen atom or —C(=O)O—, and $L^1$ is a single bond or —C(=O)O—.
Illustrative, non-limiting examples of the recurring units of formula (6) are given below.

In the recurring units of formula (7), the substituent group may be bonded to the naphthalene nucleus at any desired position. Illustrative, non-limiting examples of the recurring units of formula (7) are given below.

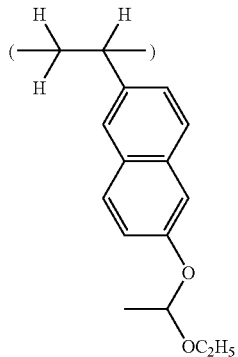
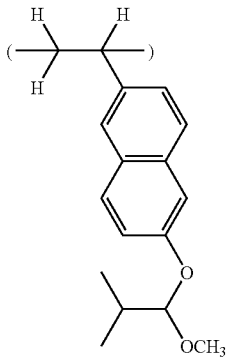
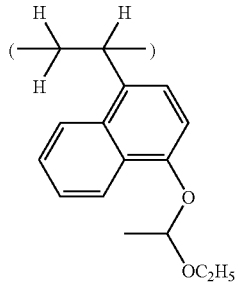
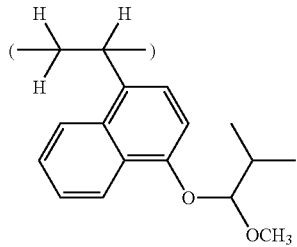

Illustrative, non-limiting examples of the recurring units of formula (8) are given below.

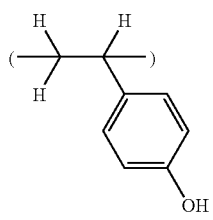
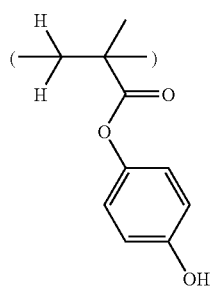
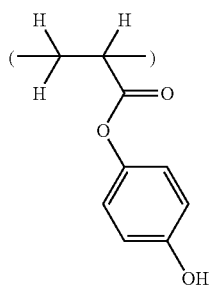

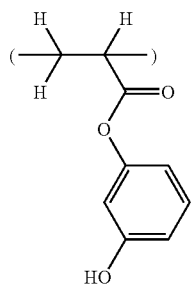

In the recurring units of formula (9), the substituent group may be bonded to the naphthalene nucleus at any desired position. Illustrative, non-limiting examples of the recurring units of formula (9) are given below.

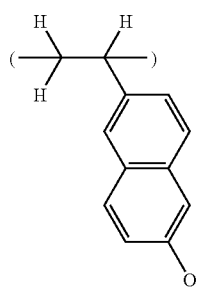
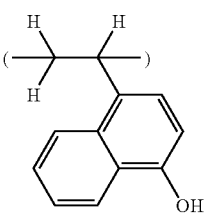
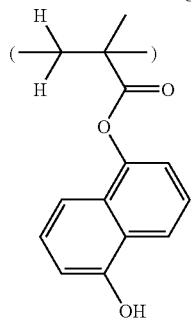
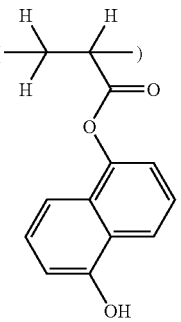

In the recurring units of formula (10), W is —CH$_2$—, an oxygen atom or sulfur atom. Illustrative, non-limiting examples of the recurring units of formula (10) are given below.

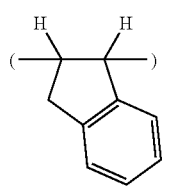
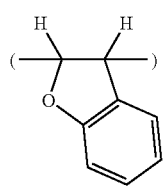
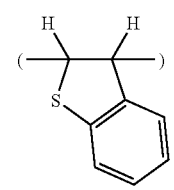

When the polymer of the invention is used as a base resin in a resist composition, it is preferred that the polymer contain recurring units of at least one type selected from those recurring units bearing acid labile group-containing substituent group X, represented by formulae (2), (6) and (7). By further incorporating those recurring units of formulae (3) to (5) and (8) to (11), the resist properties including resolution and LER of the polymer can be tailored.

It is noted that acid labile group-free polymers are also encompassed within the scope of the invention and may be equally used as a polymeric acid generator in a resist composition.

The polymer of the invention may further comprise recurring units derived from another monomer having a carbon-to-carbon double bond other than the foregoing. Examples of the additional monomer include substituted acrylic acid esters such as methyl methacrylate, methyl crotonate, dimethyl maleate, and dimethyl itaconate, unsaturated carboxylic acids such as maleic acid, fumaric acid and itaconic acid, cyclic olefins such as norbornene, norbornene derivatives, and tetracyclo[4.4.0.1$^{2,5}$.1$^{7,10}$]-dodecene derivatives, and norbornadiene derivatives such as norbornadiene, 2-carboxynorbornadiene and 2-ethoxycarbonyl-norbornadiene, and unsaturated acid anhydrides such as maleic anhydride and itaconic anhydride, α,β-unsaturated lactones such as 5,5-dimethyl-3-methylene-2-oxotetrahydrofuran, styrene, vinylnaphthalene, aromatic ring-containing monomers as shown below, and other monomers.

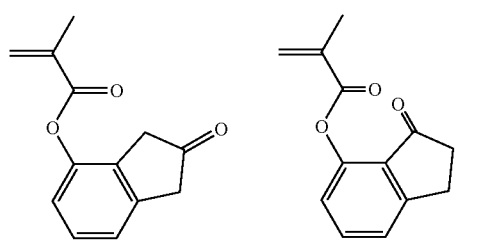

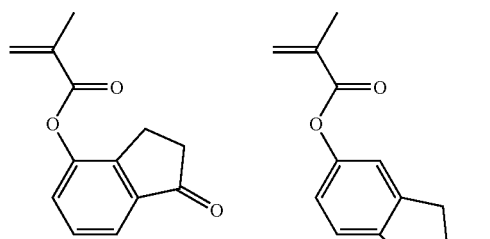

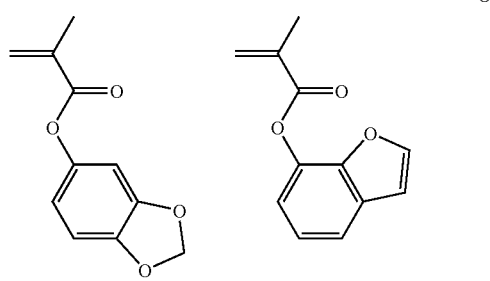

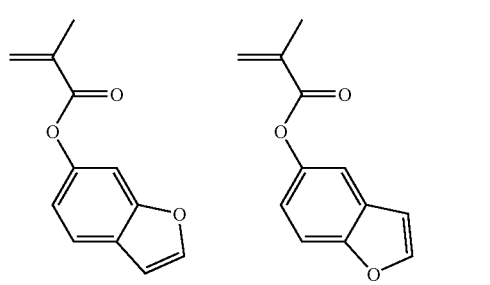

-continued

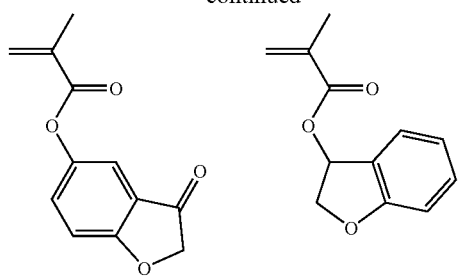

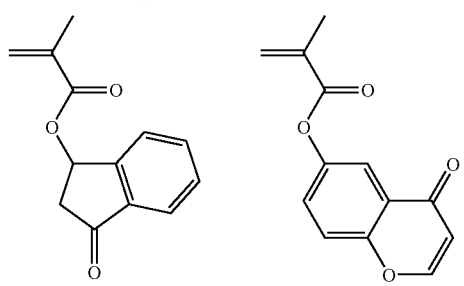

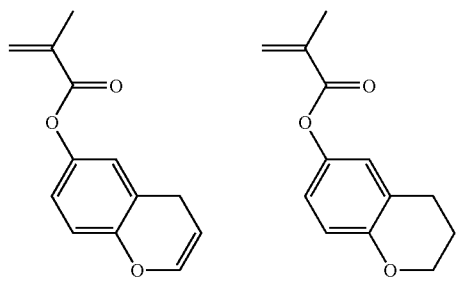

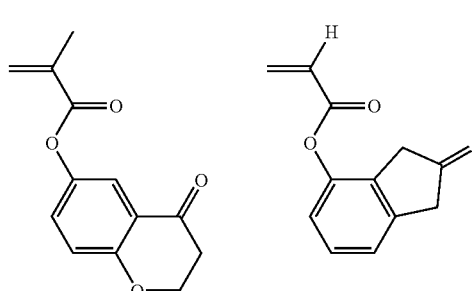

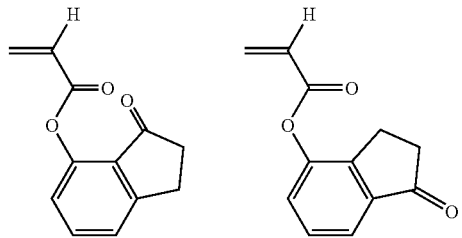

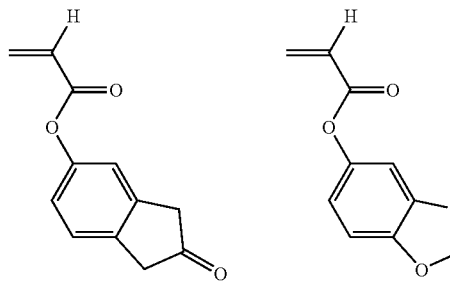

-continued

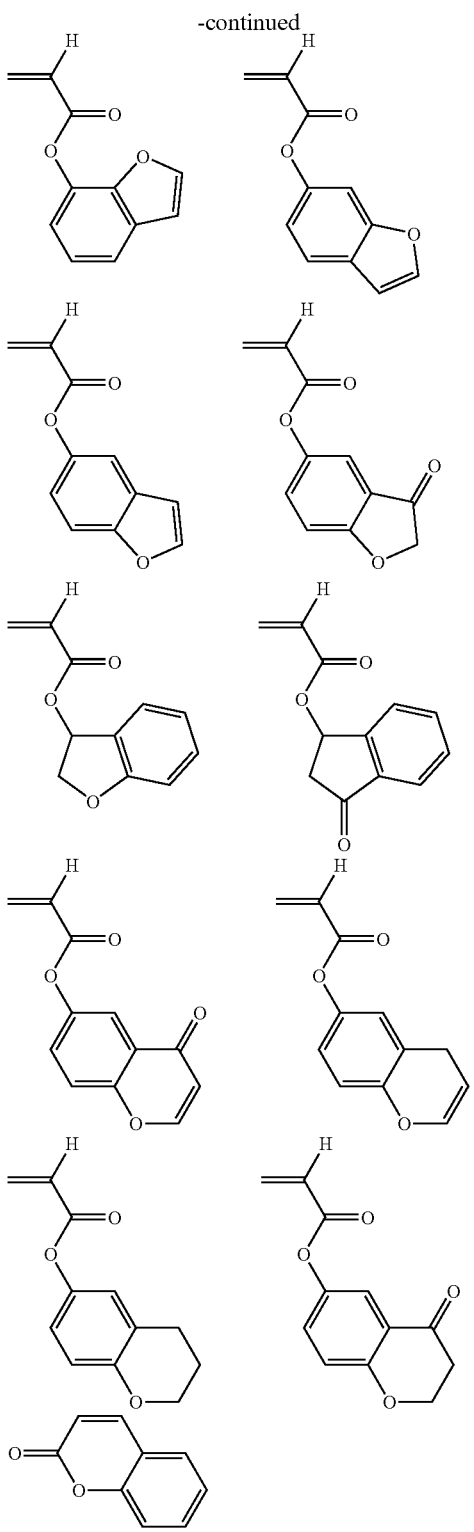

The polymers of the invention are applicable not only to the ArF photolithography, but also to another lithography such as KrF, EB or EUV lithography.

The polymers have a weight average molecular weight (Mw) of 1,000 to 500,000, and preferably 3,000 to 100,000. Outside the range, a polymer may suffer an extreme drop of etching resistance or a reduced resolution due to a failure to provide a difference in dissolution rate before and after exposure. The measurement of molecular weight may be performed by gel permeation chromatography (GPC) versus polystyrene standards or a light scattering method.

In the inventive polymer, the preferred proportion of respective recurring units derived from discrete monomers may fall, for example, in the range (mol %) shown below, but is not limited thereto. The polymer may consist essentially of:

(I) from more than 0 mol % to 100 mol %, preferably 1 to 60 mol %, and more preferably 5 to 50 mol % of recurring units of one or more type having formula (1);

(II) from 0 mol % to less than 100 mol %, preferably 40 to 99 mol %, and more preferably 50 to 95 mol % of recurring units of one or more type having formulae (2) to (19); and optionally, (III) from 0 mol % to 80 mol %, preferably 0 to 70 mol %, and more preferably 0 to 50 mol % of constituent units of one or more type derived from the additional monomer(s).

Preferably, the polymer contains 0 to 95 mol %, especially 5 to 90 mol % of recurring units selected from formulae (2) and (12) to (17); 0 to 95 mol %, especially 5 to 90 mol % of recurring units of formula (3); and 0 to 95 mol %, especially 5 to 90 mol % of recurring units selected from formulae (4), (18) and (19).

The polymer of the invention may be prepared through copolymerization reaction using the compound from which recurring units of formula (1) are derived as a first monomer and one or more compounds having a polymerizable double bond as second and subsequent monomers.

A variety of monomers from which recurring units of formula (1) essential for the inventive polymer are derived may be prepared by well-known organic chemical techniques, and advantageously by the method described in JP-A 2007-145797.

Various modes of copolymerization reaction may be used for the preparation of the inventive polymer. The preferred modes are radical polymerization, anionic polymerization and coordination polymerization.

For radical polymerization, preferred reaction conditions include (a) a solvent selected from hydrocarbon solvents such as benzene, toluene and xylene, glycol solvents such as propylene glycol monomethyl ether and propylene glycol monomethyl ether acetate, ether solvents such as diethyl ether, diisopropyl ether, dibutyl ether, tetrahydrofuran, and 1,4-dioxane, ketone solvents such as acetone, methyl ethyl ketone, methyl isobutyl ketone and methyl amyl ketone, ester solvents such as ethyl acetate, propyl acetate, butyl acetate and ethyl lactate, lactone solvents such as γ-butyrolactone, and alcohol solvents such as ethanol and isopropyl alcohol; (b) a polymerization initiator selected from well-known radical polymerization initiators including azo compounds such as 2,2'-azobisisobutyronitrile, 2,2'-azobis-2-methylisobutyronitrile, dimethyl 2,2'-azobisisobutyrate, 2,2'-azobis-2,4-dimethylvaleronitrile, 1,1'-azobis(cyclohexane-1-carbonitrile), and 4,4'-azobis(4-cyanovaleric acid), and peroxides such as lauroyl peroxide and benzoyl peroxide; (c) a radical chain transfer agent, if necessary for molecular weight control, selected from thiol compounds including 1-butanethiol, 2-butanethiol, 2-methyl-1-propanethiol, 1-octanethiol, 1-decanethiol, 1-tetradecanethiol, cyclohexanethiol, 2-mercaptoethanol, 1-mercapto-2-propanol, 3-mercapto-1-propanol, 4-mercapto-1-butanol, 6-mercapto-1-hexanol, 1-thioglycerol, thioglycolic acid, 3-mercaptopropionic acid, and thiolactic acid; (d) a reaction temperature in the range of about 0° C. to about 140° C.; and (e) a reaction time in the range of about 0.5 to about 48 hours. Reaction parameters outside these ranges need not be excluded.

For anionic polymerization, preferred reaction conditions include (a) a solvent selected from among hydrocarbons such as benzene, ethers such as tetrahydrofuran, and liquid ammonia, (b) a polymerization initiator selected from metals such as sodium and potassium, alkyl metals such as n-butyllithium and sec-butyllithium, ketyl, and Grignard reagents, (c) a temperature of about −78° C. to about 0° C., (d) a time of about ½ hour to about 48 hours, and (e) a stopper selected from among proton-donative compounds such as methanol, halides such as methyl iodide, and electrophilic compounds. Reaction conditions outside the described range may be employed if desired.

For coordination polymerization, preferred reaction conditions include (a) a solvent selected from among hydrocarbons such as n-heptane and toluene, (b) a catalyst selected from Ziegler-Natta catalysts comprising a transition metal (e.g., titanium) and alkylaluminum, Phillips catalysts of metal oxides having chromium or nickel compounds carried thereon, and olefin-metathesis mixed catalysts as typified by tungsten and rhenium mixed catalysts, (c) a temperature of about 0° C. to about 100° C., and (d) a time of about ½ hour to about 48 hours. Reaction conditions outside the described range may be employed if desired.

The polymer prepared by any mode of polymerization as described above may be used in a negative resist composition, provided that some or all acid labile groups on the polymer are deprotected. Alternatively, the polymer in which acid labile groups have been deprotected can be modified by introducing acid labile groups therein again whereby substituent groups different from the acid labile groups initially introduced during polymerization are introduced into the polymer.

For example, once a polymer is formed through radical polymerization of 4-ethoxyethoxystyrene and a monomer from which recurring units of formula (1) are derived according to the invention, the polymer may be converted into a copolymer with hydroxystyrene units by eliminating ethoxyethoxy groups from the polymer using formic acid, acetic acid, pyridinium tosylate or the like. The resultant copolymer may be used as a base resin in a negative resist composition. Alternatively, hydroxystyrene units in the resultant copolymer may be reacted with di-tert-butyl dicarbonate, tert-butyl chloroacetate, vinyl ethers or the like, whereby acid labile groups different from the acid labile groups (i.e., ethoxyethoxy groups) initially introduced during polymerization are introduced.

Resist Composition

The polymer of the invention is advantageously used as a base resin in a resist composition, and specifically a chemically amplified positive resist composition. Thus the invention provides a resist composition comprising the polymer, and especially a positive resist composition comprising the polymer. The positive resist composition preferably comprises:

(A) a base resin comprising the inventive polymer,
(C) an organic solvent, and optionally,
(B) an acid generator,
(D) a quencher, and
(E) a surfactant.

Also the polymer of the invention may be used as a base resin in a chemically amplified negative resist composition. The negative resist composition preferably comprises:

(A) a base resin comprising the inventive polymer,
(C) an organic solvent,
(H) a crosslinker for inducing crosslinkage under the action of an acid, and optionally,
(B) an acid generator,
(D) a quencher, and
(E) a surfactant.

For the positive resist composition, the base resin as component (A) may comprise another resin having a dissolution rate in an alkaline developer that increases under the action of an acid, if desired, as well as the inventive polymer. Exemplary other resins include, but are not limited to, (i) poly(meth)acrylic acid derivatives, (ii) norbornene derivative/maleic anhydride copolymers, (iii) hydrogenated products of ring-opening metathesis polymers (ROMP), (iv) vinyl ether/maleic anhydride/(meth)acrylic acid derivative copolymers, and (v) polyhydroxystyrene derivatives.

The hydrogenated products of ROMP (iii) are synthesized by the method illustrated in Examples of JP-A 2003-66612. Illustrative examples of such hydrogenated polymers include those polymers having the recurring units shown below, but are not limited thereto.

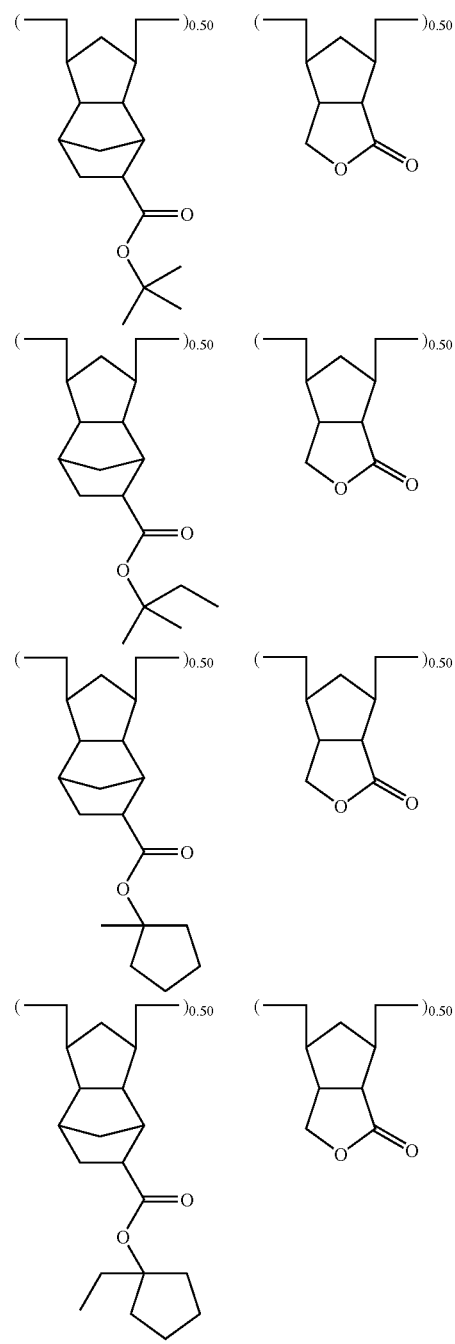

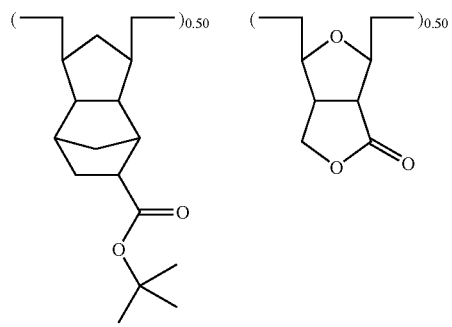
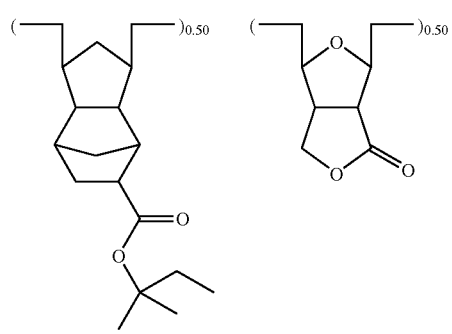
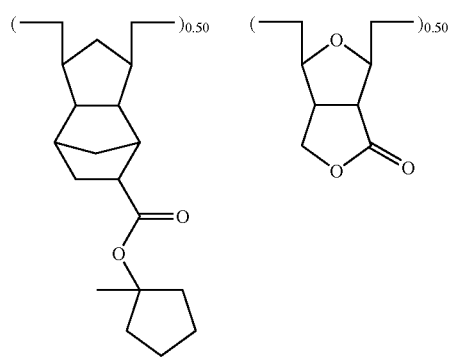
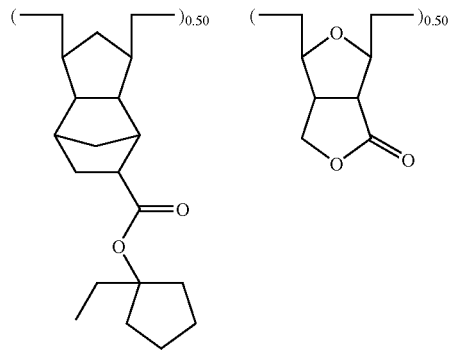
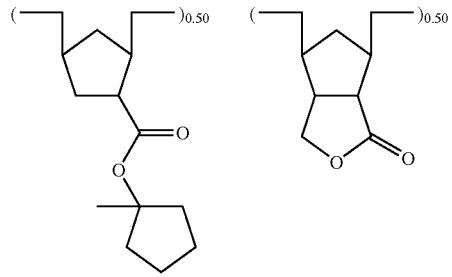
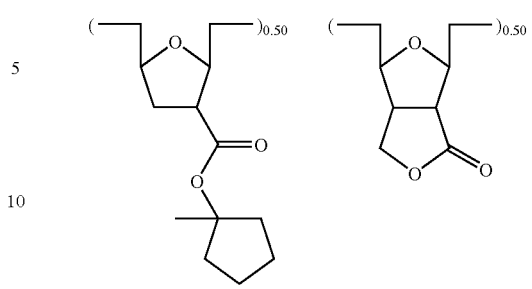
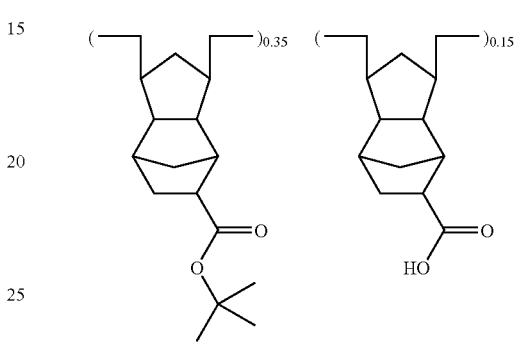
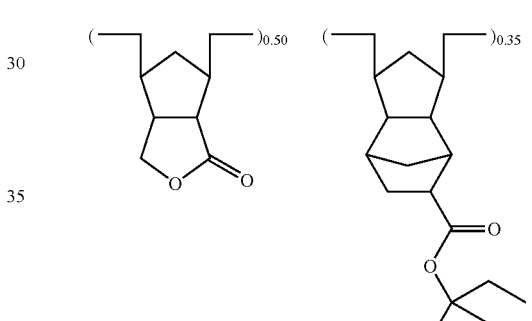
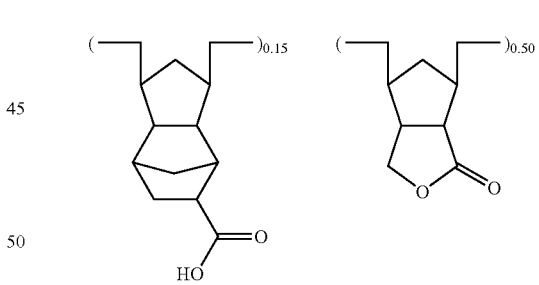
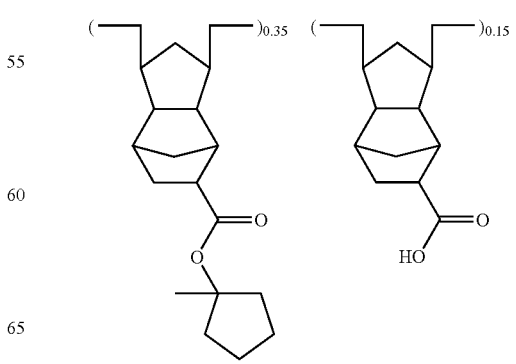

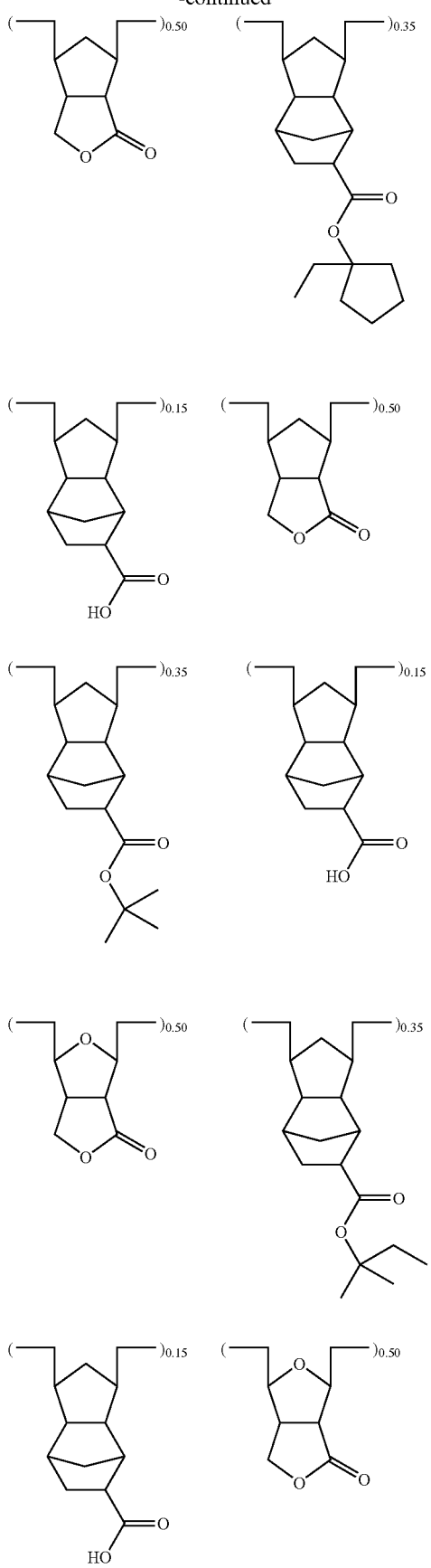
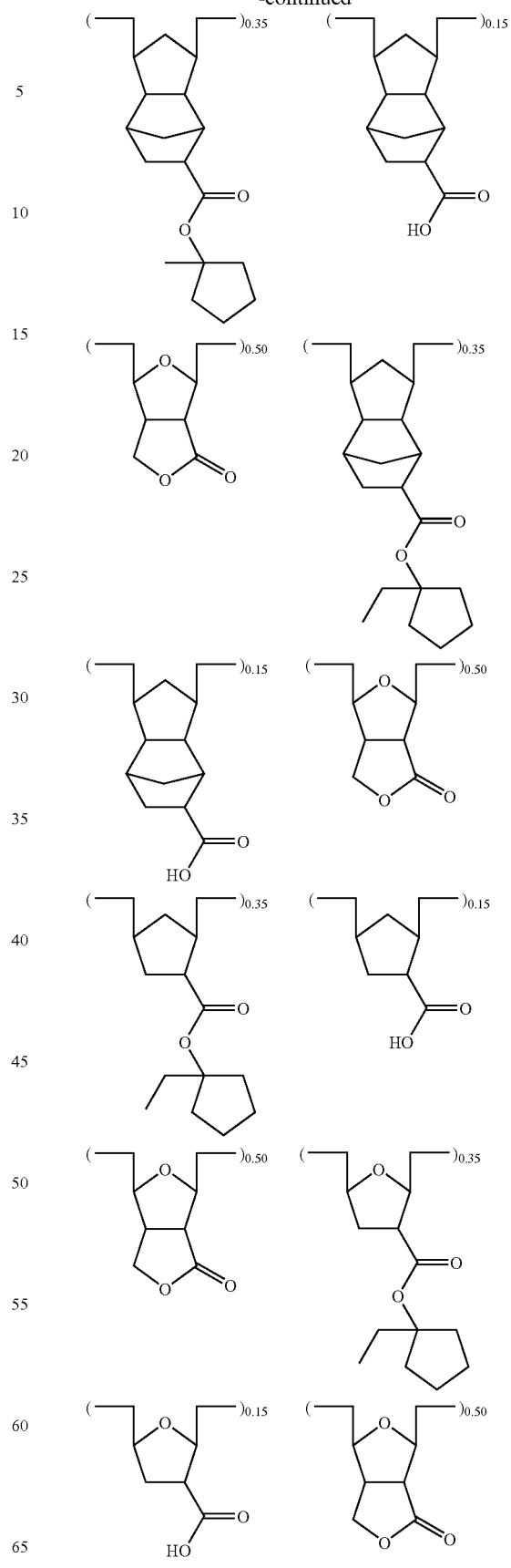

The inventive polymer and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer. The polymer is not limited to one type and a mixture of two or more polymers may be added. The use of plural polymers allows for easy adjustment of resist properties.

Photoacid Generator

In the practice of the invention, an acid generator is optionally used as component (B). Where a photoacid generator is added as the acid generator, it may be any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 4-methylphenyldiphenylsulfonium, 4-tert-butylphenyldiphenylsulfonium, bis(4-methylphenyl)phenylsulfonium, bis(4-tert-butylphenyl)phenylsulfonium, tris(4-methylphenyl)sulfonium, tris(4-tert-butylphenyl)sulfonium, tris(phenylmethyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium trinaphthylsulfonium, tribenzylsulfonium, diphenylmethylsulfonium, dimethylphenylsulfonium, 2-oxopropylthiacyclopentanium, 2-oxobutylthiacyclopentanium, 2-oxo-3,3-dimethylbutylthiacyclopentanium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonatei, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations include diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl) difluoromethanesulfonate, and 4-oxo-1-adamantyloxycarbonyldifluoromethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Iodonium salts based on combination of the foregoing examples are included.

Exemplary sulfonyldiazomethane compounds include bis-sulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(4-acetyloxyphenylsulfonyl)diazomethane, bis(4-(methanesulfonyloxy)phenylsulfonyl)diazomethane, bis(4-(p-toluenesulfonyloxy)phenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxyphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxydicarboxyimide photoacid generators include combinations of imide skeletons with sulfonates. Exemplary imide skeletons are succinimide, naphthalenedicarboxyimide, phthalimide, cyclohexyldicarboxyimide, 5-norbornene-2,3-dicarboxyimide, and 7-oxabicyclo[2.2.1]-5-heptene-2,3-dicarboxyimide. Exemplary sulfonates include trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl) difluoromethanesulfonate, and 4-oxo-1-adamantyloxycarbonyldifluoromethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucin, catechol, resorcinol, and hydroquinone, in which all the hydroxyl groups are substituted by trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2-trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl) difluoromethanesulfonate, 4-oxo-1-adamantyloxycarbonyldifluoromethanesulfonate, etc.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, heptafluoropropanesulfonate, nonafluorobutanesulfonate, tridecafluorohexanesulfonate, perfluoro(4-ethylcyclohexane)sulfonate, heptadecafluorooctanesulfonate, 2,2,2- trifluoroethanesulfonate, pentafluorobenzenesulfonate, 4-(trifluoromethyl)benzenesulfonate, 4-fluorobenzenesulfonate, mesitylenesulfonate, 2,4,6-triisopropylbenzenesulfonate, toluenesulfonate, benzenesulfonate, 4-(p-toluenesulfonyloxy)benzenesulfonate, 6-(p-toluenesulfonyloxy) naphthalene-2-sulfonate, 4-(p-toluenesulfonyloxy) naphthalene-1-sulfonate, 5-(p-toluenesulfonyloxy) naphthalene-1-sulfonate, 8-(p-toluenesulfonyloxy) naphthalene-1-sulfonate, naphthalenesulfonate, camphorsulfonate, octanesulfonate, dodecylbenzenesulfonate, butanesulfonate, methanesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[4.4.0.1$^{2,5}$.1$^{7,10}$]dodec-3-en-8-yl)ethanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl)difluoromethanesulfonate, 4-oxo-1-adamantyloxycarbonyldifluoromethanesulfonate, etc. Also useful are nitrobenzyl sulfonate analogues in which the nitro group on the benzyl side is substituted by a trifluoromethyl group.

Sulfone photoacid generators include bis(phenylsulfonyl) methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Suitable O-arylsulfonyloxime compounds and O-alkylsulfonyloxime compounds (oxime sulfonates) include photoacid generators in the form of glyoxime derivatives; photoacid generators in the form of oxime sulfonates with a long conjugated system separated by thiophene or cyclohexadiene: oxime sulfonates having an electron withdrawing group such as trifluoromethyl incorporated for increased stability; oxime sulfonates using phenylacetonitrile or substituted acetonitrile derivatives; and bisoxime sulfonates.

Glyoxime derivative photoacid generators include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedionedioxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(4-fluorobenzenesulfonyl)-α-dimethylglyoxime, bis-O-(4-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(4-fluorobenzenesulfonyl)-nioxime, bis-O-(4-(trifluoromethyl)benzenesulfonyl)-nioxime, and bis-O-(xylenesulfonyl)-nioxime. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Photoacid generators in the form of oxime sulfonates with a long conjugated system separated by thiophene or cyclohexadiene include
(5-(p-toluenesulfonyl)oxyimino-5H-thiophen-2-ylidene) phenylacetonitrile,
(5-(10-camphorsulfonyl)oxyimino-5H-thiophen-2-ylidene) phenylacetonitrile,
(5-n-octanesulfonyloxyimino-5H-thiophen-2-ylidene)phenylacetonitrile,
(5-(p-toluenesulfonyl)oxyimino-5H-thiophen-2-ylidene)(2-methylphenyl)acetonitrile,
(5-(10-camphorsulfonyl)oxyimino-5H-thiophen-2-ylidene) (2-methylphenyl)acetonitrile,
(5-n-octanesulfonyloxyimino-5H-thiophen-2-ylidene)(2-methylphenyl)acetonitrile,
(5-(4-(p-toluenesulfonyloxy)benzenesulfonyl)oxyimino-5H-thiophen-2-ylidene)phenylacetonitrile, and
(5-(2,5-bis(p-toluenesulfonyloxy)benzenesulfonyl)oxyimino-5H-thiophen-2-ylidene)phenylacetonitrile.
Also included are modified forms of the foregoing compounds having substituted on their skeleton
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-(1-adamantanecarbonyloxy)-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Suitable oxime sulfonates having an electron withdrawing group such as trifluoromethyl incorporated for increased stability include 2,2,2-trifluoro-1-phenyl-ethanone O-(methylsulfonyl)oxime, 2,2,2-trifluoro-1-phenyl-ethanone O-(10-camphorsulfonyl)oxime, 2,2,2-trifluoro-1-phenylethanone O-(4-methoxybenzenesulfonyl)oxime, 2,2,2-trifluoro-1-phenylethanone O-(1-naphthylsulfonyl)oxime, 2,2,2-trifluoro-1-phenylethanone O-(2-naphthylsulfonyl)oxime, 2,2,2-trifluoro-1-phenylethanone O-(2,4,6-trimethylphenylsulfonyl)oxime, 2,2,2-trifluoro-1-(4-methylphenyl)ethanone O-(10-camphorsulfonyl)oxime, 2,2,2-trifluoro-1-(4-methylphenyl)ethanone O-(methylsulfonyl)oxime, 2,2,2-trifluoro-1-(2-methylphenyl)ethanone O-(10-camphorsulfonyl)oxime, 2,2,2-trifluoro-1-(2,4-dimethylphenyl)ethanone O-(10-camphorsulfonyl)oxime, 2,2,2-trifluoro-1-(2,4-dimethylphenyl)ethanone O-(1-naphthylsulfonyl)oxime, 2,2,2-trifluoro-1-(2,4-dimethylphenyl)-ethanone O-(2-naphthylsulfonyl)oxime, 2,2,2-trifluoro-1-(2,4,6-trimethylphenyl)ethanone O-(10-camphorsulfonyl)oxime, 2,2,2-trifluoro-1-(2,4,6-trimethylphenyl)ethanone O-(1-naphthylsulfonyl)oxime, 2,2,2-trifluoro-1-(2,4,6-trimethylphenyl)ethanone O-(2-naphthylsulfonyl)oxime, 2,2,2-trifluoro-1-(4-methoxyphenyl)ethanone O-(methylsulfonyl)oxime, 2,2,2-trifluoro-1-(4-methylthiophenyl)ethanone O-(methylsulfonyl)oxime, 2,2,2-trifluoro-1-(3,4-dimethoxyphenyl)ethanone O-(methylsulfonyl)oxime, 2,2,2-trifluoro-1-(4-methoxyphenyl)ethanone O-(4-methylphenylsulfonyl)oxime, 2,2,2-trifluoro-1-(4-methoxyphenyl)ethanone O-(4-methoxyphenylsulfonyl)oxime, 2,2,2-trifluoro-1-(4-methoxyphenyl)ethanone O-(4-dodecylphenylsulfonyl)oxime, 2,2,2-trifluoro-1-(4-methoxyphenyl)ethanone O-(octylsulfonyl)oxime, 2,2,2-trifluoro-1-(4-thiomethylphenyl)ethanone O-(4-methoxyphenylsulfonyl)oxime, 2,2,2-trifluoro-1-(4-thiomethylphenyl)ethanone O-(4-dodecylphenylsulfonyl)oxime, 2,2,2-trifluoro-1-(4-thiomethylphenyl)ethanone O-(octylsulfonyl)oxime, 2,2,2-trifluoro-1-(4-thiomethylphenyl)ethanone O-(2-naphthylsulfonyl)oxime, 2,2,2-trifluoro-1-(2-methylphenyl)ethanone O-(methylsulfonyl)oxime, 2,2,2-trifluoro-1-(4-methylphenyl)ethanone O-(phenylsulfonyl)oxime, 2,2,2-trifluoro-1-(4-chlorophenyl)ethanone O-(phenylsulfonyl)oxime, 2,2,3,3,4,4,4-heptafluoro-1-phenylbutanone O-(10-camphorsulfonyl)oxime, 2,2,2-trifluoro-1-(1-naphthyl)ethanone O-(methylsulfonyl)oxime, 2,2,2-trifluoro-1-(2-naphthyl)ethanone O-(methylsulfonyl)oxime, 2,2,2-trifluoro-1-(4-benzylphenyl)ethanone O-(methylsulfonyl)oxime, 2,2,2-trifluoro-1-(4-(phenyl-1,4-dioxa-but-1-yl)phenyl)ethanone O-(methylsulfonyl)oxime, 2,2,2-trifluoro-1-(1-naphthyl)ethanone O-(propylsulfonyl)oxime, 2,2,2-trifluoro-1-(2-naphthyl)ethanone O-(propylsulfonyl)oxime, 2,2,2-trifluoro-1-(4-benzylphenyl)ethanone O-(propylsulfonyl)oxime, 2,2,2-trifluoro-1-(4-methylsulfonylphenyl)ethanone O-(propylsulfonyl)oxime, 2,2,2-trifluoro-1-(4-methylsulfonyloxyphenyl)ethanone O-(propylsulfonyl)oxime, 2,2,2-trifluoro-1-(4-methoxycarbonylmethoxyphenyl)ethanone O-(propylsulfonyl)oxime, 2,2,2-trifluoro-1-(6H,7H-5,8-dioxonaphth-2-yl)ethanone O-(propylsulfonyl)oxime, 2,2,2-trifluoro-1-(4-methoxycarbonylmethoxyphenyl)ethanone O-(propylsulfonyl)oxime, 2,2,2-trifluoro-1-(4-methoxycarbonyl)-(4-amino-1-oxa-pent-1-yl)phenyl)ethanone O-(propylsulfonyl)oxime, 2,2,2-trifluoro-1-(3,5-dimethyl-4-ethoxyphenyl)ethanone O-(propylsulfonyl)oxime, 2,2,2-trifluoro-1-(4-benzyloxyphenyl)ethanone O-(propylsulfonyl)oxime, 2,2,2-trifluoro-1-(2-thiophenyl)ethanone O-(propylsulfonate)oxime, and 2,2,2-trifluoro-1-(1-dioxathiophen-2-yl)ethanone O-(propylsulfonate)oxime; 2,2,2-trifluoro-1-(4-(3-(4-(2,2,2-trifluoro-1-(trifluoromethanesulfonyloxyimino)ethyl)phenoxy)propoxy)phenyl)ethanone O-(trifluoromethanesulfonyl)oxime, 2,2,2-trifluoro-1-(4-(3-(4-(2,2,2-trifluoro-1-(1-propanesulfonyloxyimino)ethyl)phenoxy)propoxy)phenyl)ethanone O-(propylsulfonyl)oxime, 2,2,2-trifluoro-1-(4-(3-(4-(2,2,2-trifluoro-1-(1-butanesulfonyloxyimino)ethyl)phenoxy)propoxy)phenyl)ethanone O-(butylsulfonyl)oxime, 2,2,2-trifluoro-1-(4-(3-(4-(2,2,2-trifluoro-1-(4-(4-methylphenylsulfonyloxy)phenylsulfonyloxyimino)ethyl)phenoxy)propoxy)phenyl)ethanone O-(4-(4-methylphenylsulfonyloxy)phenylsulfonyl)oxime, and 2,2,2-trifluoro-1-(4-(3-(4-(2,2,2-trifluoro-1-(2,5-bis(4-methylphenylsulfonyloxy)benzenesulfonyloxy)phenylsulfonyloxyimino)ethyl)phenoxy)propoxy)phenyl)ethanone O-(2,5-bis(4-methylphenylsulfonyloxy)benzenesulfonyloxy)phenylsulfonyl)oxime. Also included are modified forms of the foregoing compounds having substituted on their skeleton 2-benzoyloxy-1,1,3,3,3-pentafluoropropane-sulfonate, 1,1,3,3,3-pentafluoro-2-(4-phenylbenzoyloxy)propane-sulfonate, 1,1,3,3,3-pentafluoro-2-pivaloyloxypropane-sulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Also included are oxime sulfonates having the formula (Ox-1):

wherein $R^{401}$ is a substituted or unsubstituted $C_1$-$C_{10}$ haloalkylsulfonyl or halobenzenesulfonyl group, $R^{402}$ is a $C_1$-$C_{11}$ haloalkyl group, and $Ar^{401}$ is a substituted or unsubstituted aromatic or hetero-aromatic group.

Examples include 2-[2,2,3,3,4,4,5,5-octafluoro-1-(nonafluorobutylsulfonyloxyimino)pentyl]fluorene, 2-[2,2,3,3,4,4-pentafluoro-1-(nonafluorobutylsulfonyloxyimino)butyl]fluorene, 2-[2,2,3,3,4,4,5,5,6,6-decafluoro-1-(nonafluorobutylsulfonyloxyimino)hexyl]fluorene, 2-[2,2,3, 3,4,4,5,5-octafluoro-1-(nonafluorobutylsulfonyloxyimino) pentyl]-4-biphenyl, 2-[2,2,3,3,4,4-pentafluoro-1-(nonafluorobutylsulfonyloxyimino)butyl]-4-biphenyl, and 2-[2,2,3,3,4,4,5,5,6,6-decafluoro-1-(nonafluorobutylsulfonyloxyimino)hexyl]-4-biphenyl. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1-1,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl) difluoromethanesulfonate, and 4-oxo-1-adamantyloxycarbonyldifluoromethanesulfonate.

Suitable oxime sulfonate acid generators using substituted acetonitrile derivatives include α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino) phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl)difluoromethanesulfonate, and 4-oxo-1-adamantyloxycarbonyldifluoromethanesulfonate.

Suitable bisoxime sulfonates include bis(α-(p-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(p-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylenediacetonitrile, etc. Also included are modified forms of the foregoing compounds having substituted on their skeleton 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-(1-adamantanecarbonyloxy)-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonte, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxy-carbonyl) difluoromethanesulfonate, and 4-oxo-1-adamantyloxycarbonyldifluoromethanesulfonate.

When the photoacid generator (B) is added to the KrF excimer laser resist composition, preference is given to sulfonium salts, bissulfonyldiazomethanes, N-sulfonyloxyimides and oxime-O-sulfonates. Illustrative preferred photoacid generators include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(p-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(p-toluenesulfonyloxy)benzenesulfonate, 4-tert-butylphenyldiphenylsulfonium camphorsulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl) diazomethane, bis(4-n-hexyloxyphenylsulfonyl) diazomethane, bis(2-methyl-4-n-hexyloxyphenylsulfonyl)

diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxy)phenylsulfonyldiazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, (5-(10-camphorsulfonyl)oxyimino-5H-thiophen-2-ylidene)(2-methylphenyl)acetonitrile, and (5-(p-toluenesulfonyl)oxyimino-5H-thiophen-2-ylidene)(2-methylphenyl)acetonitrile.

When the photoacid generator (B) is added to the ArF laser resist composition, preference is given to sulfonium salts and oxime-O-sulfonates. Illustrative preferred photoacid generators include triphenylsulfonium trifluoromethanesulfonate, triphenylsulfonium pentafluoroethanesulfonate, triphenylsulfonium heptafluoropropanesulfonate, triphenylsulfonium nonafluorobutanesulfonate, triphenylsulfonium tridecafluorohexanesulfonate, triphenylsulfonium heptadecafluorooctanesulfonate, triphenylsulfonium perfluoro(4-ethylcyclohexane)sulfonate, 4-methylphenyldiphenylsulfonium nonafluorobutanesulfonate, 2-oxo-2-phenylethylthiacyclopentanium nonafluorobutanesulfonate, 4-tert-butylphenyldiphenylsulfonium nonafluorobutanesulfonate, 4-tert-butylphenyldiphenylsulfonium perfluoro(4-ethylcyclohexane)sulfonate, 4-tert-butylphenyldiphenylsulfonium heptafluorooctanesulfonate, triphenylsulfonium 1,1-difluoro-2-naphthylethanesulfonate, triphenylsulfonium 1,1,2,2-tetrafluoro-2-(norbornan-2-yl)ethanesulfonate, triphenylsulfonium 2-benzoyloxy-1,1,3,3,3-pentafluoropropanesulfonate, triphenylsulfonium 1,1,3,3,3-pentafluoro-2-(pivaloyloxy)propanesulfonate, triphenylsulfonium 2-(cyclohexanecarbonyloxy)-1,1,3,3,3-pentafluoropropanesulfonate, triphenylsulfonium 2-(2-naphthoyloxy)-1,1,3,3,3-pentafluoropropanesulfonate; triphenylsulfonium 2-(1-adamantanecarbonyloxy)-1,1,3,3,3-pentafluoropropanesulfonate, triphenylsulfonium 2-hydroxy-1,1,3,3,3-pentafluoropropanesulfonate, triphenylsulfonium adamantanemethoxycarbonyldifluoromethanesulfonate, triphenylsulfonium 1-(3-hydroxymethyladamantane)methoxycarbonyldifluoromethanesulfonate, triphenylsulfonium methoxycarbonyldifluoromethanesulfonate, 4-tert-butylphenyldiphenylsulfonium 2-benzoyloxy-1,1,3,3,3-pentafluoropropanesulfonate, 4-tert-butylphenyldiphenylsulfonium 1,1,3,3,3-pentafluoro-2-(pivaloyloxy)propanesulfonate, 4-tert-butylphenyldiphenylsulfonium 2-(cyclohexanecarbonyloxy)-1,1,3,3,3-pentafluoropropanesulfonate, 4-tert-butylphenyldiphenylsulfonium 2-(2-naphthoyloxy)-1,1,3,3,3-pentafluoropropanesulfonate, 4-tert-butylphenyldiphenylsulfonium 2-(1-adamantanecarbonyloxy)-1,1,3,3,3-pentafluoropropanesulfonate, 4-tert-butylphenyldiphenylsulfonium 2-hydroxy-1,1,3,3,3-pentafluoropropanesulfonate, 4-tert-butylphenyldiphenylsulfonium adamantanemethoxycarbonyldifluoromethanesulfonate, 4-tert-butylphenyldiphenylsulfonium 1-(3-hydroxymethyladamantane)methoxycarbonyldifluoromethanesulfonate, 4-tert-butylphenyldiphenylsulfonium methoxycarbonyldifluoromethanesulfonate, 2-oxo-2-phenylethylthiacyclopentanium 2-benzoyloxy-1,1,3,3,3-pentafluoropropanesulfonate, 2-oxo-2-phenylethylthiacyclopentanium 2-cyclohexanecarbonyloxy-1,1,3,3,3-pentafluoropropanesulfonate, triphenylsulfonium perfluoro(1,3-propylenebissulfonyl)imide, triphenylsulfonium bis(pentafluoroethylsulfonyl)imide, 2-(2,2,3,3,4,4,5,5-octafluoro-1-(nonafluorobutylsulfonyloxyimino)pentyl)fluorene, 2-(2,2,3,3,4,4-pentafluoro-1-(nonafluorobutylsulfonyloxyimino)butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(2-(cyclohexanecarbonyloxy)-1,1,3,3-pentafluoropropanesulfonyloxyimino)pentyl)fluorene, 2-(2,2,3,3,4,4-pentafluoro-1-(2-(cyclohexanecarbonyloxy)-1,1,3,3,3-pentafluoropropanesulfonyloxyimino)butyl)fluorene, and 2-(2,2,3,3,4,4,5,5,6,6-decafluoro-1-(nonafluorobutylsulfonyloxyimino)hexyl)fluorene.

When the photoacid generator (B) is added to the ArF immersion lithography resist composition, preference is given to sulfonium salts and oxime-O-sulfonates. Illustrative preferred photoacid generators include triphenylsulfonium nonafluorobutanesulfonate, triphenylsulfonium tridecafluorohexanesulfonate, triphenylsulfonium heptadecafluorooctanesulfonate, triphenylsulfonium perfluoro(4-ethylcyclohexane)sulfonate, 4-methylphenyldiphenylsulfonium nonafluorobutanesulfonate, 2-oxo-2-phenylethylthiacyclopentanium nonafluorobutanesulfonate, 4-tert-butylphenyldiphenylsulfonium nonafluorobutanesulfonate, 4-tert-butylphenyldiphenylsulfonium perfluoro(4-ethylcyclohexane)sulfonate, 4-tert-butylphenyldiphenylsulfonium heptafluorooctanesulfonate, triphenylsulfonium 1,1-difluoro-2-naphthylethanesulfonate, triphenylsulfonium 1,1,2,2-tetrafluoro-2-(norbornan-2-yl)ethanesulfonate, triphenylsulfonium 2-benzoyloxy-1,1,3,3,3-pentafluoropropanesulfonate, triphenylsulfonium 1,1,3,3,3-pentafluoro-2-(pivaloyloxy)propanesulfonate, triphenylsulfonium 2-(cyclohexanecarbonyloxy)-1,1,3,3,3-pentafluoropropanesulfonate, triphenylsulfonium 2-(2-naphthoyloxy)-1,1,3,3,3-pentafluoropropanesulfonate, triphenylsulfonium 2-(1-adamantanecarbonyloxy)-1,1,3,3,3-pentafluoropropanesulfonate, triphenylsulfonium 2-hydroxy-1,1,3,3,3-pentafluoropropanesulfonate, triphenylsulfonium adamantanemethoxycarbonyldifluoromethanesulfonate, triphenylsulfonium 1-(3-hydroxymethyladamantane)methoxycarbonyldifluoromethanesulfonate, triphenylsulfonium methoxycarbonyldifluoromethanesulfonate, 4-tert-butylphenyldiphenylsulfonium 2-benzoyloxy-1,1,3,3,3-pentafluoropropanesulfonate, 4-tert-butylphenyldiphenylsulfonium 1,1,3,3,3-pentafluoro-2-(pivaloyloxy)propanesulfonate, 4-tert-butylphenyldiphenylsulfonium 2-(cyclohexanecarbonyloxy)-1,1,3,3,3-pentafluoropropanesulfonate, 4-tert-butylphenyldiphenylsulfonium 2-(2-naphthoyloxy)-1,1,3,3,3-pentafluoropropanesulfonate, 4-tert-butylphenyldiphenylsulfonium 2-(1-adamantanecarbonyloxy)-1,1,3,3,3-pentafluoropropanesulfonate, 4-tert-butylphenyldiphenylsulfonium 2-hydroxy-1,1,3,3,3-pentafluoropropanesulfonate, 4-tert-butylphenyldiphenylsulfonium adamantanemethoxycarbonyldifluoromethanesulfonate, 4-tert-butylphenyldiphenylsulfonium 1-(3-hydroxymethyladamantane)methoxycarbonyldifluoromethanesulfonate, 4-tert-butylphenyldiphenylsulfonium methoxycarbonyldifluoromethanesulfonate, 2-oxo-2-phenylethylthiacyclopentanium 2-benzoyloxy-1,1,3,3,3-pentafluoropropanesulfonate, 2-oxo-2-phenylethylthiacyclopentanium 2-cyclohexanecarbonyloxy-1,1,3,3,3-pentafluoropropanesulfonate, triphenylsulfonium perfluoro(1,3-propylenebissulfonyl)imide, triphenylsulfonium bis(pentafluoroethylsulfonyl)imide, 2-(2,2,3,3,4,4,5,5-octafluoro-1-(nonafluorobutylsulfonyloxyimino)pentyl)fluorene, 2-(2,2,3,3,4,4-pentafluoro-1-

(nonafluorobutylsulfonyloxyimino)butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(2-(cyclohexanecarbonyloxy)-1,1,3,3-pentafluoropropanesulfonyloxyimino)pentyl)fluorene, 2-(2,2,3,3,4,4-pentafluoro-1-(2-(cyclohexanecarbonyloxy)-1,1,3,3,3-pentafluoropropanesulfonyloxyimino)butyl)fluorene, and 2-(2,2,3,3,4,4,5,5,6,6-decafluoro-1-(nonafluorobutylsulfonyloxyimino)hexyl)fluorene.

Among others, those acid generators having the general formula (20) are more preferred.

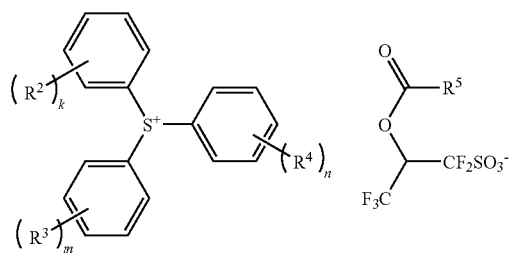
(20)

Herein, $R^2$ to $R^4$ are each independently straight, branched or cyclic $C_1$-$C_{10}$ alkyl or alkoxy, and preferably $C_1$-$C_6$ alkyl or alkoxy. Suitable alkyl groups of $R^2$ to $R^4$ include methyl, ethyl, n-propyl, isopropyl, n-butyl, sec-butyl, iso-butyl, tert-butyl, tert-amyl, n-pentyl, n-hexyl, cyclopentyl, and cyclohexyl, and suitable alkoxy groups include methoxy, ethoxy, n-propyloxy, isopropyloxy, n-butyloxy, sec-butyloxy, iso-butyloxy, tert-butyloxy, tert-amyloxy, n-pentyloxy, n-hexyloxy, cyclopentyloxy and cyclohexyloxy. $R^5$ is substituted or unsubstituted, straight, branched or cyclic $C_1$-$C_{30}$ alkyl or substituted or unsubstituted $C_6$-$C_{14}$ aryl. Exemplary alkyl groups of $R^5$ include methyl, ethyl, n-propyl, isopropyl, cyclopropyl, n-butyl, sec-butyl, iso-butyl, tert-butyl, n-pentyl, cyclopentyl, n-hexyl, cyclohexyl, n-octyl, n-decyl, n-dodecyl, 1-adamantyl, 2-adamantyl, and bicyclo[2.2.1]hepten-2-yl; and exemplary aryl groups include phenyl, 4-methoxyphenyl, 4-tert-butylphenyl, 4-biphenyl, 1-naphthyl, 2-naphthyl and 10-anthranyl. Also included are substituted forms of the foregoing in which some hydrogen atoms are substituted by halogen, alkyl, aryl, hydroxy, alkoxy, carboxy, alkoxycarbonyl, oxo, alkoxyalkyl, acyloxy, acyloxyalkyl or alkoxyalkoxy. In the groups of $R^5$, some —$CH_2$— may be replaced by —O—. The subscripts k, m and n are independently an integer of 0 to 3.

Examples of $R^5$ are given below, but not limited thereto.

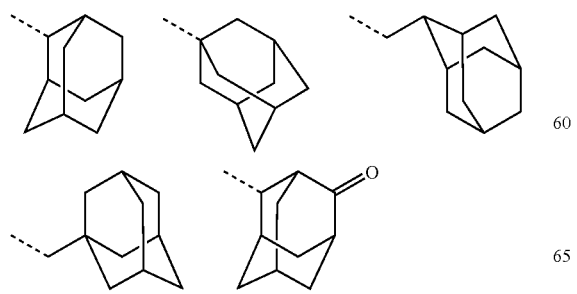

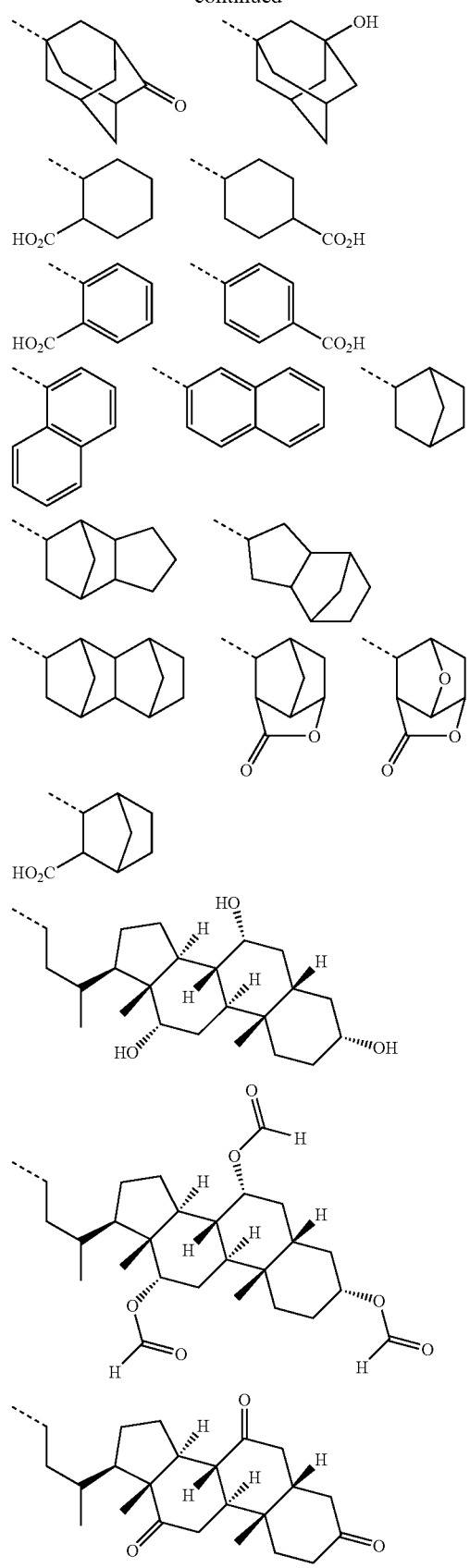

Examples of the acid generator having formula (20) are given below, but not limited thereto.
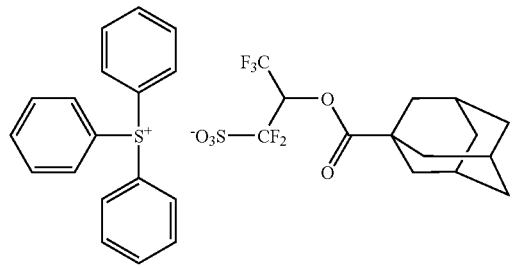
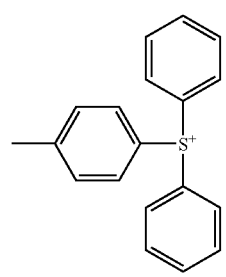
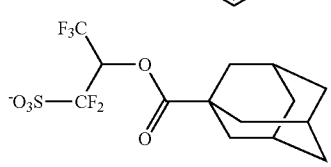
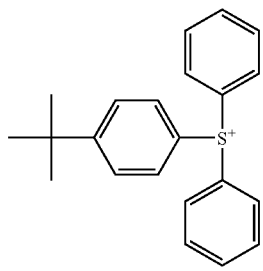
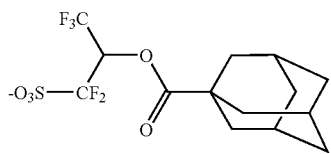
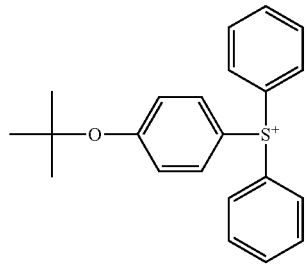
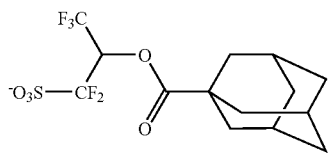
-continued
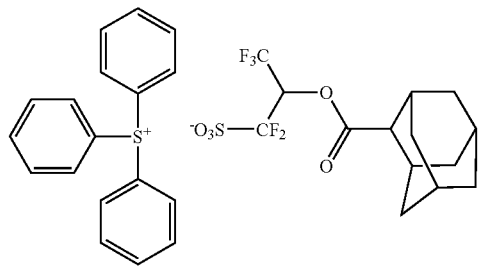
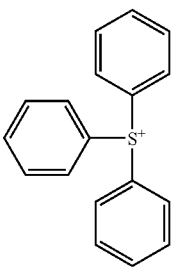
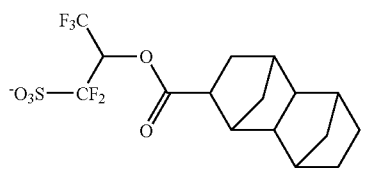
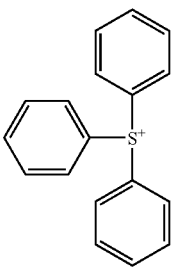
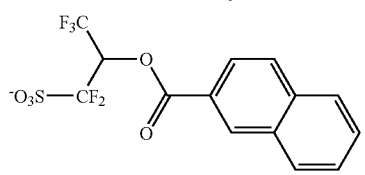
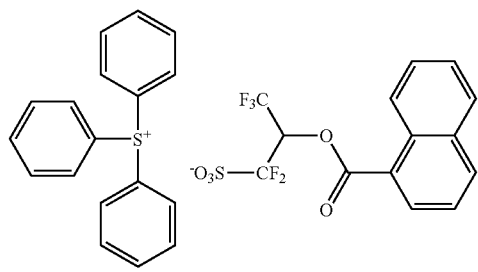
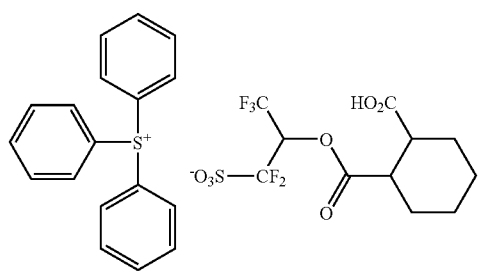

89
-continued
90
-continued
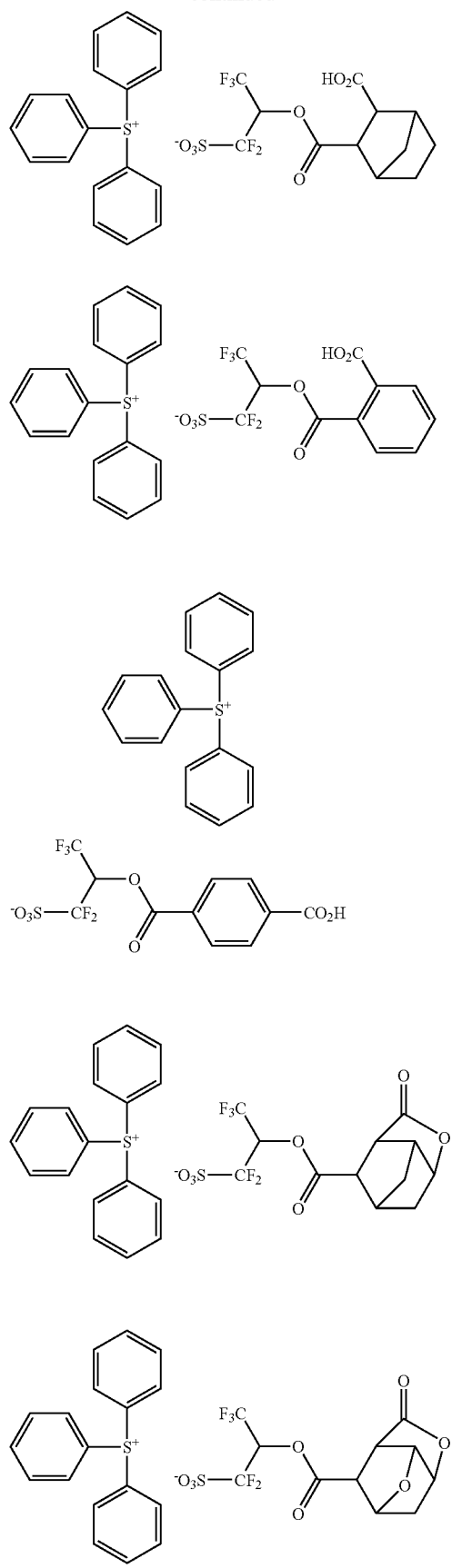
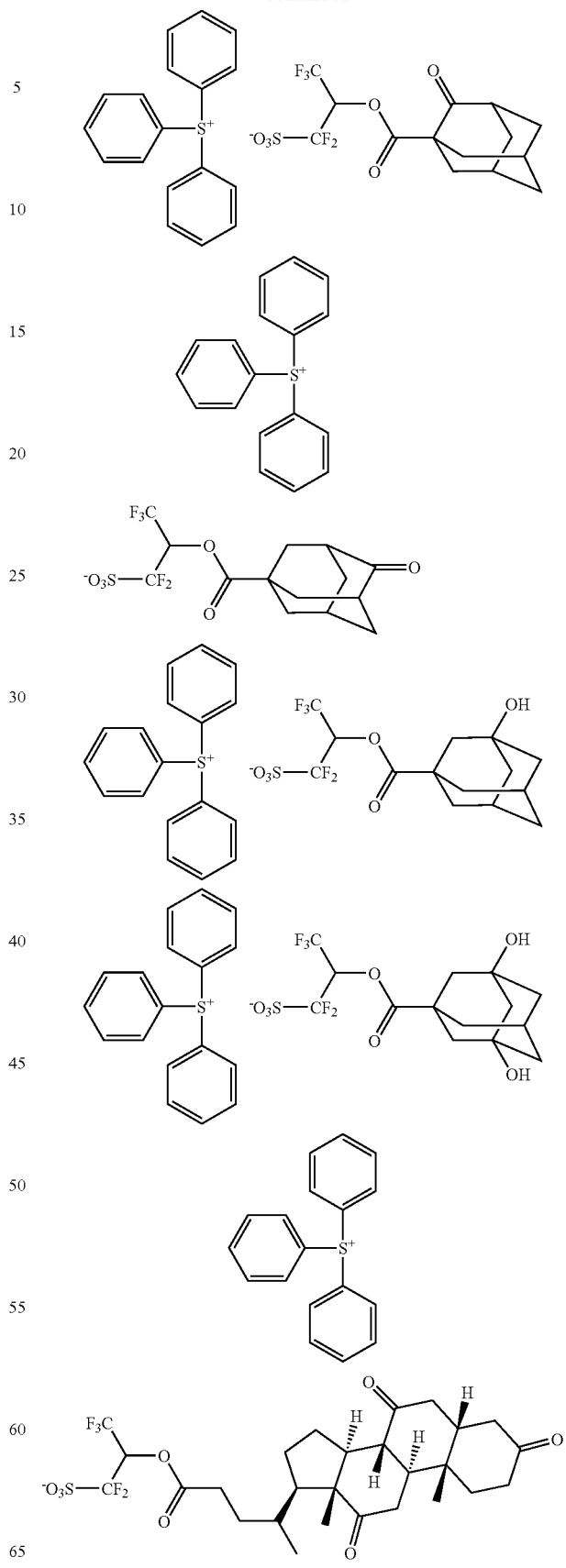

In the chemically amplified resist composition, the photoacid generator (B) may be added in any desired amount as long as the objects of the invention are not compromised. An appropriate amount of the photoacid generator (B) is 0.1 to 10 parts, and more preferably 0.1 to 5 parts by weight per 100 parts by weight of the base resin in the composition. Too high a proportion of the photoacid generator (B) may give rise to problems of degraded resolution and foreign matter upon development and resist film peeling. The photoacid generators may be used alone or in admixture of two or more. The transmittance of the resist film can be controlled by using an photoacid generator having a low transmittance at the exposure wavelength and adjusting the amount of the photoacid generator added.

It is noted that an acid diffusion controlling function may be provided when two or more photoacid generators are used in admixture provided that one photoacid generator is an onium salt capable of generating a weak acid. Specifically, in a system using the inventive polymer capable of generating a strong acid in combination with an onium salt capable of generating a weak acid (e.g., non-fluorinated sulfonic acid or carboxylic acid), if the strong acid generated from the inventive polymer upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If an onium salt capable of generating a strong acid and an onium salt capable of generating a weak acid are used in admixture, an exchange from the strong acid to the weak acid as above can take place, but it never happens that the weak acid collides with the unreacted onium salt capable of generating a strong acid to induce a salt exchange. This is because of a likelihood of an onium cation forming an ion pair with a stronger acid anion.

In the resist composition of the invention, there may be added a compound which is decomposed with an acid to generate another acid, that is, acid amplifier compound. For these compounds, reference should be made to J. Photopolym. Sci. and Tech., 8, 43-44, 45-46 (1995), and ibid., 9, 29-30 (1996). Examples of the acid amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition of the invention, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Organic Solvent

The organic solvent (C) used herein may be any organic solvent in which the base resin, acid generator, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is 200 to 1,000 parts, especially 400 to 800 parts by weight per 100 parts by weight of the base resin.

Quencher

A quencher (D) may be optionally used in the resist composition of the invention. The term "quencher" as used herein has a meaning generally known in the art and refers to a compound capable of suppressing the rate of diffusion when the acid generated by the acid generator diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). A typical nitrogen-containing compound with sulfonyl group is 3-pyridinesulfonic acid. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-tert-butoxycarbonyl-N,N-dicyclohexylamine, N-tert-butoxycarbonylbenzimidazole, and oxazolidinone.

Suitable ammonium salts include pyridinium p-toluenesulfonate, triethylammonium p-toluenesulfonate, trioctylammonium p-toluenesulfonate, triethylammonium 2,4,6-triisopropylbenzenesulfonate, trioctylammonium 2,4,6-triisopropylbenzenesulfonate, triethylammonium camphorsulfonate, trioctylammonium camphorsulfonate, tetramethylammonium hydroxide, tetraethylammonium hydroxide, tetrabutylammonium hydroxide, benzyltrimethylammonium hydroxide, tetramethylammonium p-toluenesulfonate, tetrabutylammonium p-toluenesulfonate, benzyltrimethylammonium p-toluenesulfonate, tetramethylammonium camphorsulfonate, tetrabutylammonium camphorsulfonate, benzyltrimethylammonium camphorsulfonate, tetramethylammonium 2,4,6-triisopropylbenzenesulfonate, tetrabutylammonium 2,4,6-triisopropylbenzenesulfonate, benzyltrimethylammonium 2,4,6-triisopropylbenzenesulfonate, tetramethylammonium acetate, tetrabutylammonium acetate, benzyltrimethylammonium acetate, tetramethylammonium benzoate, tetrabutylammonium benzoate, and benzyltrimethylammonium benzoate.

In addition, amine compounds of the following general formula (B)-1 may also be included alone or in admixture.

$$N(X)_n(Y)_{3-n} \quad \text{(B)-1}$$

In the formula, n is equal to 1, 2 or 3. The side chain X is independently selected from groups of the following general formulas (X)-1 to (X)-3. The side chain Y is independently hydrogen or a straight, branched or cyclic $C_1$-$C_{20}$ alkyl group in which some or all hydrogen atoms may be substituted by fluorine atoms and which may contain an ether or hydroxyl group. Two or three X may bond together to form a ring.

(X)-1

(X)-2

(X)-3

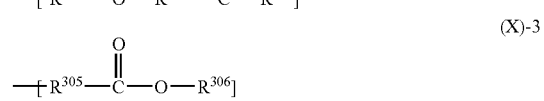

In the formulas, $R^{300}$, $R^{302}$ and $R^{305}$ are independently straight or branched $C_1$-$C_4$ alkylene groups; $R^{301}$ and $R^{304}$ are independently hydrogen or straight, branched or cyclic $C_1$-$C_{20}$ alkyl groups in which some or all hydrogen atoms may be substituted by fluorine atoms and which may contain at least one hydroxyl group, ether group, ester group or lactone ring; $R^{303}$ is a single bond or a straight or branched $C_1$-$C_4$ alkylene group; $R^{306}$ is a straight, branched or cyclic $C_1$-$C_{20}$ alkyl group in which some or all hydrogen atoms may be substituted by fluorine atoms and which may contain at least one hydroxyl group, ether group, ester group or lactone ring.

Illustrative examples of the compounds of formula (B)-1 include, but are not limited to, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing amine compounds having the following general formula (B)-2.

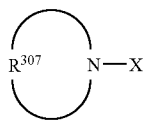

(B)-2

Herein X is as defined above, and $R^{307}$ is a straight or branched $C_2$-$C_{20}$ alkylene group in which some or all hydrogen atoms may be substituted by fluorine atoms and which may contain one or more carbonyl, ether, ester or sulfide groups.

Illustrative examples of the cyclic structure-bearing amine compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-[2-(2-methoxyethoxy)ethoxy]ethylmorpholine, 2-[2-(2-butoxyethoxy)ethoxy]ethylmorpholine, 2-{2-[2-(2-methoxyethoxy)ethoxy]ethoxy}ethylmorpholine, 2-{2-[2-(2-butoxyethoxy)ethoxy]ethoxy}ethylmorpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, and 2-morpholinoethyl adamantanecarboxylate.

Also, one or more of cyano-bearing amine compounds having the following general formulae (B)-3 to (B)-6 may be added.

(B)-3

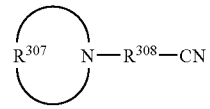

(B)-4

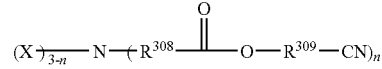

(B)-5

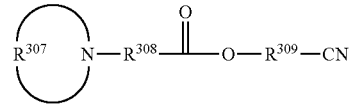

(B)-6

Herein, X, $R^{307}$ and n are as defined in formula (B)-1, and $R^{308}$ and $R^{309}$ each are independently a straight or branched $C_1$-$C_4$ alkylene group.

Illustrative examples of the cyano-bearing amine compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are amine compounds having an imidazole structure and a polar functional group, represented by the general formula (B)-7.

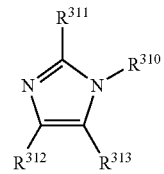

(B)-7

Herein, $R^{310}$ is a straight, branched or cyclic $C_2$-$C_{20}$ alkyl group in which some or all hydrogen atoms may be substituted by fluorine atoms and which has one or more polar functional groups. The polar functional group is selected from among hydroxyl, carbonyl, ester, ether, sulfide, carbonate, cyano and acetal groups and mixtures thereof. $R^{311}$, $R^{312}$ and $R^{313}$ are each independently a hydrogen atom, a straight, branched or cyclic $C_1$-$C_{10}$ alkyl group, aryl group or aralkyl group.

Also included are amine compounds having a benzimidazole structure and a polar functional group, represented by the general formula (B)-8.

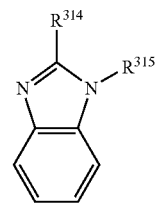

(B)-8

Herein, $R^{314}$ is hydrogen, a straight, branched or cyclic $C_1$-$C_{10}$ alkyl group, aryl group or aralkyl group. $R^{315}$ is a straight, branched or cyclic $C_1$-$C_{20}$ alkyl group in which some or all hydrogen atoms may be substituted by fluorine atoms and which has one or more polar functional groups. The alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

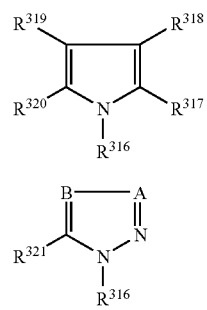

(B)-9

(B)-10

Herein, A is a nitrogen atom or $=C-R^{322}$. B is a nitrogen atom or $=C-R^{323}$. $R^{316}$ is a straight, branched or cyclic $C_2$-$C_{20}$ alkyl group in which some or all hydrogen atoms may be substituted by fluorine atoms and which has one or more polar functional groups, the polar functional group being selected from among hydroxyl, carbonyl, ester, ether, sulfide, carbonate, cyano and acetal groups and mixtures thereof. $R^{317}$, $R^{318}$, $R^{319}$ and $R^{320}$ are each independently hydrogen, a straight, branched or cyclic $C_1$-$C_{10}$ alkyl group or aryl group, or a pair of $R^{317}$ and $R^{318}$ and a pair of $R^{319}$ and $R^{320}$, taken together, may form a benzene, naphthalene or pyridine ring with the carbon atoms to which they are attached. $R^{321}$ is a hydrogen atom, a straight, branched or cyclic $C_1$-$C_{10}$ alkyl group or aryl group. $R^{322}$ and $R^{323}$ each are hydrogen, a straight, branched or cyclic $C_1$-$C_{10}$ alkyl group or aryl group, or a pair of $R^{321}$ and $R^{323}$, taken together, may form a benzene or naphthalene ring with the carbon atoms to which they are attached.

Also included are organic nitrogen-containing compounds having an aromatic carboxylic acid ester structure, represented by the general formulae (B)-11 to (B)-14.

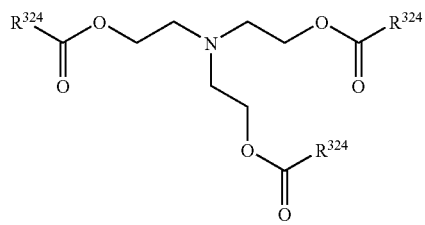
(B)-11

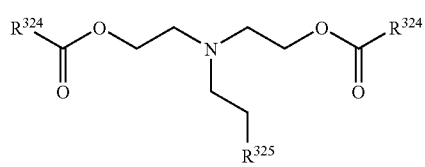
(B)-12

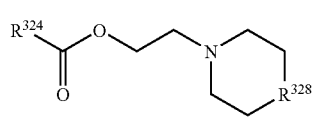
(B)-13

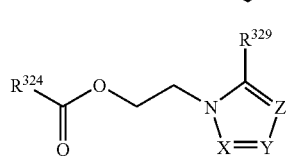
(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_n$—group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring with the carbon atoms to which they are attached.

Further included are amine compounds of 7-oxanorbornane-2-carboxylic ester structure, represented by the general formula (B)-15.

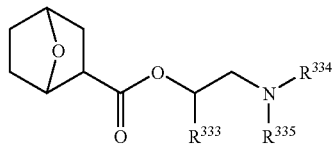
(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms with the nitrogen atom to which they are attached.

The quencher is preferably formulated in an amount of 0.001 to 2 parts, and especially 0.01 to 1 part by weight, per 100 parts by weight of the base resin. Less than 0.001 phr of the quencher may achieve no addition effect whereas more than 2 phr may lead to too low a sensitivity.

Surfactant

Optionally, the resist composition of the invention may further comprise (E) a surfactant which is commonly used for improving the coating characteristics. The surfactant may be added in conventional amounts so long as this does not compromise the objects of the invention.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08 and R30 (Dai-Nippon Ink & Chemicals, Inc.), Fluorad FC430, FC431, FC-4430 and FC-4432 (Sumitomo 3M Co., Ltd.), Asahiguard AG710, Surflon S-381, S-382, SC101, SC102, SC103, SC104, SC105, SC106, KH-10, KH-20, KH-30 and KH-40 (Asahi Glass Co., Ltd.), and Surfynol E1004 (Nisshin Chemical Industry Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

In the chemically amplified resist composition of the invention, the surfactant is preferably added in an amount of up to 2 parts, and especially up to 1 part by weight, per 100 parts by weight of the base resin.

In one embodiment of the invention wherein the resist composition is used in immersion lithography using water, especially in the absence of a resist protective coating, a surfactant may be added to the resist composition, the surfactant having a function to segregate at the resist surface after spin coating to prevent or reduce water penetration or leaching. This surfactant is a polymeric surfactant which is insoluble in water and soluble in an alkaline developer, and preferably is highly water repellent and improves water slippage. Exemplary polymeric surfactants are those comprising monomeric units represented by the following formula.

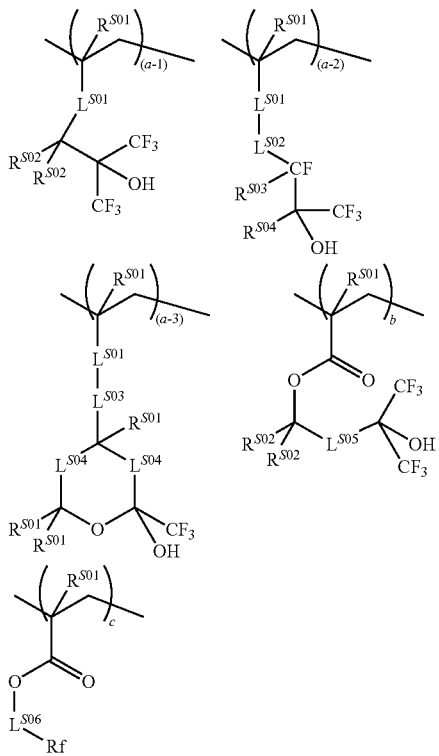

In the above formula, $L^{S01}$ is each independently —C(=O)—O—, —O—, or —C(=O)-$L^{S07}$-C(=O)—O— wherein $L^{S07}$ is a straight, branched or cyclic $C_1$-$C_{10}$ alkylene group; $R^{S01}$ is each independently hydrogen, fluorine, methyl or trifluoromethyl; $R^{S02}$ is each independently hydrogen or a straight, branched or cyclic $C_1$-$C_{20}$ alkyl or fluoroalkyl group, or plural $R^{S02}$ in a common recurring unit may bond together to form a ring with the carbon atom to which they are attached, and in this case, they collectively stand for a straight, branched or cyclic alkylene or fluoroalkylene group having 2 to 20 carbon atoms in total.

$R^{S03}$ is fluorine or hydrogen, or $R^{S03}$ may bond with $L^{S02}$ in a common recurring unit to form a non-aromatic ring having 3 to 10 carbon atoms in total with the carbon atom to which they are attached.

$L^{S02}$ is a straight, branched or cyclic $C_1$-$C_6$ alkylene group in which one or more hydrogen atoms may be replaced by fluorine atoms.

$R^{S04}$ is a straight or branched $C_1$-$C_{10}$ alkyl group in which one or more hydrogen atoms are replaced by fluorine atoms, or $L^{S02}$ and $R^{S04}$ may bond together to form a non-aromatic ring with the carbon atoms to which they are attached, and in this case, they collectively stand for a trivalent organic group having 2 to 12 carbon atoms in total.

$L^{S03}$ is a single bond or a $C_1$-$C_4$ alkylene group. $L^{S04}$ is each independently a single bond, —O— or —$CR^{S02}R^{S01}$—.

$L^{S05}$ is a straight or branched $C_1$-$C_4$ alkylene group, or $L^{S05}$ may bond with $R^{S02}$ within a common recurring unit to form a non-aromatic ring having 3 to 10 carbon atoms in total with the carbon atom to which they are attached.

$L^{S06}$ is methylene, 1,2-ethylene, 1,3-propylene or 1,4-butylene. Rf is a straight perfluoroalkyl group of 3 to 6 carbon atoms, or 3H-perfluoropropyl, 4H-perfluorobutyl, 5H-perfluoropentyl or 6H-perfluorohexyl.

The subscripts are numbers in the range: $0 \leq (a-1)<1$, $0 \leq (a-2)<1$, $0 \leq (a-3) \leq 1$, $0<(a-1)+(a-2)+(a-3)<1$, $0 \leq b<1$, $0 \leq c<1$, and $0<(a-1)+(a-2)+(a-3)+b+c \leq 1$.

In the resist composition, the polymeric surfactant is preferably added in an amount of 0.001 to 20 parts, and more preferably 0.01 to 10 parts by weight, per 100 parts by weight of the base resin. With respect to the polymeric surfactant, reference should be made to JP-A 2007-297590.

In an embodiment wherein the inventive polymer is used in a chemically amplified negative resist composition, the polymer must comprise recurring units having substituent groups capable of forming a crosslinked structure with the aid of an acid crosslinker, as well as the recurring units having formula (1). Specifically, suitable units include recurring units derived from acrylic acid, methacrylic acid, hydroxystyrene (any site available for substitution), and hydroxyvinylnaphthalene (any site available for substitution), but are not limited thereto.

Besides the polymer described above, an alkali-soluble resin may be added. Suitable resins include, but are not limited to, poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated p-hydroxystyrene copolymers, p-hydroxystyrene/α-methyl-p-hydroxystyrene copolymers, p-hydroxystyrene/α-methylstyrene copolymers, p-hydroxystyrene/styrene copolymers, p-hydroxystyrene/m-hydroxystyrene copolymers, p-hydroxystyrene/styrene copolymers, p-hydroxystyrene/acrylic acid copolymers, p-hydroxystyrene/methacrylic acid copolymers, p-hydroxystyrene/methyl acrylate copolymers, p-hydroxystyrene/acrylic acid/methyl methacrylate copolymers, p-hydroxystyrene/methyl acrylate copolymers, p-hydroxystyrene/methacrylic acid/methyl methacrylate copolymers, polymethacrylic acid, polyacrylic acid, acrylic acid/methyl acrylate copolymers, methacrylic acid/methyl methacrylate copolymers, acrylic acid/maleimide copolymers, methacrylic acid/maleimide copolymers, p-hydroxystyrene/acrylic acid/maleimide copolymers, and p-hydroxystyrene/methacrylic acid/maleimide copolymers.

The inventive polymer and the other alkali-soluble resin are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The alkali-soluble resin is not limited to one type and a mixture of two or more other polymers may be added. The use of plural polymers allows for easy adjustment of resist properties.

Crosslinker

Component (H) is an acid crosslinker capable of forming a crosslinked structure under the action of an acid. Typical crosslinkers are compounds having at least two hydroxymethyl, alkoxymethyl, epoxy or vinyl ether groups within a molecule. Substituted glycoluril derivatives, urea derivatives, and hexa(methoxymethyl)melamine compounds are suitable as the crosslinker in chemically amplified negative resist compositions. Examples include N,N,N',N'-tetramethoxymethylurea, hexamethoxymethylmelamine, tetraalkoxymethyl-substituted glycoluril compounds such as tetrahydroxymethyl-substituted glycoluril and tetramethoxymethylglycoluril, and condensates of phenolic compounds such as substituted or unsubstituted bis(hydroxymethylphenol) compounds and bisphenol A with epichlorohydrin. Especially preferred crosslinkers are 1,3,5,7-tetraalkoxymethylglycolurils such as 1,3,5,7-tetramethoxymethylglycoluril, 1,3,5,7-tetrahydroxymethylglycoluril, 2,6-dihydroxymethyl-p-cresol, 2,6-dihydroxymethylphenol, 2,2',6,6'-tetrahydroxymethylbisphenol A, 1,4-bis[2-(2-hydroxypropyl)]benzene, N,N,N',N'-tetramethoxymethylurea, and hexamethoxymethylmelamine.

In the chemically amplified resist composition, an appropriate amount of acid crosslinker (H) is, though not limited thereto, 1 to 20 parts, and especially 5 to 15 parts by weight per 100 parts by weight of the base resin. The crosslinkers may be used alone or in admixture of two or more.

While the resist composition of the invention typically comprises a polymer or base resin, acid generator, organic solvent and quencher as described above, there may be added optional other ingredients such as dissolution inhibitors, acidic compounds, stabilizers, and dyes. Optional ingredients may be added in conventional amounts so long as this does not compromise the objects of the invention.

Process

Pattern formation using the resist composition of the invention may be performed by well-known lithography processes. The process generally involves coating, heat treatment (or prebaking), exposure, heat treatment (post-exposure baking, PEB), and development. If necessary, any additional steps may be added.

For pattern formation, the resist composition is first applied onto a substrate (on which an integrated circuit is to be formed, e.g., Si, $SiO_2$, SiN, SiON, TiN, WSi, BPSG, SOG, organic antireflective coating, Cr, CrO, CrON, MoSi, etc.) by a suitable coating technique such as spin coating, roll coating, flow coating, dip coating, spray coating or doctor coating. The coating is prebaked on a hot plate at a temperature of 50 to 150° C. for 1 to 10 minutes, preferably 60 to 140° C. for 1 to 5 minutes. The resulting resist film is generally 0.01 to 2.0 µm thick.

A relationship of a reduced thickness of resist film to an etch selectivity ratio between resist film and processable substrate imposes severer limits on the process. Under consideration is the tri-layer process in which a resist layer, a silicon-containing intermediate layer, an undercoat layer having a high carbon density and high etch resistance, and a processable substrate are laminated in sequence from top to bottom. On etching with oxygen gas, hydrogen gas, ammonia gas or the like, a high etch selectivity ratio is available between the silicon-containing intermediate layer and the undercoat layer, which allows for thickness reduction of the silicon-containing intermediate layer. A relatively high etch selectivity ratio is also available between the monolayer resist and the silicon-containing intermediate layer, which allows for thickness reduction of the monolayer resist. The method for forming the undercoat layer in this case includes a coating and baking method and a CVD method. In the case of coating, novolac resins and resins obtained by polymerization of fused ring-containing olefins are used. In the CVD film formation, reactant gases such as butane, ethane, propane, ethylene and acetylene are used. For the silicon-containing intermediate layer, either a coating method or a CVD method may be employed. The coating method uses silsesquioxane, polyhedral oligomeric silsesquioxane (POSS) and the like while the CVD method uses silane gases as the reactant. The silicon-containing intermediate layer may have an antireflection function with a light absorbing ability and have photo-absorptive groups like phenyl groups, or it may be a SiON film. An organic film may be formed between the silicon-containing intermediate layer and the photoresist, and the organic film in this case may be an organic antireflective coating. After the photoresist film is formed, deionized water rinsing (or post-soaking) may be carried out for extracting the photoacid generator and the like from the film surface or washing away particles, or a protective film may be coated.

With a mask having a desired pattern placed above the resist film, the resist film is then exposed to radiation such as UV, deep-UV, electron beam, x-ray, excimer laser light, γ-ray and synchrotron radiation. The exposure dose is preferably about 1 to 200 $mJ/cm^2$, more preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB). Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate. It is appreciated that the resist composition of the invention is suited for nano-scale patterning using such high-energy radiation as deep UV with a wavelength of 254 to 193 nm, vacuum UV with a wavelength of 157 nm, electron beam, soft x-ray, x-ray, excimer laser light, γ-ray and synchrotron radiation, and best suited for nano-scale patterning using high-energy radiation in the wavelength range of 180 to 200 nm.

Immersion lithography can be applied to the resist composition of the invention. The ArF immersion lithography uses a liquid having a refractive index of at least 1 and highly transparent at the exposure wavelength such as deionized water or alkanes as the immersion solvent. The immersion lithography involves prebaking a resist film and exposing the resist film to light through a projection lens, with deionized water or similar liquid interposed between the resist film and the projection lens. Since this allows projection lenses to be designed to a numerical aperture (NA) of 1.0 or higher, formation of finer size patterns is possible. The immersion lithography is important for the ArF lithography to survive to the 45-nm node, with a further development thereof being accelerated. In the case of immersion lithography, deionized water rinsing (or post-soaking) may be carried out after exposure for removing water droplets left on the resist film, or a protective coating may be applied onto the resist film after pre-baking, for preventing any leach-out from the resist and improving water slip on the film surface. The resist protective coating used in the immersion lithography is preferably formed from a solution of a polymer having 1,1,1,3,3,3-hexafluoro-2-propanol residue which is insoluble in water, but soluble in an alkaline developer liquid, in a solvent selected from alcohols of at least 4 carbon atoms, ethers of 8 to 12 carbon atoms, and mixtures thereof.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material.

The resist composition of the invention is applicable to immersion lithography using a high refractive index liquid.

The process that now draws attention as the technology for extending the life of the ArF lithography is a double patterning process involving a first set of exposure and development to form a first pattern and a second set of exposure and development to form a second pattern between features of the first pattern. See Proc. SPIE, Vol. 5754, p 1508 (2005). A number of double patterning processes have been proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings. One method that proceeds with a single etching is by using a negative resist material in a first exposure and a positive resist material in a second exposure. Another method is by using a positive resist material in a first exposure and a negative resist material in a higher alcohol of 4 or more carbon atoms, in which the positive resist material is not dissolvable, in a second exposure. However, these methods using negative resist materials with low resolution entail degradation of resolution.

If first exposure is followed by second exposure at a half-pitch shifted position, the optical energy of second exposure offsets the optical energy of first exposure so that the contrast becomes zero. If a contrast enhancement layer (CEL) is formed on the resist film, the incident light to the resist film becomes nonlinear so that the first and second exposures do not offset each other. Thus an image having a half pitch is formed. See Jpn. J. Appl. Phy. Vol. 33 (1994) p 6874-6877. It is expected that similar effects are produced by using an acid generator capable of two photon absorption to provide a nonlinear contrast.

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

Now under investigation is the resist pattern freezing technology involving forming a first resist pattern on a substrate, taking any suitable means for insolubilizing the resist pattern with respect to the resist solvent and alkaline developer, applying a second resist thereon, and forming a second resist pattern in space portions of the first resist pattern. With this freezing technology, etching of the substrate is required only once, leading to improved throughputs and avoiding the problem of misregistration due to stress relaxation of the hard mask during etching. In the freezing technology, development efforts are focused on the step of forming a resist film on the first resist pattern and the optical or thermal step of insolubilizing the resist pattern. The resist composition of the invention is also applicable to such a process. Examples of light used for the freezing purpose include preferably light with a wavelength of up to 300 nm, more preferably up to 200 nm, specifically ArF excimer light of wavelength 193 nm, $Xe_2$ excimer light of 172 nm, $F_2$ excimer light of 157 nm, $Kr_2$ excimer light of 146 nm, and $Ar_2$ excimer light of 126 nm, and the exposure dose in the case of light is preferably in the range of 10 $mJ/cm^2$ to 10 $J/cm^2$. Irradiation from an excimer laser of sub-200 nm wavelength, especially 193 nm, 172 nm, 157 nm, 146 nm, and 122 nm, or an excimer lamp not only causes the photoacid generator to generate an acid, but also promotes photo-induced crosslinking reaction. In a further example where a thermal acid generator in the form of an ammonium salt is added to a photoresist composition, specifically in an amount of 0.001 to 20 parts, more specifically 0.01 to 10 parts by weight per 100 parts by weight of the base resin, an acid can be generated by heating. In this case, acid generation and crosslinking reaction proceed simultaneously. The preferred heating conditions include a temperature of 100 to 300° C., and especially 130 to 250° C., and a time of 10 to 300 seconds. As a result, a crosslinked resist film is formed which is insoluble in solvents and alkaline developers.

EXAMPLE

Examples and Comparative Examples are given below by way of illustration and not by way of limitation.

Polymers were synthesized according to the following formulation.

Synthesis Example 1-1

Synthesis of Polymer 1

In a nitrogen blanket, a flask was charged with 2.68 g of 4-acryloyloxyphenyldiphenylsulfonium 1,1,3,3,3-pentafluoro-2-(1-adamantanecarbonyloxy)propane-1-sulfonate, 3.05 g of 3-ethyl-3-exo-tetracyclo[4.4.0.1$^{2,5}$.1$^{7,10}$]-dodecanyl methacrylate, 1.75 g of 3-hydroxy-1-adamantyl methacrylate, 2.52 g of tetrahydro-2-oxo-4-furanyl methacrylate, 304 mg of 2,2'-azobisisobutyronitrile, and 17.5 g of methyl ethyl ketone (MEK) to form a monomer solution. In a nitrogen blanket, 5.83 g of MEK was admitted into another flask and heated up to 80° C. with stirring. With stirring, the monomer solution was added dropwise to the hot MEK over 4 hours. After the completion of dropwise addition, the polymerization solution was stirred for a further 2 hours while maintaining the temperature of 80° C. It was then cooled to room temperature. With vigorous stirring, the polymerization solution was added dropwise to a solvent mixture of 90 g hexane and 10 g MEK, whereupon a copolymer precipitated. The copolymer was collected by filtration, washed twice with a solvent mixture of 41.5 g hexane and 18.5 g MEK, and vacuum dried at 50° C. for 20 hours, obtaining 38.7 g of the copolymer (Polymer 1) in white powder form. The copolymer was analyzed by $^{13}$C-NMR, finding a copolymerization compositional ratio of 11/29/21/39 mol % in the described order of monomers.

Polymer 1

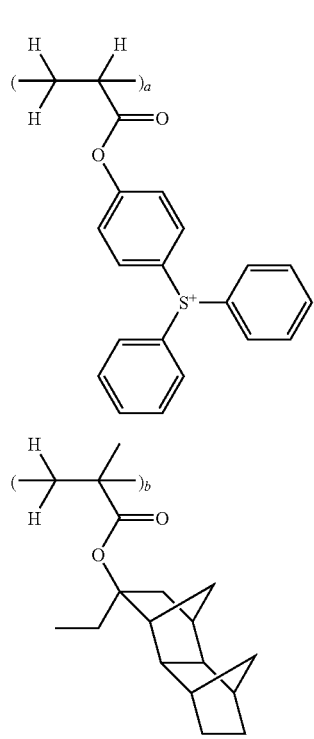

-continued

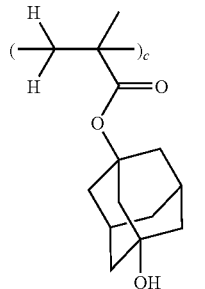

3A

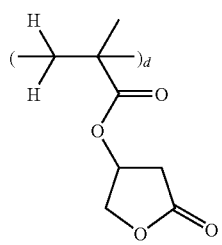

4A a = 0.11, b = 0.29, c = 0.21, d = 0.39

Synthesis Examples 1-2 to 42, 50 to 63, 66

Synthesis of Polymers 2 to 42, 50 to 63, 66

A series of resins as shown in Tables 1 and 2 were prepared by the same procedure as in Synthesis Example 1-1 except that the type and ratio of monomers used were changed. The recurring units in Tables 1 and 2 have the structure shown below. In Tables 1 and 2, the ratio of units introduced is a molar ratio.

Synthesis Examples 1-43 to 48, 64, 65

Synthesis of Polymers 43 to 48, 64, 65

Each of Polymers 37 to 42, 62, and 63 obtained according to the above formulation was dissolved in a solvent mixture of methanol and tetrahydrofuran, to which oxalic acid was added. Deprotection reaction took place at 40° C. The solution was neutralized with pyridine, washed with water by a separatory technique, and purified by a standard reprecipitation technique, obtaining a polymer comprising recurring units 8A or 9A.

Synthesis Example 1-49

Synthesis of Polymer 49
Polymer 43 was reacted with 1-chloro-1-methoxy-2-methylpropane under basic conditions, obtaining Polymer 49.

With respect to the deprotection and protection of derivatives in Synthesis Examples 1-43 to 49, 64, and 65, reference should be made to JP-A 2004-115630 and JP-A 2005-8766.

TABLE 1

|  |  | Resin | Unit 1 (ratio) | Unit 2 (ratio) | Unit 3 (ratio) | Unit 4 (ratio) | Unit 5 (ratio) | Unit 6 (ratio) |
|---|---|---|---|---|---|---|---|---|
| Synthesis Example | 1-1 | Polymer 1 | 1A (0.11) | 2A (0.29) | 3A (0.21) | 4A (0.39) |  |  |
|  | 1-2 | Polymer 2 | 1B (0.11) | 2A (0.29) | 3A (0.21) | 4A (0.39) |  |  |
|  | 1-3 | Polymer 3 | 1D (0.11) | 2A (0.29) | 3A (0.21) | 4A (0.39) |  |  |
|  | 1-4 | Polymer 4 | 1E (0.11) | 2A (0.29) | 3A (0.21) | 4A (0.39) |  |  |
|  | 1-5 | Polymer 5 | 1A (0.31) | 2A (0.38) | 4D (0.31) |  |  |  |
|  | 1-6 | Polymer 6 | 1A (0.31) | 2A (0.29) | 5B (0.40) |  |  |  |

TABLE 1-continued

|  |  | Resin | Unit 1 (ratio) | Unit 2 (ratio) | Unit 3 (ratio) | Unit 4 (ratio) | Unit 5 (ratio) | Unit 6 (ratio) |
|---|---|---|---|---|---|---|---|---|
|  | 1-7 | Polymer 7 | 1A (0.11) | 2A (0.23) | 3A (0.24) | 4D (0.33) | 5A (0.09) |  |
|  | 1-8 | Polymer 8 | 1A (0.11) | 2A (0.23) | 3A (0.24) | 4D (0.33) | 5B (0.09) |  |
|  | 1-9 | Polymer 9 | 1A (0.11) | 2A (0.23) | 3A (0.24) | 4D (0.33) | 5C (0.09) |  |
|  | 1-10 | Polymer 10 | 1F (0.11) | 2A (0.23) | 3A (0.24) | 4D (0.33) | 5D (0.09) |  |
|  | 1-11 | Polymer 11 | 1A (0.10) | 2A (0.30) | 3A (0.25) | 4A (0.25) | 4E (0.10) |  |
|  | 1-12 | Polymer 12 | 1A (0.10) | 2A (0.20) | 2E (0.10) | 3A (0.25) | 4A (0.25) | 4E (0.10) |
|  | 1-13 | Polymer 13 | 1A (0.10) | 2A (0.25) | 3A (0.10) | 4A (0.25) | 4E (0.20) | 4F (0.10) |
|  | 1-14 | Polymer 14 | 1A (0.11) | 2A (0.29) | 3A (0.26) | 4C (0.34) |  |  |
|  | 1-15 | Polymer 15 | 1A (0.11) | 2A (0.29) | 3B (0.26) | 4D (0.34) |  |  |
|  | 1-16 | Polymer 16 | 1A (0.11) | 2A (0.29) | 3C (0.26) | 4D (0.34) |  |  |
|  | 1-17 | Polymer 17 | 1A (0.10) | 2A (0.24) | 3C (0.26) | 4D (0.31) | 5C (0.09) |  |
|  | 1-18 | Polymer 18 | 1A (0.10) | 2A (0.29) | 4D (0.30) | 8B (0.31) |  |  |
|  | 1-19 | Polymer 19 | 1D (0.10) | 2A (0.29) | 4D (0.30) | 8B (0.31) |  |  |
|  | 1-20 | Polymer 20 | 1A (0.10) | 2A (0.29) | 4D (0.30) | 9B (0.31) |  |  |
|  | 1-21 | Polymer 21 | 1B (0.10) | 2A (0.29) | 4D (0.30) | 9B (0.31) |  |  |
|  | 1-22 | Polymer 22 | 1A (0.11) | 2B (0.29) | 3A (0.26) | 4C (0.34) |  |  |
|  | 1-23 | Polymer 23 | 1A (0.11) | 2B (0.29) | 3A (0.26) | 4D (0.34) |  |  |
|  | 1-24 | Polymer 24 | 1B (0.11) | 2C (0.29) | 3A (0.26) | 4B (0.34) |  |  |
|  | 1-25 | Polymer 25 | 1A (0.11) | 2C (0.27) | 3A (0.27) | 4C (0.35) |  |  |
|  | 1-26 | Polymer 26 | 1C (0.10) | 2C (0.27) | 3A (0.26) | 4B (0.26) | 4E (0.11) |  |
|  | 1-27 | Polymer 27 | 1A (0.10) | 2D (0.20) | 2E (0.10) | 3A (0.20) | 4A (0.30) | 4E (0.10) |
|  | 1-28 | Polymer 28 | 1A (0.11) | 2E (0.29) | 3A (0.26) | 4D (0.34) |  |  |
|  | 1-29 | Polymer 29 | 1A (0.11) | 2E (0.30) | 3A (0.24) | 4D (0.26) | 5A (0.09) |  |
|  | 1-30 | Polymer 30 | 1A (0.10) | 2E (0.30) | 3A (0.23) | 4D (0.28) | 5B (0.09) |  |
|  | 1-31 | Polymer 31 | 1A (0.11) | 2F (0.29) | 3A (0.26) | 4C (0.34) |  |  |
|  | 1-32 | Polymer 32 | 1A (0.11) | 2F (0.23) | 3A (0.24) | 4D (0.33) | 5C (0.09) |  |
|  | 1-33 | Polymer 33 | 1B (0.11) | 2F (0.23) | 3A (0.24) | 4D (0.33) | 5C (0.09) |  |
|  | 1-34 | Polymer 34 | 1C (0.11) | 2F (0.23) | 3A (0.24) | 4D (0.33) | 5C (0.09) |  |
|  | 1-35 | Polymer 35 | 1A (0.11) | 2F (0.23) | 3A (0.24) | 4D (0.33) | 5D (0.09) |  |
|  | 1-36 | Polymer 36 | 1A (0.50) | 5B (0.50) |  |  |  |  |
|  | 1-37 | Polymer 37 | 1A (0.20) | 6A (0.80) |  |  |  |  |
|  | 1-38 | Polymer 38 | 1A (0.20) | 6A (0.65) | 6B (0.15) |  |  |  |
|  | 1-39 | Polymer 39 | 1A (0.20) | 6A (0.65) | 6C (0.15) |  |  |  |
|  | 1-40 | Polymer 40 | 1A (0.20) | 6A (0.55) | 6B (0.15) | 10 (0.10) |  |  |

TABLE 2

|  |  | Resin | Unit 1 (ratio) | Unit 2 (ratio) | Unit 3 (ratio) | Unit 4 (ratio) | Unit 5 (ratio) | Unit 6 (ratio) |
|---|---|---|---|---|---|---|---|---|
| Synthesis Example | 1-41 | Polymer 41 | 1A (0.10) | 2A (0.15) | 6A (0.65) | 10 (0.10) |  |  |
|  | 1-42 | Polymer 42 | 1A (0.10) | 2A (0.29) | 4D (0.30) | 7A (0.31) |  |  |
|  | 1-43 | Polymer 43 | 1A (0.20) | 8A (0.80) |  |  |  |  |
|  | 1-44 | Polymer 44 | 1A (0.20) | 8A (0.65) | 6B (0.15) |  |  |  |
|  | 1-45 | Polymer 45 | 1A (0.20) | 8A (0.65) | 6C (0.15) |  |  |  |
|  | 1-46 | Polymer 46 | 1A (0.20) | 8A (0.55) | 6B (0.15) | 10 (0.10) |  |  |
|  | 1-47 | Polymer 47 | 1A (0.10) | 2A (0.15) | 8A (0.65) | 10 (0.10) |  |  |
|  | 1-48 | Polymer 48 | 1A (0.10) | 2A (0.29) | 4D (0.30) | 9A (0.31) |  |  |
|  | 1-49 | Polymer 49 | 1A (0.20) | 8A (0.65) | 6D (0.15) |  |  |  |
|  | 1-50 | Polymer 50 |  | 2A (0.29) | 3A (0.21) | 4A (0.50) |  |  |
|  | 1-51 | Polymer 51 | 1G (0.11) | 2A (0.29) | 3A (0.21) | 4A (0.39) |  |  |
|  | 1-52 | Polymer 52 | 1H (0.11) | 2A (0.29) | 3A (0.21) | 4A (0.39) |  |  |
|  | 1-53 | Polymer 53 | 1I (0.11) | 2A (0.29) | 3A (0.21) | 4A (0.39) |  |  |
|  | 1-54 | Polymer 54 | 1J (0.11) | 2A (0.29) | 3A (0.21) | 4A (0.39) |  |  |
|  | 1-55 | Polymer 55 | 1G (0.11) | 2B (0.29) | 3A (0.26) | 4C (0.34) |  |  |
|  | 1-56 | Polymer 56 | 1H (0.11) | 2C (0.27) | 3A (0.27) | 4C (0.35) |  |  |
|  | 1-57 | Polymer 57 |  | 2A (0.23) | 3A (0.24) | 4D (0.44) | 5C (0.09) |  |
|  | 1-58 | Polymer 58 | 1I (0.11) | 2A (0.23) | 3A (0.24) | 4D (0.33) | 5C (0.09) |  |
|  | 1-59 | Polymer 59 |  | 2F (0.23) | 3A (0.24) | 4D (0.44) | 5C (0.09) |  |
|  | 1-60 | Polymer 60 | 1J (0.11) | 2F (0.23) | 3A (0.24) | 4D (0.33) | 5C (0.09) |  |
|  | 1-61 | Polymer 61 | 1G (0.10) | 2A (0.29) | 4D (0.30) | 8B (0.31) |  |  |
|  | 1-62 | Polymer 62 |  | 2A (0.15) | 6A (0.75) | 10 (0.10) |  |  |
|  | 1-63 | Polymer 63 | 1H (0.10) | 2A (0.15) | 6A (0.65) | 10 (0.10) |  |  |
|  | 1-64 | Polymer 64 |  | 2A (0.15) | 8A (0.75) | 10 (0.10) |  |  |
|  | 1-65 | Polymer 65 | 1H (0.10) | 2A (0.15) | 8A (0.65) | 10 (0.10) |  |  |
|  | 1-66 | Polymer 66 | 1A (0.10) | 2A (0.29) | 4D (0.31) | 8C (0.30) |  |  |

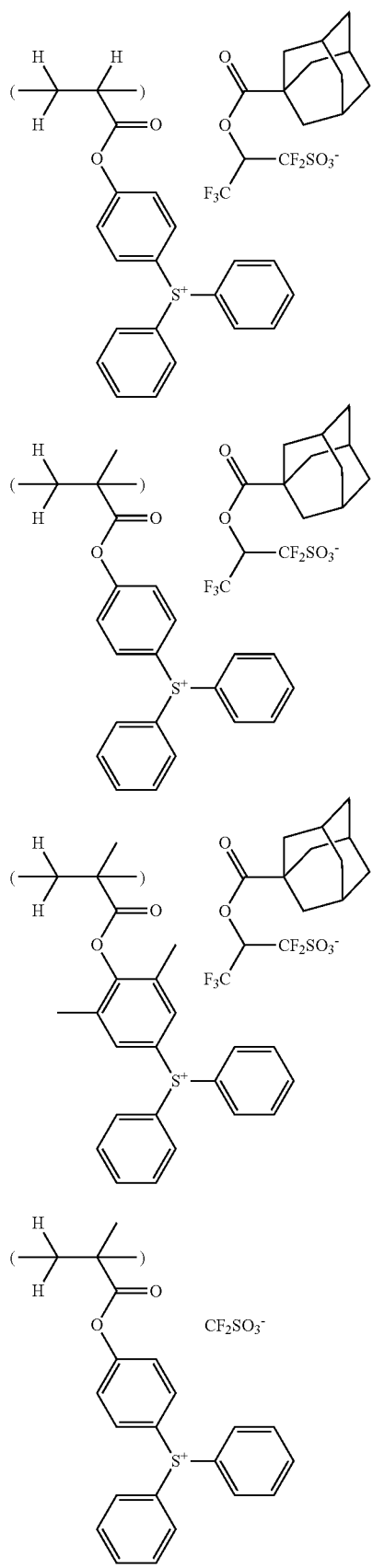
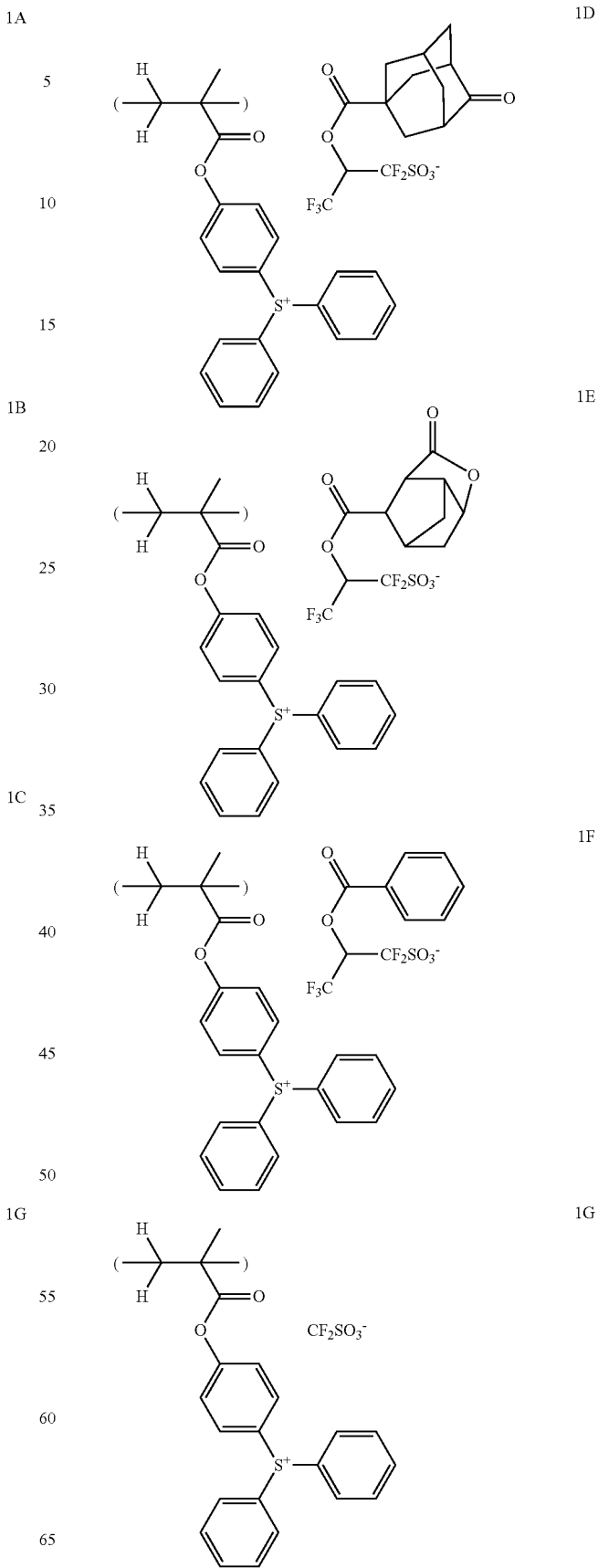

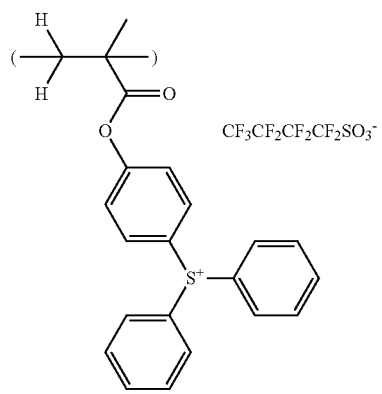
1H
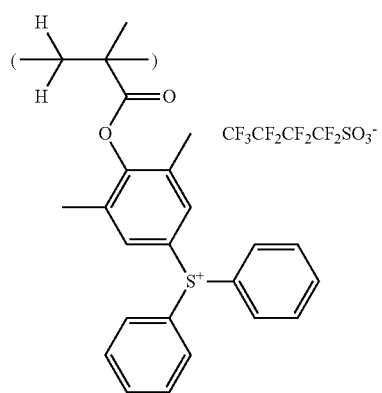
1I
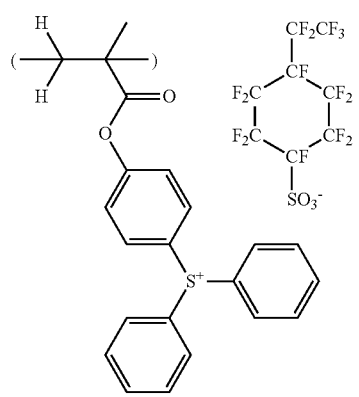
1J
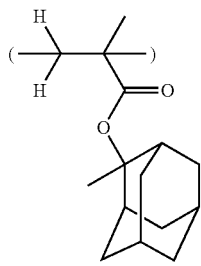
2A
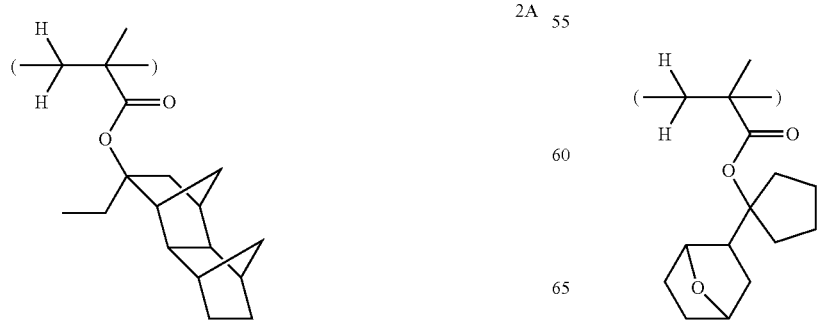

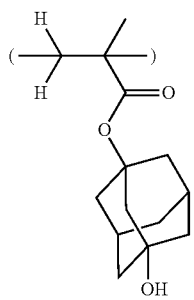
3A
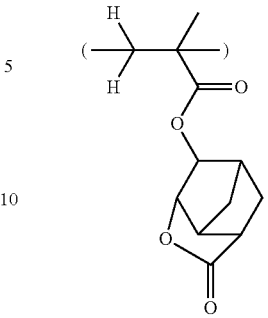
4C
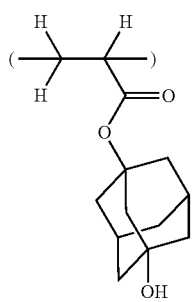
3B
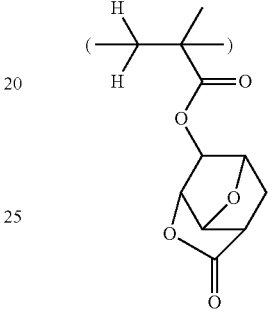
4D
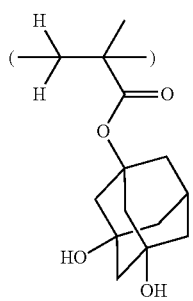
3C
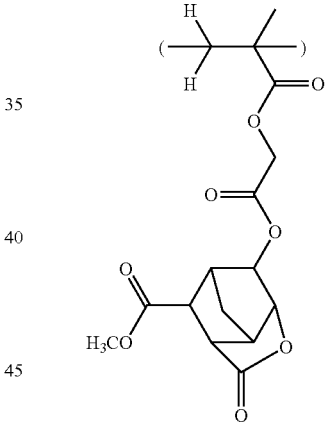
4E
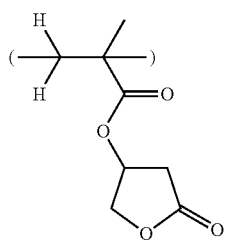
4A
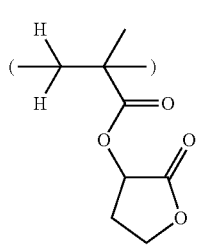
4B
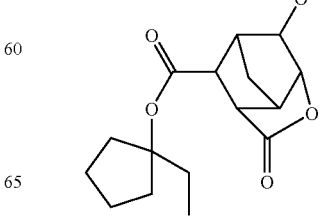
4F

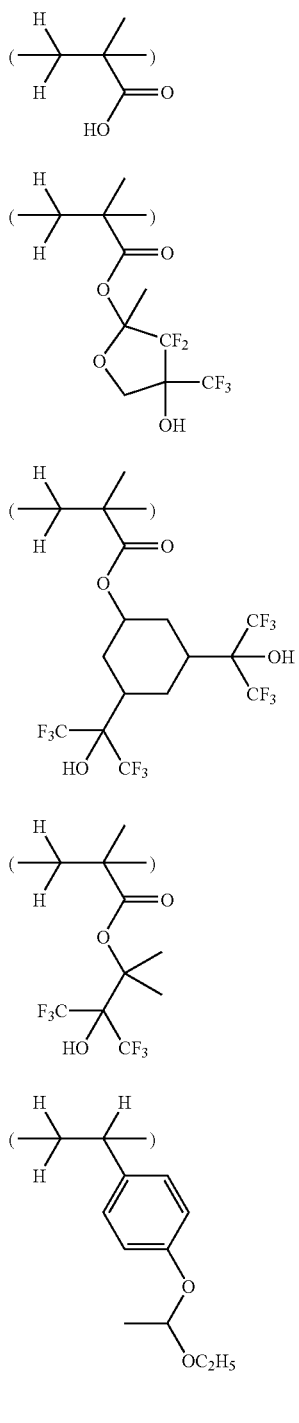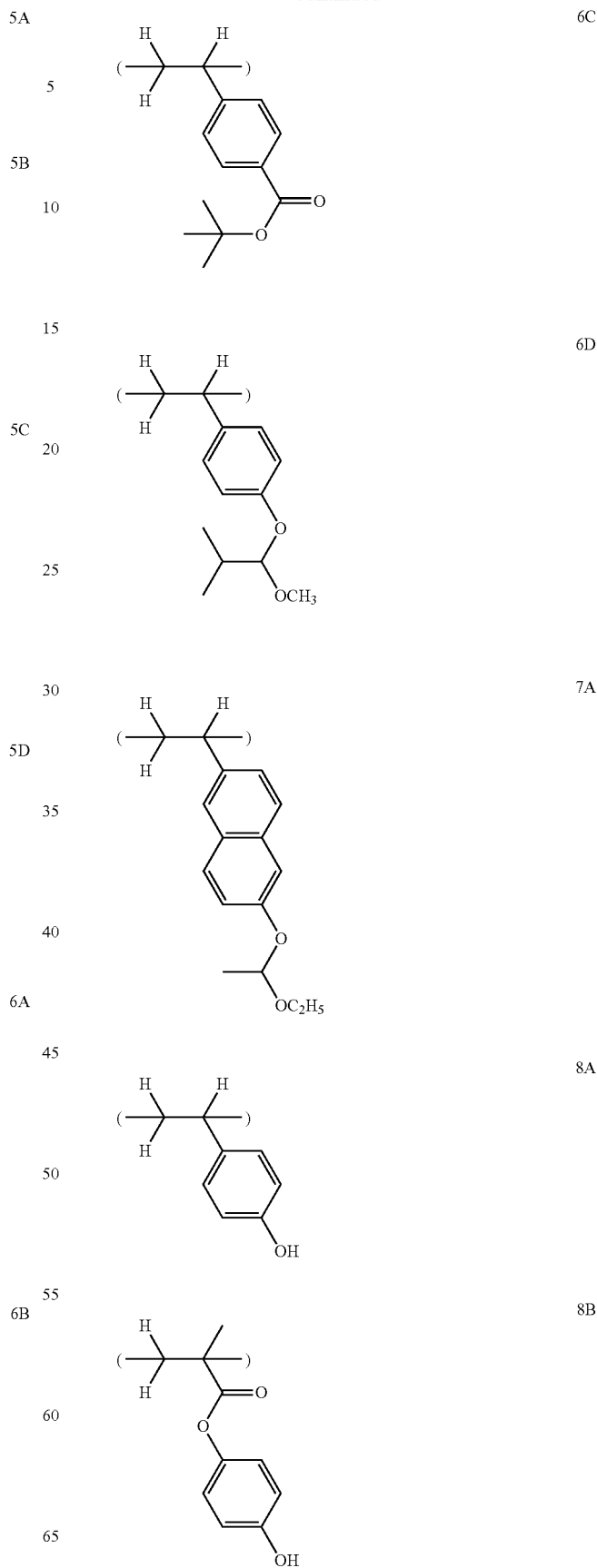

-continued

8C

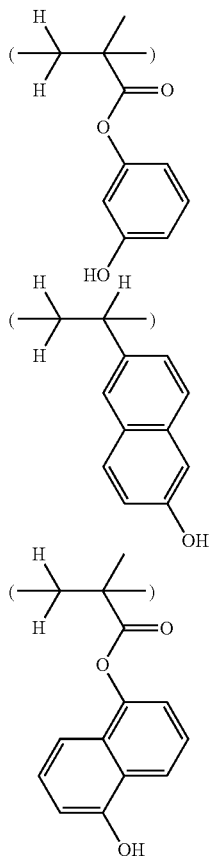

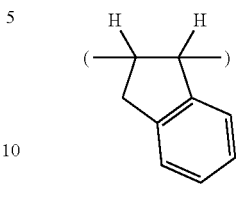

9A

9B

Preparation of Resist Composition

Examples 1-1 to 1-42 & Comparative Examples 1-1 to 1-14

The base resins used were the inventive polymers (Polymers 1 to 35, 47 to 49, 66), optionally in admixture with Polymers 50, 57 and 59, and the comparative polymers (Polymers 50 to 61, 64, 65), all synthesized above. Resist compositions were prepared by combining, mixing and dissolving the base resin, acid generator, and basic compound in a solvent containing 0.01 wt % of surfactant KH-20 (Asahi Glass Co., Ltd.) according to the formulation shown in Tables 3 and 4. They were filtered through a Teflon® filter having a pore size of 0.2 µm, giving inventive resist solutions (R-01 to 42) and comparative resist solutions (R-43 to 56).

TABLE 3

|  |  | Resist composition | Resin (pbw) | PAG (pbw) | Base (pbw) | Solvent 1 (pbw) | Solvent 2 (pbw) |
|---|---|---|---|---|---|---|---|
| Example | 1-1 | R-01 | Polymer 1 (80) |  | Base-1 (0.94) | PGMEA (560) | CyHo (240) |
|  | 1-2 | R-02 | Polymer 2 (80) |  | Base-1 (0.94) | PGMEA (560) | CyHo (240) |
|  | 1-3 | R-03 | Polymer 3 (80) |  | Base-1 (0.94) | PGMEA (560) | CyHo (240) |
|  | 1-4 | R-04 | Polymer 4 (80) |  | Base-1 (0.94) | PGMEA (560) | CyHo (240) |
|  | 1-5 | R-05 | Polymer 7 (80) |  | Base-1 (0.94) | PGMEA (560) | CyHo (240) |
|  | 1-6 | R-06 | Polymer 8 (80) |  | Base-1 (0.94) | PGMEA (560) | CyHo (240) |
|  | 1-7 | R-07 | Polymer 9 (80) |  | Base-1 (0.94) | PGMEA (560) | CyHo (240) |
|  | 1-8 | R-08 | Polymer 10 (80) |  | Base-1 (0.94) | PGMEA (560) | CyHo (240) |
|  | 1-9 | R-09 | Polymer 11 (80) |  | Base-1 (0.94) | PGMEA (560) | CyHo (240) |
|  | 1-10 | R-10 | Polymer 12 (80) |  | Base-1 (0.94) | PGMEA (560) | CyHo (240) |
|  | 1-11 | R-11 | Polymer 13 (80) |  | Base-1 (0.94) | PGMEA (560) | CyHo (240) |
|  | 1-12 | R-12 | Polymer 14 (80) |  | Base-1 (0.94) | PGMEA (560) | CyHo (240) |
|  | 1-13 | R-13 | Polymer 15 (80) |  | Base-1 (0.94) | PGMEA (560) | CyHo (240) |
|  | 1-14 | R-14 | Polymer 16 (80) |  | Base-1 (0.94) | PGMEA (560) | CyHo (240) |
|  | 1-15 | R-15 | Polymer 17 (80) |  | Base-1 (0.94) | PGMEA (560) | CyHo (240) |
|  | 1-16 | R-16 | Polymer 18 (80) |  | Base-1 (0.94) | PGMEA (560) | CyHo (240) |
|  | 1-17 | R-17 | Polymer 19 (80) |  | Base-1 (0.94) | PGMEA (560) | CyHo (240) |
|  | 1-18 | R-18 | Polymer 20 (80) |  | Base-1 (0.94) | PGMEA (560) | CyHo (240) |
|  | 1-19 | R-19 | Polymer 21 (80) |  | Base-1 (0.94) | PGMEA (560) | CyHo (240) |
|  | 1-20 | R-20 | Polymer 22 (80) |  | Base-1 (0.94) | PGMEA (560) | CyHo (240) |
|  | 1-21 | R-21 | Polymer 23 (80) |  | Base-1 (0.94) | PGMEA (560) | CyHo (240) |
|  | 1-22 | R-22 | Polymer 24 (80) |  | Base-1 (0.94) | PGMEA (560) | CyHo (240) |
|  | 1-23 | R-23 | Polymer 25 (80) |  | Base-1 (0.94) | PGMEA (560) | CyHo (240) |
|  | 1-24 | R-24 | Polymer 26 (80) |  | Base-1 (0.94) | PGMEA (560) | CyHo (240) |
|  | 1-25 | R-25 | Polymer 27 (80) |  | Base-1 (0.94) | PGMEA (560) | CyHo (240) |
|  | 1-26 | R-26 | Polymer 28 (80) |  | Base-1 (0.94) | PGMEA (560) | CyHo (240) |
|  | 1-27 | R-27 | Polymer 29 (80) |  | Base-1 (0.94) | PGMEA (560) | CyHo (240) |
|  | 1-28 | R-28 | Polymer 30 (80) |  | Base-1 (0.94) | PGMEA (560) | CyHo (240) |
|  | 1-29 | R-29 | Polymer 31 (80) |  | Base-1 (0.94) | PGMEA (560) | CyHo (240) |
|  | 1-30 | R-30 | Polymer 32 (80) |  | Base-1 (0.94) | PGMEA (560) | CyHo (240) |
|  | 1-31 | R-31 | Polymer 33 (80) |  | Base-1 (0.94) | PGMEA (560) | CyHo (240) |
|  | 1-32 | R-32 | Polymer 34 (80) |  | Base-1 (0.94) | PGMEA (560) | CyHo (240) |

TABLE 3-continued

|  | Resist composition | Resin (pbw) | PAG (pbw) | Base (pbw) | Solvent 1 (pbw) | Solvent 2 (pbw) |
|---|---|---|---|---|---|---|
| 1-33 | R-33 | Polymer 35 (80) |  | Base-1 (0.94) | PGMEA (560) | CyHo (240) |
| 1-34 | R-34 | Polymer 47 (80) |  | Base-1 (0.94) | PGMEA (560) | EL (240) |
| 1-35 | R-35 | Polymer 48 (80) |  | Base-1 (0.94) | PGMEA (560) | CyHo (240) |
| 1-36 | R-36 | Polymer 49 (80) |  | Base-1 (0.94) | PGMEA (560) | EL (240) |
| 1-37 | R-37 | Polymer 1 (40) Polymer 50 (40) | PAG-1 (5) | Base-1 (0.94) | PGMEA (560) | CyHo (240) |
| 1-38 | R-38 | Polymer 1 (40) Polymer 50 (40) | PAG-2 (5) | Base-1 (0.94) | PGMEA (560) | CyHo (240) |
| 1-39 | R-39 | Polymer 5 (25) Polymer 57 (55) |  | Base-1 (0.94) | PGMEA (560) | CyHo (240) |
| 1-40 | R-40 | Polymer 6 (25) Polymer 59 (55) |  | Base-1 (0.94) | PGMEA (560) | CyHo (240) |
| 1-41 | R-41 | Polymer 36 (15) Polymer 50 (65) |  | Base-1 (0.94) | PGMEA (560) | CyHo (240) |
| 1-42 | R-42 | Polymer 66 (80) |  | Base-1 (0.94) | PGMEA (560) | CyHo (240) |

TABLE 4

|  |  | Resist composition | Resin (pbw) | PAG (pbw) | Base (pbw) | Solvent 1 (pbw) | Solvent 2 (pbw) |
|---|---|---|---|---|---|---|---|
| Comparative Example | 1-1 | R-43 | Polymer 50 (80) | PAG-1 (10) | Base-1 (0.94) | PGMEA (560) | CyHo (240) |
|  | 1-2 | R-44 | Polymer 51 (80) |  | Base-1 (0.94) | PGMEA (560) | CyHo (240) |
|  | 1-3 | R-45 | Polymer 52 (80) |  | Base-1 (0.94) | PGMEA (560) | CyHo (240) |
|  | 1-4 | R-46 | Polymer 53 (80) |  | Base-1 (0.94) | PGMEA (560) | CyHo (240) |
|  | 1-5 | R-47 | Polymer 54 (80) |  | Base-1 (0.94) | PGMEA (560) | CyHo (240) |
|  | 1-6 | R-48 | Polymer 55 (80) |  | Base-1 (0.94) | PGMEA (560) | CyHo (240) |
|  | 1-7 | R-49 | Polymer 56 (80) |  | Base-1 (0.94) | PGMEA (560) | CyHo (240) |
|  | 1-8 | R-50 | Polymer 57 (80) | PAG-1 (10) | Base-1 (0.94) | PGMEA (560) | CyHo (240) |
|  | 1-9 | R-51 | Polymer 58 (80) |  | Base-1 (0.94) | PGMEA (560) | CyHo (240) |
|  | 1-10 | R-52 | Polymer 59 (80) | PAG-1 (10) | Base-1 (0.94) | PGMEA (560) | CyHo (240) |
|  | 1-11 | R-53 | Polymer 60 (80) |  | Base-1 (0.94) | PGMEA (560) | CyHo (240) |
|  | 1-12 | R-54 | Polymer 61 (80) |  | Base-1 (0.94) | PGMEA (560) | CyHo (240) |
|  | 1-13 | R-55 | Polymer 64 (80) | PAG-1 (10) | Base-1 (0.94) | PGMEA (560) | EL (240) |
|  | 1-14 | R-56 | Polymer 65 (80) |  | Base-1 (0.94) | PGMEA (560) | EL (240) |

The photoacid generators, basic compound and solvents in Tables 3 and 4 are identified below.
PAG-1: triphenylsulfonium 1,1,3,3,3-pentafluoro-2-(1-adamantanecarbonyloxy)propane-1-sulfonate
PAG-2: triphenylsulfonium nonafluorobutanesulfonate
Base-1: tri(2-methoxymethoxyethyl)amine
PGMEA: 1-methoxy-2-propyl acetate
CyHo: cyclohexanone
EL: ethyl lactate
Evaluation of Resolution and LER on ArF Lithography Examples 2-1 to 2-42 & Comparative Examples 2-1 to 2-14

On a silicon wafer having an antireflective coating (ARC-29A, Nissan Chemical Co., Ltd.) of 78 nm thick, each of the inventive resist solutions (R-01 to 42) and comparative resist solutions (R-43 to 56) was spin coated and baked at 100° C. for 60 seconds, forming a resist film of 100 nm thick. The resist film was exposed by means of an ArF excimer laser stepper model NSR-S307E (Nikon Corp., NA 0.85, σ 0.93/0.70, 3/4 annular illumination, 6% halftone mask), post-exposure baked (PEB) at 100° C. for 60 seconds, and puddle developed with a 2.38 wt % aqueous solution of tetramethylammonium hydroxide (TMAH) for 30 seconds, forming a 1:1 line-and-space pattern.

The pattern-bearing wafer was observed under a top-down scanning electron microscope (TDSEM). The exposure dose (mJ/cm$^2$) which provided a 1:1 resolution at the top and bottom of a 90-nm 1:1 line-and-space pattern was an optimum exposure dose. The maximum resolution of a resist was defined as the minimum line width (on-mask size, in increments of 5 nm) of a 1:1 line-and-space pattern which was ascertained separate at the optimum dose, with smaller values indicating better resolution. The line edge roughness (LER) of a 90-nm 1:1 line-and-space pattern was measured using a measuring SEM model S-9380 (Hitachi Ltd.).

Tables 5 and 6 tabulate the test results (maximum resolution and LER) of the inventive and comparative resist compositions.

TABLE 5

|  | Resist composition | Optimum exposure (mJ/cm$^2$) | Maximum resolution (nm) | LER (nm) |
|---|---|---|---|---|
| Example 2-1 | R-01 | 30 | 75 | 6 |
| Example 2-2 | R-02 | 30 | 75 | 7 |
| Example 2-3 | R-03 | 31 | 75 | 7 |
| Example 2-4 | R-04 | 31 | 80 | 7 |
| Example 2-5 | R-05 | 30 | 75 | 6 |
| Example 2-6 | R-06 | 30 | 75 | 5 |
| Example 2-7 | R-07 | 30 | 75 | 5 |
| Example 2-8 | R-08 | 30 | 75 | 5 |
| Example 2-9 | R-09 | 30 | 80 | 5 |
| Example 2-10 | R-10 | 20 | 80 | 5 |
| Example 2-11 | R-11 | 30 | 80 | 5 |
| Example 2-12 | R-12 | 30 | 75 | 6 |
| Example 2-13 | R-13 | 30 | 75 | 5 |
| Example 2-14 | R-14 | 30 | 80 | 6 |
| Example 2-15 | R-15 | 30 | 80 | 5 |
| Example 2-16 | R-16 | 30 | 80 | 5 |
| Example 2-17 | R-17 | 31 | 80 | 6 |

TABLE 5-continued

| | Resist composition | Optimum exposure (mJ/cm$^2$) | Maximum resolution (nm) | LER (nm) |
|---|---|---|---|---|
| Example 2-18 | R-18 | 30 | 80 | 6 |
| Example 2-19 | R-19 | 31 | 80 | 6 |
| Example 2-20 | R-20 | 30 | 80 | 6 |
| Example 2-21 | R-21 | 30 | 80 | 5 |
| Example 2-22 | R-22 | 30 | 85 | 6 |
| Example 2-23 | R-23 | 30 | 80 | 6 |
| Example 2-24 | R-24 | 30 | 85 | 5 |
| Example 2-25 | R-25 | 30 | 80 | 5 |
| Example 2-26 | R-26 | 30 | 85 | 5 |
| Example 2-27 | R-27 | 30 | 80 | 6 |
| Example 2-28 | R-28 | 30 | 85 | 5 |
| Example 2-29 | R-29 | 30 | 80 | 5 |
| Example 2-30 | R-30 | 30 | 80 | 5 |
| Example 2-31 | R-31 | 30 | 80 | 5 |
| Example 2-32 | R-32 | 30 | 80 | 6 |
| Example 2-33 | R-33 | 30 | 85 | 5 |
| Example 2-34 | R-34 | 30 | 85 | 6 |
| Example 2-35 | R-35 | 30 | 80 | 6 |
| Example 2-36 | R-36 | 30 | 85 | 6 |
| Example 2-37 | R-37 | 30 | 75 | 6 |
| Example 2-38 | R-38 | 20 | 85 | 6 |
| Example 2-39 | R-39 | 30 | 85 | 5 |
| Example 2-40 | R-40 | 30 | 80 | 5 |
| Example 2-41 | R-41 | 30 | 80 | 7 |
| Example 2-42 | R-42 | 30 | 80 | 5 |

TABLE 6

| | Resist composition | Optimum exposure (mJ/cm$^2$) | Maximum resolution (nm) | LER (nm) |
|---|---|---|---|---|
| Comparative Example 2-1 | R-43 | 30 | 90 | 8 |
| Comparative Example 2-2 | R-44 | 15 | 90 | 6 |
| Comparative Example 2-3 | R-45 | 20 | 85 | 7 |
| Comparative Example 2-4 | R-46 | 30 | 85 | 7 |
| Comparative Example 2-5 | R-47 | 40 | 80 | 10 |
| Comparative Example 2-6 | R-48 | 15 | 90 | 6 |
| Comparative Example 2-7 | R-49 | 20 | 85 | 7 |
| Comparative Example 2-8 | R-50 | 30 | 90 | 8 |
| Comparative Example 2-9 | R-51 | 30 | 85 | 7 |
| Comparative Example 2-10 | R-52 | 30 | 90 | 8 |
| Comparative Example 2-11 | R-53 | 40 | 85 | 10 |
| Comparative Example 2-12 | R-54 | 15 | 90 | 6 |
| Comparative Example 2-13 | R-55 | 30 | 90 | 8 |
| Comparative Example 2-14 | R-56 | 20 | 90 | 7 |

The test results of Examples in Table 5 demonstrate that the inventive resist compositions exhibit good resolution performance and improved LER when processed by ArF excimer laser lithography. In contrast, the data of Comparative Examples in Table 6 demonstrate that prior art resist compositions fail to meet either one or both of resolution performance and LER.

It is thus evident that a resist composition comprising a polymer comprising recurring units of a sulfonium salt as a base resin according to the invention displays excellent resist characteristics over those formulated in accordance with the prior art.

Evaluation of Resolution on EB Lithography

Examples 3-1 to 3-3 & Comparative Examples 3-1, 3-2

On a 8-inch silicon wafer having an antireflective coating (DUV-44 by Brewer Science) of 610 Å thick coated thereon, each of the inventive resist compositions (R-34 to 36) or comparative resist compositions (R-55, 56) was spin coated and heat treated at 100° C. for 60 seconds to form a resist film of 150 nm thick. Using an EB lithography system HL-800D (Hitachi Hitechnologies, Ltd.) at an accelerating voltage of 50 keV, exposure was performed on the resist film. The resist film was post-exposure baked (PEB) at 100° C. for 60 seconds and developed for 30 seconds with a 2.38 wt % TMAH aqueous solution, obtaining a positive pattern.

The resist pattern was evaluated as follows. The optimum exposure was defined as the exposure dose (μC/cm$^2$) which provided a 1:1 resolution at the top and bottom of a 0.12-μm line-and-space pattern. The resolution of the resist was defined as the minimum line width of a line-and-space pattern that was ascertained separate at the optimum exposure. The profile of the resolved resist pattern was evaluated by observing a cross section of the resist under a SEM.

The post-exposure delay (PED) in vacuum was evaluated by exposing the coated wafer on an EB lithography system, holding it in the vacuum system for 24 hours, thereafter effecting PEB and development. The size of lines of a 0.12-μm line-and-space pattern was measured and a percent change thereof was calculated. For example, when the line size increases by 0.012 μm, the change is reported as +10%. A smaller change indicates better stability. The test results are shown in Table 7.

TABLE 7

| | Resist composition | Optimum exposure (μC/cm$^2$) | Resolution (μm) | Pattern profile | Line size change by PED |
|---|---|---|---|---|---|
| Example 3-1 | R-34 | 20 | 0.09 | Rectangular | 0 |
| Example 3-2 | R-35 | 22 | 0.08 | Rectangular | 0 |
| Example 3-3 | R-36 | 18 | 0.09 | Rectangular | 0 |
| Comparative Example 3-1 | R-55 | 18 | 0.12 | Somewhat rounded top | +10% |
| Comparative Example 3-2 | R-56 | 20 | 0.11 | Rectangular | 0 |

It is evident from Table 7 that the resist composition of the invention is also improved in resolution and vacuum PED when processed by EB lithography. The resist composition is expected to perform equally when processed by the EUV or KrF lithography using polyhydroxystyrene derivatives.

Measurement of Leach-Outs

Examples 4-1 to 4-3 & Comparative Example 4-1, 4-2

To 100 parts by weight of the resist compositions (R-01, R-07, R-16) prepared above was added 0.2 part by weight of a surfactant (Surfactant-1, shown below) which was insoluble in water and soluble in alkaline developer. Each of the resulting resist compositions (R-01', R-07', R-16') or comparative resist compositions (R-43, R-50) was spin coated on a silicon substrate, then baked at 100° C. for 60 seconds to give a photoresist film having a thickness of 120 nm. A test was performed on the unexposed photoresist films because exposure caused PAG to undergo photo-reaction so that cations were no longer detected.

Surfactant-1 a copolymer of 3,3,3-trifluoro-2-hydroxy-1,1-dimethyl-2-trifluoromethylpropyl methacrylate and 2,2,3,3,4,4,5,5-octafluoropentyl methacrylate in a molar ratio of 80:20, with weight average molecular weight=8,000

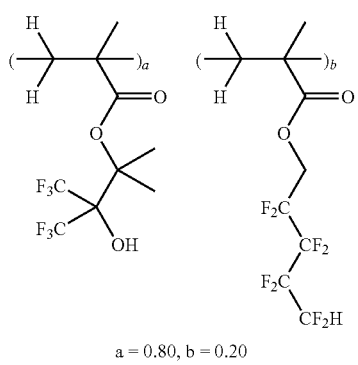

Surfactant-1 a = 0.80, b = 0.20

Then a true circle ring of Teflon® having an inner diameter of 10 cm was placed on the resist film, 10 mL of deionized water was carefully injected inside the ring, and the resist film was kept in contact with water at room temperature for 60 seconds. Thereafter, the water was recovered, and a concentration of PAG cation in the water was measured by an LC-MS analyzer (Agilent). The cation concentration measured indicates an amount of cations leached out for 60 seconds. The results are shown in Table 8.

TABLE 8

|  | Resist composition | Cation leach-out (ppb) |
| --- | --- | --- |
| Example 4-1 | R-01' | <5 (undetected) |
| Example 4-2 | R-07' | <5 (undetected) |
| Example 4-3 | R-16' | <5 (undetected) |
| Comparative Example 4-1 | R-43 | 30 |
| Comparative Example 4-1 | R-50 | 20 |

As is evident from the foregoing results, the photoresist films formed from the resist compositions of the invention are effective for preventing the cation from being leached out in water when processed by the immersion lithography using water. It is expected that the resist compositions of the invention, when processed by the immersion lithography, undergo little change in pattern profile and cause minimal damage to the exposure system.

Japanese Patent Application No. 2008-065488 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units of a sulfonium salt having the general formula (1) in which the recurring units are at least one selected from general formulae (18) and (19):

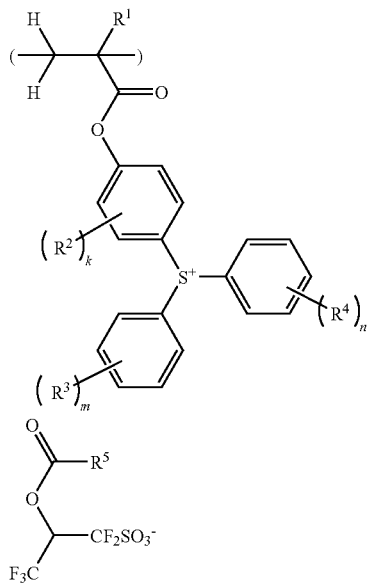

(1)

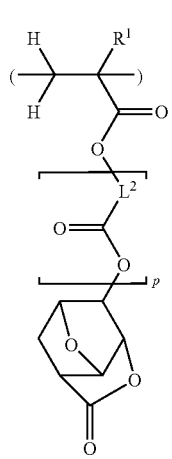

(18)

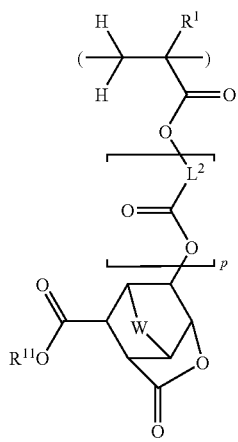

(19)

wherein $R^1$ is hydrogen, fluorine, methyl or trifluoromethyl, $R^2$ to $R^4$ are each independently straight, branched or cyclic $C_1$-$C_{10}$ alkyl or alkoxy, $R^5$ is substituted or unsubstituted, straight, branched or cyclic $C_1$-$C_{30}$ alkyl or substituted or unsubstituted $C_6$-$C_{14}$ aryl, k, m and n are each independently an integer of 0 to 3, $R^{11}$ is straight, branched or cyclic $C_1$-$C_{20}$ alkyl which may have fluorine atom, W is —$CH_2$—, oxygen or sulfur atom, $L^2$ is straight or branched $C_1$-$C_5$ alkylene, and p is 0 or 1.

2. The polymer of claim 1, further comprising recurring units of at least one type selected from the general formulae (2) to (11):

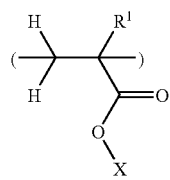

(2)

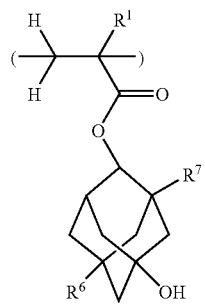

(3)

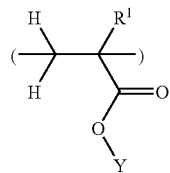

(4)

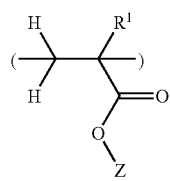

(5)

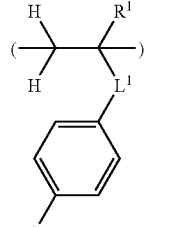

(6)

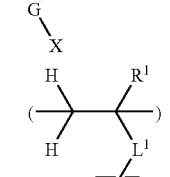

(7)

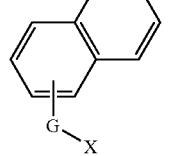

-continued

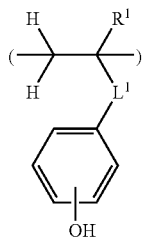

(8)

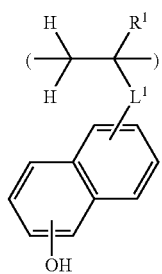

(9)

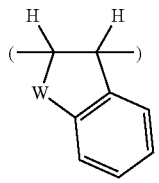

(10)

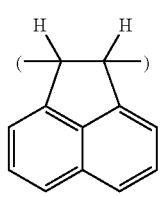

(11)

wherein $R^1$ is each independently hydrogen, fluorine, methyl or trifluoromethyl, $R^6$ and $R^7$ are each independently hydrogen or hydroxyl, X is a substituent group having an acid labile group, Y is a substituent group having lactone structure, Z is hydrogen, $C_1$-$C_{15}$ fluoroalkyl or $C_1$-$C_{15}$ fluoroalcohol-containing substituent group, G is oxygen or —C(=O)O—, L' is a single bond or —C(=O)O—, and W is —$CH_2$—, oxygen or sulfur atom, said recurring units of the general formula (4) excluding the recurring units of the general formulae (18) and (19).

3. The polymer of claim 2 wherein the recurring units of formula (2) are recurring units of at least one type selected from the general formulae (12) to (17):

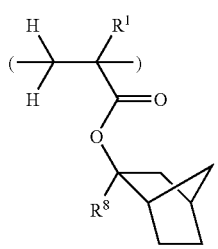

(12)

-continued

(13)
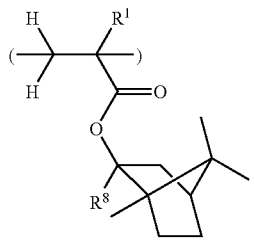

(14)
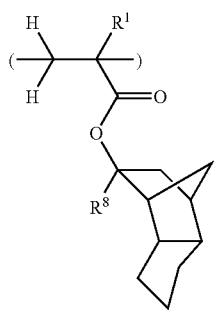

(15)
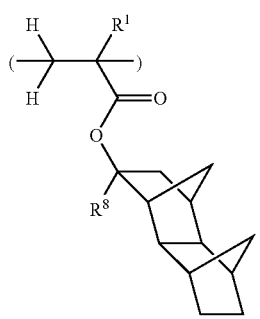

(16)
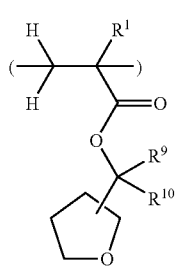

(17)
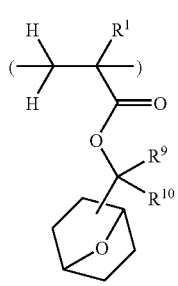

wherein $R^1$ is each independently hydrogen, fluorine, methyl or trifluoromethyl, $R^8$ is each independently straight, branched or cyclic $C_1$-$C_{10}$ alkyl, $R^9$ and $R^{10}$ are each independently straight, branched or cyclic $C_1$-$C_{10}$ alkyl, or $R^9$ and $R^{10}$ may bond together to form a $C_3$-$C_{20}$ non-aromatic ring with the carbon atom to which they are attached.

4. The polymer of claim 2, comprising recurring units of formula (1) as set forth in claim 1 and recurring units of at least one type selected from formulae (2), (6) and (7) as set forth in claim 2.

5. The polymer of claim 2, comprising recurring units of formula (1) as set forth in claim 1, recurring units of at least one type selected from formulae (2), (6) and (7), and recurring units of at least one type selected from formulae (3) to (5) and (8) to (11) as set forth in claim 2.

6. A resist composition comprising the polymer of claim 1.

7. A resist composition comprising the polymer of claim 1 and an acid generator capable of generating an acid upon exposure to high-energy radiation of wavelength up to 300 nm or electron beam.

8. The resist composition of claim 7 wherein said acid generator is a sulfonium salt having the general formula (20):

(20)
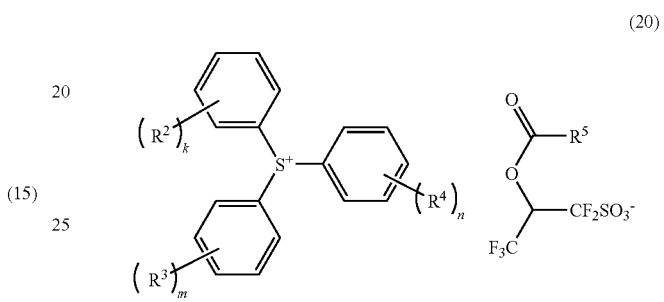

wherein $R^2$ to $R^4$ are each independently straight, branched or cyclic $C_1$-$C_{10}$ alkyl or alkoxy, $R^5$ is substituted or unsubstituted, straight, branched or cyclic $C_1$-$C_{30}$ alkyl or substituted or unsubstituted $C_6$-$C_{14}$ aryl, k, m and n are each independently an integer of 0 to 3.

9. The resist composition of claim 6, further comprising a polymer other than the polymer of any one of claims 1-3, 4 to 5.

10. The resist composition of claim 6, further comprising a surfactant which is insoluble in water and soluble in an alkaline developer.

11. A pattern forming process comprising the steps of:
applying the resist composition of claim 6 onto a substrate to form a coating,
heat treating the coating and exposing it to high-energy radiation through a photomask,
heat treating the exposed coating and
developing it with a developer.

12. A pattern forming process comprising the steps of:
applying the resist composition of claim 6 onto a substrate to form a resist coating,
heat treating the resist coating,
applying onto the resist coating a protective coating which is insoluble in water and soluble in an alkaline developer,
exposing the coated substrate to high-energy radiation from a projection lens through a photomask while holding water between the substrate and the projection lens,
heat treating the exposed coating and developing it with a developer.

13. A pattern forming process comprising the steps of applying the resist composition of claim 6 onto a substrate to form a coating,
heat treating the coating, imagewise writing with an electron beam,
heat treating the coating, and
developing it with a developer.

* * * * *